(12) United States Patent
Mori et al.

(10) Patent No.: US 10,886,886 B2
(45) Date of Patent: Jan. 5, 2021

(54) FILTER DEVICE, RADIO-FREQUENCY FRONT-END CIRCUIT, AND COMMUNICATION APPARATUS

(71) Applicant: Murata Manufacturing Co., Ltd., Kyoto (JP)

(72) Inventors: Hirotsugu Mori, Kyoto (JP); Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 78 days.

(21) Appl. No.: 16/425,149

(22) Filed: May 29, 2019

(65) Prior Publication Data

US 2019/0280669 A1 Sep. 12, 2019

Related U.S. Application Data

(63) Continuation of application No. PCT/JP2017/033271, filed on Sep. 14, 2017.

(30) Foreign Application Priority Data

Dec. 6, 2016 (JP) ................................ 2016-237127

(51) Int. Cl.
*H03H 7/46* (2006.01)
*H03H 9/02* (2006.01)
(Continued)

(52) U.S. Cl.
CPC ............... *H03H 7/465* (2013.01); *H03H 7/01* (2013.01); *H03H 7/0115* (2013.01);
(Continued)

(58) Field of Classification Search
CPC ...... H03H 7/01; H03H 7/0115; H03H 7/0153; H03H 7/075; H03H 7/175; H03H 7/465;
(Continued)

(56) References Cited

U.S. PATENT DOCUMENTS

| 3,582,835 A | * | 6/1971 | Walding | ............... H03H 7/175 333/174 |
| 4,571,560 A | * | 2/1986 | Dobrovolny | ............. H03H 7/00 333/174 |

(Continued)

FOREIGN PATENT DOCUMENTS

| JP | 10-150342 A | * | 6/1998 |
| JP | 2000-323961 A | | 11/2000 |

(Continued)

OTHER PUBLICATIONS

X. Lu et al.; "Reconfigurable Multiband SAW Filters for LTE Applications"; 2013 IEEE Radio and Wireless Symposium; date of conference Jan. 20-23, 2013, pp. 253-255 and 1 page IEEE Xplore abstract. (Year: 2013).*

(Continued)

*Primary Examiner* — Barbara Summons
(74) *Attorney, Agent, or Firm* — Pearne & Gordon LLP

(57) ABSTRACT

A filter includes a first resonant circuit having one or more first resonant frequencies, a second resonant circuit having one or more second resonant frequencies different from the first resonant frequency, and a switch connected to the first resonant circuit and the second resonant circuit. The switch switches between a first state in which a radio-frequency signal of the first resonant frequency flows from an IN terminal to an OUT terminal via the first resonant circuit and a radio-frequency signal of the second resonant frequency flows from the IN terminal to ground via the second resonant circuit and a second state in which a radio-frequency signal of the first resonant frequency flows from the IN terminal to ground via the first resonant circuit and a radio-frequency signal of the second resonant frequency flows from the IN terminal to the OUT terminal via the second resonant circuit.

16 Claims, 60 Drawing Sheets

(51) Int. Cl.
| | |
|---|---|
| *H03H 9/205* | (2006.01) |
| *H03H 9/54* | (2006.01) |
| *H03H 9/64* | (2006.01) |
| *H03H 9/70* | (2006.01) |
| *H03H 9/72* | (2006.01) |
| *H04B 1/00* | (2006.01) |
| *H04B 1/50* | (2006.01) |
| *H03H 7/01* | (2006.01) |
| *H03H 9/60* | (2006.01) |
| *H03H 7/075* | (2006.01) |

(52) U.S. Cl.
CPC .......... *H03H 7/0153* (2013.01); *H03H 7/075* (2013.01); *H03H 7/175* (2013.01); *H03H 9/02007* (2013.01); *H03H 9/205* (2013.01); *H03H 9/54* (2013.01); *H03H 9/542* (2013.01); *H03H 9/605* (2013.01); *H03H 9/64* (2013.01); *H03H 9/6403* (2013.01); *H03H 9/6483* (2013.01); *H03H 9/706* (2013.01); *H03H 9/725* (2013.01); *H04B 1/006* (2013.01); *H04B 1/50* (2013.01)

(58) Field of Classification Search
CPC ...... H03H 9/02007; H03H 9/205; H03H 9/54; H03H 9/542; H03H 9/545; H03H 9/605; H03H 9/64; H03H 9/6403; H03H 9/6423; H03H 9/6483; H03H 9/706; H03H 9/725; H03H 2210/012; H03H 2210/036; H03H 2250/00; H04B 1/006; H04B 1/1027; H04B 1/50; H04B 2001/1054
USPC ....... 333/101, 129, 132, 133, 174, 175, 189, 333/193, 195
See application file for complete search history.

(56) References Cited

U.S. PATENT DOCUMENTS

| | | | |
|---|---|---|---|
| 5,317,290 | A | 5/1994 | Jacome-Hood |
| 6,472,953 | B1 | 10/2002 | Sakuragawa et al. |
| 10,181,839 | B2 * | 1/2019 | Tomita .................... H03H 7/40 |
| 2003/0080829 | A1 | 5/2003 | Lampen et al. |
| 2009/0201104 | A1 | 8/2009 | Ueda et al. |
| 2014/0225680 | A1 | 8/2014 | Fujiwara et al. |
| 2018/0019731 | A1 | 1/2018 | Tsukamoto et al. |
| 2018/0048292 | A1 * | 2/2018 | Hey-Shipton ........ H03H 9/6483 |
| 2018/0198438 | A1 | 7/2018 | Park |

FOREIGN PATENT DOCUMENTS

| | | |
|---|---|---|
| JP | 2005-508117 A | 3/2005 |
| JP | 2009-207116 A | 9/2009 |
| JP | 2014-050098 A | 3/2014 |
| WO | 2013/080428 A1 | 6/2013 |
| WO | 2016/158953 A1 | 10/2016 |

OTHER PUBLICATIONS

J. Verdu et al.; "Double-Ladder Filter Topology for a Dual-Band Transmission Response Based on Bulk Acoustic Wave Resonators"; IEEE Microwave and Wireless Components Letters, vol. 20, No. 3, Mar. 2010, pp. 151-153. (Year: 2010).*
International Search Report for International Application No. PCT/JP2017/033271 dated Nov. 28, 2017.
Written Opinion for International Application No. PCT/JP2017/033271 dated Nov. 28, 2017.

* cited by examiner

| | SW11 | SW12 | SW13 |
|---|---|---|---|
| Condition1 | OFF | ON | OFF |
| Condition2 | ON | OFF | OFF |
| Condition3 | OFF | ON | ON |

| | SW11 | SW12 | SW13 |
|---|---|---|---|
| Condition1 | OFF | ON | OFF |
| Condition2 | ON | OFF | OFF |
| Condition3 | ON | OFF | ON |

| | SW11 | SW12 | SW13 |
|---|---|---|---|
| Condition1 | OFF | ON | OFF |
| Condition2 | ON | OFF | OFF |
| Condition3 | ON | OFF | ON |

|  | SW11 | SW12 | SW13 |
|---|---|---|---|
| Condition1 | OFF | ON | OFF |
| Condition2 | ON | OFF | OFF |
| Condition3 | ON | OFF | ON |

FILTER DEVICE, RADIO-FREQUENCY FRONT-END CIRCUIT, AND COMMUNICATION APPARATUS

This is a continuation of International Application No. PCT/JP2017/033271 filed on Sep. 14, 2017 which claims priority from Japanese Patent Application No. 2016-237127 filed on Dec. 6, 2016. The contents of these applications are incorporated herein by reference in their entireties.

BACKGROUND OF THE DISCLOSURE

Field of the Disclosure

The present disclosure relates to a filter device, a radio-frequency front-end circuit, and a communication apparatus that are capable of supporting multiple bands.

Description of the Related Art

Recent communication apparatuses such as mobile phones are demanded to support multiple bands such that a single terminal supports multiple frequency ranges (bands). Accordingly, radio-frequency front-end circuits mounted in the communication apparatuses, such as front-end modules, are also demanded to support multiple bands.

Such a radio-frequency front-end circuit is disclosed which has a configuration including a plurality of filters individually supporting a plurality of bands such that switches in the preceding and subsequent stages of the plurality of filters are switched to support the plurality of bands (see, for example, Patent Document 1).

Patent Document 1: Japanese Unexamined Patent Application Publication No. 2014-50098

BRIEF SUMMARY OF THE DISCLOSURE

However, in the existing configuration including a plurality of filters individually supporting a plurality of bands, the number of filters increases with the increase of the number of bands to be supported. For this reason, a filter capable of supporting multiple bands has a problem in that an increase in the number of elements of the filter hinders the size reduction.

Accordingly, it is an object of the present disclosure to provide a compact filter device, radio-frequency front-end circuit, and communication apparatus that are capable of supporting multiple bands.

To achieve the object described above, a filter device according to an aspect of the present disclosure includes a first resonant circuit disposed in a first path that connects an input terminal and an output terminal and having at least one first resonant frequency, a second resonant circuit disposed in a second path that connects the input terminal and the output terminal and having at least one second resonant frequency different from the at least one first resonant frequency, and a switch connected to the first resonant circuit and the second resonant circuit. The switch switches between a first state in which a radio-frequency signal of the at least one first resonant frequency flows from the input terminal to the output terminal via the first resonant circuit and a radio-frequency signal of the at least one second resonant frequency flows from the input terminal to ground via the second resonant circuit and a second state in which the radio-frequency signal of the at least one first resonant frequency flows from the input terminal to ground via the first resonant circuit and the radio-frequency signal of the at least one second resonant frequency flows from the input terminal to the output terminal via the second resonant circuit.

Accordingly, in response to the switching of the switch, a series-arm resonant circuit disposed in a path (series arm) along which a radio-frequency signal travels from the input terminal to the output terminal and a parallel-arm resonant circuit disposed in a path (parallel-arm) connecting the path described above and ground are interchanged in position. At this time, the frequencies that define the pass band and the frequencies that define the attenuation bands are interchanged by interchanging the positions of the series-arm resonant circuit and the parallel-arm resonant circuit. Accordingly, two filter characteristics can be formed in which the pass bands and the attenuation bands are interchanged in response to the switching of the switch. That is, two filter characteristics can be formed by interchanging the positions of the series-arm resonant circuit and the parallel-arm resonant circuit. Thus, only a few elements are required to form two filter characteristics. A compact filter device capable of supporting multiple bands can be implemented.

Further, the first resonant circuit may include a plurality of first series-arm elements connected in series in the first path, the second resonant circuit may include a plurality of second series-arm elements connected in series in the second path, and the switch may bring a first node between the plurality of first series-arm elements and ground into non-conduction and bring a second node between the plurality of second series-arm elements and ground into conduction in the first state, and may bring the first node and ground into conduction and bring the second node and ground into non-conduction in the second state.

Accordingly, in both the first state and the second state, a radio-frequency signal flowing from the input terminal to the output terminal is transmitted without passing through the switch, which can reduce (improve) loss.

Further, the plurality of first series-arm elements and the plurality of second series-arm elements may be each an acoustic wave resonator, and the filter device may form a first filter characteristic in which, when seen from the input terminal in the first state, points at which impedances of the plurality of first series-arm elements reach a local minimum and points at which impedances of the plurality of second series-arm elements reach a local minimum define a pass band and points at which impedances of the plurality of first series-arm elements reach a local maximum and points at which impedances of the plurality of second series-arm elements reach a local maximum define an attenuation band, and a second filter characteristic in which, when seen from the input terminal in the second state, points at which impedances of the plurality of first series-arm elements reach a local minimum and points at which impedances of the plurality of second series-arm elements reach a local minimum define a pass band and points at which impedances of the plurality of first series-arm elements reach a local maximum and points at which impedances of the plurality of second series-arm elements reach a local maximum define an attenuation band.

Accordingly, the plurality of first series-arm elements and the plurality of second series-arm elements are each an acoustic wave resonator, and thus both the first filter characteristic and the second filter characteristic can implement filter characteristics with high steepness (high-selectivity filter characteristics). In addition, the pass bands and the attenuation bands of the first filter characteristic and the second filter characteristic are defined in the manner described above, and thus the first filter characteristic and the second filter characteristic can implement, for example, two bandpass-type filter characteristics in which the pass bands and the attenuation bands are interchanged.

Further, the first resonant circuit may include a first series-arm element disposed in series in the first path, and a first parallel-arm element that connects the first path and ground to each other, the second resonant circuit may include a second series-arm element disposed in series in the second path, and a second parallel-arm element that connects the second path and ground to each other, and the switch may bring the first resonant circuit and one terminal among the input terminal and the output terminal into conduction and bring the second resonant circuit and the one terminal into non-conduction in the first state, and may bring the first resonant circuit and the one terminal into non-conduction and bring the second resonant circuit and the one terminal into conduction in the second state.

Accordingly, in the first state, the second resonant circuit and one terminal among the input terminal and the output terminal are brought into non-conduction, thereby preventing a radio-frequency signal of the second resonant frequency from being transmitted to the output terminal. In the second state, the first resonant circuit and the one terminal described above are brought into non-conduction, thereby preventing a radio-frequency signal of the first resonant frequency from being transmitted to the output terminal. Accordingly, in both the first state and the second state, the attenuation in the attenuation band can be improved (increased).

Further, the first series-arm element and the second series-arm element may be each an acoustic wave resonator, and the filter device may form a first filter characteristic in which, when seen from the input terminal in the first state, a point at which an impedance of the first series-arm element reaches a local minimum and a point at which an impedance of the second series-arm element reaches a local minimum define a pass band and a point at which an impedance of the first series-arm element reaches a local maximum and a point at which an impedance of the second series-arm element reaches a local maximum define an attenuation band, and a second filter characteristic in which, when seen from the input terminal in the second state, a point at which an impedance of the first series-arm element reaches a local minimum and a point at which an impedance of the second series-arm element reaches a local minimum define a pass band and a point at which an impedance of the first series-arm element reaches a local maximum and a point at which an impedance of the second series-arm element reaches a local maximum define an attenuation band.

Accordingly, the first series-arm element and the second series-arm element are each an acoustic wave resonator, and thus both the first filter characteristic and the second filter characteristic can implement filter characteristics with high steepness. Moreover, since the pass bands and the attenuation bands of the first filter characteristic and the second filter characteristic are specified in the way described above, the first filter characteristic and the second filter characteristic can implement, for example, bandpass type and band elimination type, two filter characteristics in which the pass bands and the attenuation bands are interchanged.

Further, the switch may have a first selection terminal connected to the first resonant circuit, a second selection terminal connected to the second resonant circuit, and a common terminal to be connected to one of the first selection terminal and the second selection terminal.

Accordingly, the number of terminals to be required for the switch can be reduced, and the entire filter device can be made further compact.

Further, the first resonant circuit may include a plurality of first series-arm elements connected in series in the first path, the second resonant circuit may include a second series-arm element disposed in series in the second path, and a second parallel-arm element that connects the second path and ground to each other, and the switch may bring a node between the plurality of first series-arm elements and ground into non-conduction and bring the second resonant circuit and one terminal among the input terminal and the output terminal into non-conduction in the first state, and may bring the node and ground into conduction and bring the second resonant circuit and the one terminal into conduction in the second state.

Accordingly, in the first state, a radio-frequency signal of the first resonant frequency flowing from the input terminal to the output terminal is transmitted without passing through the switch, thereby reducing the loss in the pass band. In the first state, furthermore, the second resonant circuit and one terminal among the input terminal and the output terminal are brought into non-conduction, thereby preventing a radio-frequency signal of the second resonant frequency from being transmitted to the output terminal. Accordingly, the attenuation in the attenuation band can be improved (increased). That is, in this aspect, a satisfactory filter characteristic can be formed in the first state, in particular.

Further, the plurality of first series-arm elements and the second series-arm element may be each an acoustic wave resonator, and the filter device may have a first filter characteristic in which, when seen from the input terminal in the first state, points at which impedances of the plurality of first series-arm elements reach a local minimum and a point at which an impedance of the second series-arm element reaches a local minimum define a pass band and points at which impedances of the plurality of first series-arm elements reach a local maximum and a point at which an impedance of the second series-arm element reaches a local maximum define an attenuation band, and form a second filter characteristic in which, when seen from the input terminal in the second state, points at which impedances of the plurality of first series-arm elements reach a local minimum and a point at which an impedance of the second series-arm element reaches a local minimum define a pass band and points at which impedances of the plurality of first series-arm elements reach a local maximum and a point at which an impedance of the second series-arm element reaches a local maximum define an attenuation band.

Accordingly, the plurality of first series-arm elements and the second series-arm element are each an acoustic wave resonator, and thus both the first filter characteristic and the second filter characteristic can implement filter characteristics with high steepness. Moreover, since the pass bands and the attenuation bands of the first filter characteristic and the second filter characteristic are specified in the way described above, the first filter characteristic and the second filter characteristic can implement, for example, low-pass type (or high-pass type) and bandpass-type, two filter characteristics in which the pass bands and the attenuation bands are interchanged.

Further, at least one of the first resonant circuit and the second resonant circuit may be an LC resonant circuit constituted by an inductor and a capacitor.

Accordingly, at least one of the first resonant circuit and the second resonant circuit is constituted by an LC resonant circuit, thereby widening, for example, the pass band or the attenuation band in at least one of the first state and the second state.

Further, the filter device may further include an additional element, which is an impedance element connected in series or parallel with at least one of a plurality of impedance elements that constitute the first resonant circuit and the second resonant circuit.

Such an additional element changes the resonant frequency of the filter device, and thus a filter characteristic in at least one of the first state and the second state can be adjusted. Accordingly, by adjusting an additional element to meet the required specifications, the desired band can be supported.

Further, the filter device may further include an additional switch connected in series or parallel with the additional element, and a circuit including the additional element and the additional switch may be connected in series or parallel with the at least one of the plurality of impedance elements.

The resonant frequency of the filter device changes in accordance with the on and off of the additional switch. Thus, three or more multiple bands can be supported.

Further, the additional element may be an acoustic wave resonator.

Accordingly, the attenuation in the attenuation band can be improved (increased), providing a compact filter device capable of supporting multiple bands and having excellent attenuation characteristics.

Further, filter devices, each of which is the filter device having any one of the configurations described above, may be cascade-connected in a plurality of stages.

With this configuration, the bandpass characteristics (filter characteristics) of the entire filter device can be more finely adjusted. Accordingly, the switches in each stage are switched as appropriate to meet the required specifications, thereby enabling the desired band to be supported. In addition, filter devices are cascade-connected in a plurality of stages, which can improve the attenuation in the attenuation band.

A radio-frequency front-end circuit according to another aspect of the present disclosure includes the filter device having any one of the configurations described above, and an amplifier circuit connected to the filter device.

Accordingly, a radio-frequency front-end circuit including a compact filter device capable of supporting multiple bands can implement a compact radio-frequency front-end circuit capable of supporting multiple bands.

A communication apparatus according to another aspect of the present disclosure includes the radio-frequency front-end circuit described above, an RF signal processing circuit that performs signal processing on at least one of a radio-frequency signal to be outputted to the radio-frequency front-end circuit and a radio-frequency signal inputted from the radio-frequency front-end circuit, and a baseband signal processing circuit that performs signal processing on at least one of a low-frequency signal to be outputted to the RF signal processing circuit and a low-frequency signal inputted from the RF signal processing circuit.

Accordingly, a communication apparatus including the radio-frequency front-end circuit described above can implement a compact communication apparatus capable of supporting multiple bands.

According to the present disclosure, it is possible to provide a compact filter device, radio-frequency front-end circuit, and communication apparatus that are capable of supporting multiple bands.

DETAILED DESCRIPTION OF THE DISCLOSURE

Figure 1A:
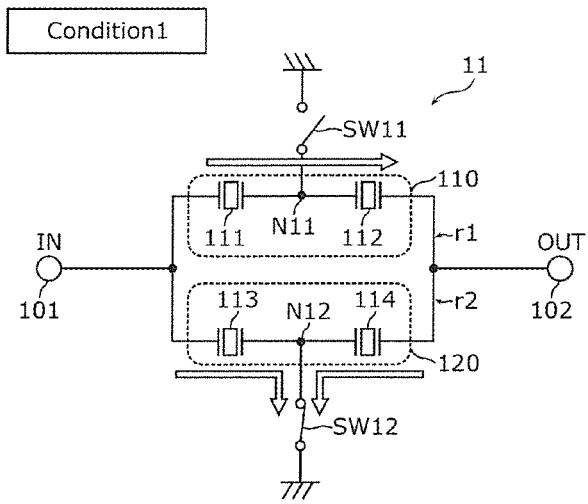
FIGS. 1A and 1B include circuit diagrams of a filter according to Embodiment 1.

The following describes embodiments of the present disclosure in detail with reference to the drawings. All of the embodiments described below provide general or specific examples. The values, shapes, materials, components, the arrangements and connection forms of the components, and so on, which are provided in the following embodiments, are examples and are not intended to limit the present disclosure. The components mentioned in the following embodiments are described as optional components unless they are specified in the independent claims. In addition, the components illustrated in the drawings are not representative of exact proportions or dimensions. Additionally, in the drawings, substantially the same elements are denoted by the same numerals, and any redundant description will be omitted or may be briefly given. Note that parameters for circuit elements such as resonators may be adjusted as appropriate to meet the required specifications or the like. Thus, substantially the same elements include not only elements having exactly the same parameter but also elements having different parameters.

Embodiment 1

[1-1. Configuration]

Figure 1B:
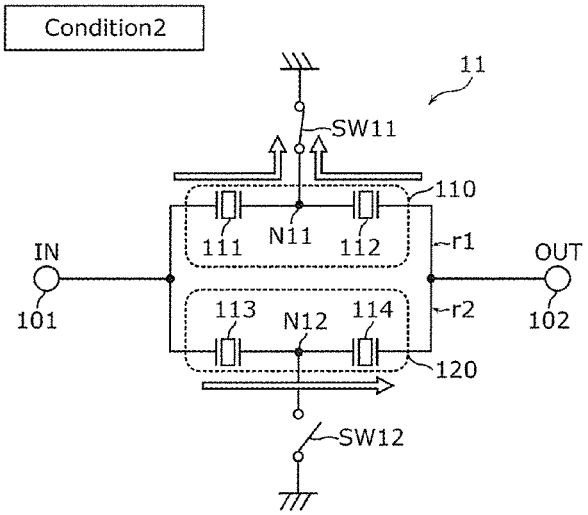

FIGS. 1A and 1B include circuit diagrams of a filter 11 according to this embodiment. Specifically, FIGS. 1A and 1B illustrate circuit diagrams in two states (Condition 1/2) in which switches SW11 and SW12 have different ON/OFF states. FIG. 1A is a circuit diagram in Condition 1, and FIG. 1B is a circuit diagram in Condition 2. FIG. 1A also schematically illustrates radio-frequency signals that pass through the filter 11.

The filter 11 illustrated in FIGS. 1A and 1B is, for example, a transmit filter disposed in a radio-frequency front-end circuit included in a front-end unit of a communication apparatus. The filter 11 filters a radio-frequency signal inputted to an IN terminal 101 (input terminal) from an RFIC (Radio Frequency Integrated Circuit) (not illustrated) via a transmit amplifier circuit (not illustrated) such as a power amplifier. Accordingly, the filter 11 outputs a radio-frequency signal of a predetermined pass band to an antenna element (not illustrated) from an OUT terminal 102 (output terminal). The filter 11 may be a receive filter that filters a radio-frequency signal received by the antenna element and inputted to the IN terminal 101 and that outputs the signal to the RFIC from the OUT terminal 102 via a receive amplifier circuit (not illustrated) such as a low noise amplifier. For convenience of description, the IN terminal 101 is described as an input terminal and the OUT terminal 102 is described as an output terminal; these may be opposite.

Specifically, the filter 11 includes the IN terminal 101, the OUT terminal 102, a first resonant circuit 110, a second resonant circuit 120, and the switches SW11 and SW12.

The first resonant circuit 110 is disposed in a first path r1 connecting the IN terminal 101 and the OUT terminal 102. In this embodiment, the first resonant circuit 110 includes a plurality of first series-arm elements (here, two resonators 111 and 112) connected in series in the first path r1. The first resonant circuit 110 has a first resonant frequency, and causes a radio-frequency signal of the first resonant frequency (i.e., a signal component of the first resonant frequency) included in the radio-frequency signal inputted to the IN terminal 101 to flow to the OUT terminal 102 or ground in accordance with the states (here, on and off) of the switches SW11 and SW12.

The first resonant frequency is defined by the individual impedances or combined impedance of impedance elements included in the first resonant circuit 110, and is, specifically, a frequency at which the impedance of the first resonant circuit 110 reaches a local minimum. The frequency at which impedance reaches a local minimum is not limited to one frequency and may be constituted by a plurality of frequencies when, for example, the first resonant circuit 110 includes a plurality of resonators as impedance elements. Accordingly, the first resonant frequency is not limited to one frequency and may be constituted by a plurality of frequencies.

The second resonant circuit 120 is disposed in a second path r2 connecting the IN terminal 101 and the OUT terminal 102. In this embodiment, the second resonant circuit 120 includes a plurality of second series-arm elements (here, two resonators 113 and 114) connected in series in the second path r2. The second resonant circuit 120 has a second resonant frequency different from the first resonant frequency, and causes a radio-frequency signal of the second resonant frequency (i.e., a signal component of the second resonant frequency) included in the radio-frequency signal inputted to the IN terminal 101 to flow to ground or the OUT terminal 102 in accordance with the states (here, on and off) of the switches SW11 and SW12.

The second resonant frequency is defined by the individual impedances or combined impedance of impedance elements included in the second resonant circuit 120, and is, specifically, a frequency at which the impedance of the second resonant circuit 120 when seen from outside reaches a local minimum. Accordingly, like the first resonant frequency, the second resonant frequency is not limited to one frequency and may be constituted by a plurality of frequencies.

In this embodiment, the first resonant circuit 110 and the second resonant circuit 120 are connected in parallel between the IN terminal 101 and the OUT terminal 102.

In this embodiment, the plurality of first series-arm elements and the plurality of second series-arm elements (the resonators 111 to 114) are each an acoustic wave resonator that uses an acoustic wave such as a surface acoustic wave (SAW). Due to the structure, such an acoustic wave resonator has a singularity at which the impedance reaches a local minimum (ideally, a point at which the impedance reaches 0) and a singularity at which the impedance reaches a local maximum (ideally, a point at which the impedance becomes infinite). In this embodiment, therefore, the first resonant frequency at which the first resonant circuit 110 resonates is the frequency at the singularity at which the impedances of the resonators 111 and 112 reach a local minimum, and the second resonant frequency at which the second resonant circuit 120 resonates is the frequency at the singularity at which the impedances of the resonators 113 and 114 reach a local minimum.

Each resonator is not limited to an acoustic wave resonator that uses a surface acoustic wave and may be constituted by, for example, an acoustic wave resonator that uses a bulk wave or a boundary acoustic wave.

The switches SW11 and SW12 are switches that are respectively connected to the first resonant circuit 110 and the second resonant circuit 120 and that switch between the Condition 1 and the Condition 2. In this embodiment, as illustrated in FIG. 1A, the Condition 1 is a first state in which a radio-frequency signal of the first resonant frequency is caused to flow from the IN terminal 101 (input terminal) to the OUT terminal 102 (output terminal) via the first resonant circuit 110 and a radio-frequency signal of the second resonant frequency is caused to flow from the IN terminal 101 to ground via the second resonant circuit 120. In this embodiment, as illustrated in FIG. 1B, the Condition 2 is a second state in which a radio-frequency signal of the second resonant frequency is caused to flow from the IN terminal 101 to the OUT terminal 102 via the second resonant circuit 120 and a radio-frequency signal of the first resonant frequency is caused to flow from the IN terminal 101 to ground via the first resonant circuit 110.

In this embodiment, in the Condition 1 (the first state), the switches SW11 and SW12 bring a first node N11 between the resonator 111 and the resonator 112 and ground into non-conduction and bring a second node N12 between the resonator 113 and the resonator 114 and ground into conduction. In the Condition 2 (the second state), in contrast, the switches SW11 and SW12 bring the first node N11 and ground into conduction and bring the second node N12 and ground into non-conduction.

The switches SW11 and SW12 are each configured as a switch IC (Integrated Circuit) constituted by, for example, an FET (Field Effect Transistor) switch or a diode switch. The switches SW11 and SW12 are not limited to semiconductor switches on a semiconductor substrate and may be each a mechanical switch constituted by MEMS (Micro Electro Mechanical Systems).

In this embodiment, the switches SW11 and SW12 are two SPST (Single-Pole, Single-Throw) type switches, each of which is exclusively turned on and off. That is, one of the switch SW11 and the switch SW12 is turned off when the other switch is turned on, and is turned on when the other switch is turned off. Specifically, the switch SW11, which is connected between the first node N11 and ground, is turned off in the Condition 1 to bring the first node N11 and ground into non-conduction, and is turned on in the Condition 2 to bring the first node N11 and ground into conduction. The switch SW12, which is connected between the second node N12 and ground, is turned on in the Condition 1 to bring the second node N12 and ground into conduction, and is turned off in the Condition 2 to bring the second node N12 and ground into non-conduction.

[1-2. Operation]

The filter 11 having the configuration described above operates as follows in response to the switching of the states (in this embodiment, on and off) of the switches SW11 and SW12 in accordance with a control signal from a control unit (not illustrated) such as an RFIC.

In accordance with the switching of the switches SW11 and SW12, out of the first resonant circuit 110 and the second resonant circuit 120, a resonant circuit positioned in a series arm serving as a path along which a radio-frequency signal travels from the IN terminal 101 to the OUT terminal 102 (i.e., a series-arm resonant circuit) and a resonant circuit positioned in a parallel arm serving as a path connecting the series arm and ground (i.e., a parallel-arm resonant circuit) are interchanged.

Specifically, as illustrated in FIG. 1A, when the switch SW11 is off and the switch SW12 is on (the Condition 1), a series-arm resonant circuit is formed by the first resonant circuit 110 and a parallel-arm resonant circuit is formed by the second resonant circuit 120. In this case, in this embodiment, a n-type ladder circuit is formed in which a series-connected circuit of the resonator 111 and the resonator 112 constitutes a single series-arm resonant circuit and the resonator 113 and the resonator 114 constitute two separate parallel-arm resonant circuits.

In contrast, as illustrated in FIG. 1B, when the switch SW11 is on and the switch SW12 is off (the Condition 2), a series-arm resonant circuit is formed by the second resonant circuit 120 and a parallel-arm resonant circuit is formed by the first resonant circuit 110. In this case, in this embodiment, a n-type ladder circuit is formed in which a series-connected circuit of the resonator 113 and the resonator 114 constitutes a single series-arm resonant circuit, and the resonator 111 and the resonator 112 constitute two separate parallel-arm resonant circuits.

[1-3. Characteristics]

Next, the filter characteristics (bandpass characteristics) of the filter 11, which are formed by the operation described above, will be described together with impedance characteristics that define the filter characteristics.

Figure 1C:
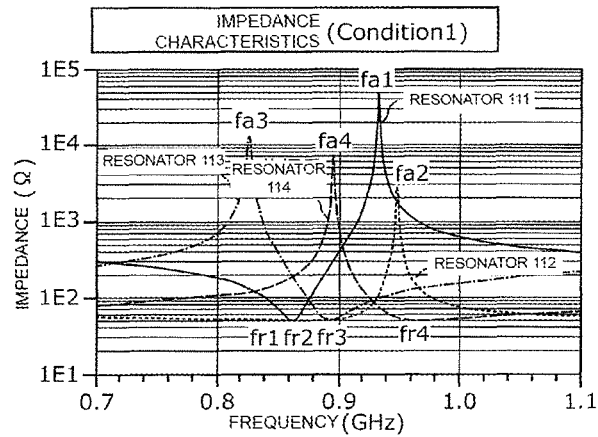
FIGS. 1C, 1D and 1E include graphs illustrating various characteristics of the filter according to Embodiment 1.
Figure 1D:
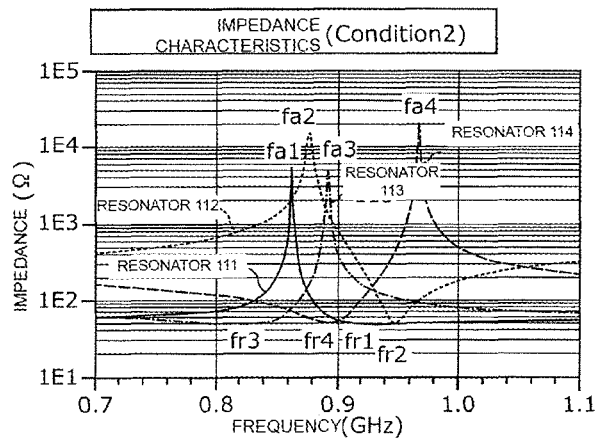
Figure 1E:
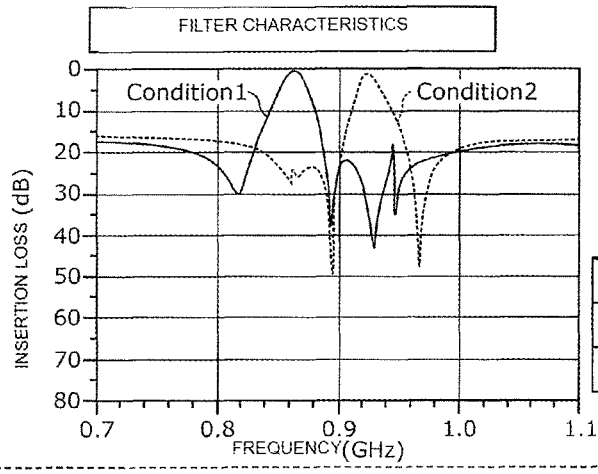

FIGS. 1C, 1D and 1E include graphs illustrating various characteristics of the filter 11. Specifically, FIG. 1C is a graph illustrating the impedance characteristics seen from the IN terminal 101 in the Condition 1 (the first state), FIG. 1D is a graph illustrating the impedance characteristics seen from the IN terminal 101 in the Condition 2 (the second state), and FIG. 1E is a graph illustrating the filter characteristics in the Conditions 1 and 2 for comparison.

That is, the impedance characteristics illustrated in FIGS. 1C and 1D depict impedances of impedance elements (here, resonators) that affect the path (series arm) along which a radio-frequency signal travels from the IN terminal 101 to the OUT terminal 102. Specifically, for each of the impedance elements positioned in the series arm, the impedance of the impedance element is depicted. For each of the impedance elements positioned in the parallel arm connecting the series arm and ground, the reciprocal of the impedance of the impedance element is depicted. These notes regarding the impedance characteristics also apply to the following graphs illustrating the impedance characteristics.

As is apparent from FIGS. 1C and 1D, the comparison between the impedances of the resonators 111 to 114 under the Condition 1 and those under the Condition 2 indicates that the frequencies at resonant points fr1 to fr4, which are points at which the impedances reach a local minimum, and the frequencies at anti-resonant points fa1 to fa4, which are points at which the impedances reach a local maximum, are interchanged.

For example, the resonator 111 is positioned in the series arm under the Condition 1 and is positioned in the parallel arm under the Condition 2. Accordingly, in the Condition 1, the resonator 111 has the resonant point fr1 at the singularity at which the impedance thereof reaches a local minimum and the anti-resonant point fa1 at the singularity at which the impedance thereof reaches a local maximum. In contrast, in the Condition 2, the resonator 111 has the anti-resonant point fa1 at the singularity at which the impedance thereof reaches a local minimum and the resonant point fr1 at the singularity at which the impedance thereof reaches a local maximum. That is, the frequency at the resonant point fr1 in the Condition 1 is equal to the frequency at the anti-resonant point fa1 in the Condition 2, and the frequency at the anti-resonant point fa1 in the Condition 1 is equal to the frequency at the resonant point fr1 in the Condition 2. Accordingly, the frequency at the resonant point fr1 and the frequency at the anti-resonant point fa1 are interchanged in the Condition 1 and the Condition 2.

The resonant points fr1 to fr4 and the anti-resonant points fa1 to fa4 are interchanged in the Condition 1 and the Condition 2, thereby allowing the filter 11 to form two filter characteristics, as illustrated in FIG. 1E.

Specifically, the filter 11 forms a filter characteristic ("Condition 1" in FIG. 1E) in which, when seen from the IN terminal 101 in the Condition 1 (the first state), points at which the impedances of the resonators 111 and 112 (plurality of first series-arm elements) reach a local minimum (the resonant points fr1 and fr2 in FIG. 1C) and points at which the impedances of the resonators 113 and 114 (plurality of second series-arm elements) reach a local minimum (the resonant points fr3 and fr4 in FIG. 1C) define a pass band, and points at which the impedances of the resonators 111 and 112 reach a local maximum (the anti-resonant points fa1 and fa2 in FIG. 1C) and points at which the impedances of the resonators 113 and 114 reach a local maximum (the anti-resonant points fa3 and fa4 in FIG. 1C) define an attenuation band.

Note that the pass band is less likely to be formed in the presence of an impedance element such as a resonator having a relatively high impedance (e.g., 500Ω or more) seen from the IN terminal 101 even near the points that define the pass band (the resonant points fr1 to fr4 in FIG. 1C). That is, in this case, an impedance element having a relatively high impedance hinders the flow of a radio-frequency signal from the IN terminal 101 to the OUT terminal 102. As a result, the pass band is less likely to be formed near the points that define the pass band.

As illustrated in FIG. 1C, in the Condition 1, the frequencies at the resonant points fr1 to fr4 and the frequencies at the anti-resonant points fa1 to fa4 satisfy fr1<fr2<fr3<fr4 and fa3<fa4<fa1<fa2, and the impedances between the anti-resonant point fa3 and the anti-resonant point fa4 are entirely low. Accordingly, a bandpass-type filter characteristic (hereinafter, BPF-type filter characteristic) is formed at this time, which has a pass band between the anti-resonant point fa3 and the anti-resonant point fa4, an attenuation band having the point fa3 as an attenuation pole on the low-frequency side of the pass band, and an attenuation band having the points fa1, fa2, and fa4 as attenuation poles on the high-frequency side of the pass band.

In contrast, the filter 11 forms a filter characteristic ("Condition 2" in FIG. 1E) in which, when seen from the IN terminal 101 in the Condition 2 (the second state), points at which the impedances of the resonators 111 and 112 (plurality of first series-arm elements) reach a local minimum (the points fr1 and fr2 in FIG. 1D) and points at which the impedances of the resonators 113 and 114 (plurality of second series-arm elements) reach a local minimum (the points fr3 and fr4 in FIG. 1D) define a pass band and points at which the impedances of the resonators 111 and 112 reach a local maximum (the points fa1 and fa2 in FIG. 1D) and points at which the impedances of the resonators 113 and 114 reach a local maximum (the points fa3 and fa4 in FIG. 1D) define an attenuation band.

As illustrated in FIG. 1D, in the Condition 2, the frequencies at the resonant points fr1 to fr4 and the frequencies at the anti-resonant points fa1 to fa4 satisfy fr3<fr4<fr1<fr2 and fa1<fa2<fa3<fa4, and the impedances between the anti-resonant point fa3 and the anti-resonant point fa4 are entirely low. Accordingly, at this time, a BPF-type filter characteristic is formed, which has a pass band between the anti-resonant point fa3 and the anti-resonant point fa4, an attenuation band having the points fa1, fa2, and fa3 as attenuation poles on the low-frequency side of the pass band, and an attenuation band having the point fa4 as an attenuation pole on the high-frequency side of the pass band.

The comparison between the two filter characteristics ("Condition 1" and "Condition 2" in FIG. 1E) indicates the following.

A band that is a pass band in one filter characteristic is an attenuation band in the other filter characteristic, and a band that is an attenuation band in the one filter characteristic is a pass band in the other filter characteristic. Conversely, a band that is a pass band in the other filter characteristic is an attenuation band in the one filter characteristic, and a band that is an attenuation band in the other filter characteristic is a pass band in the one filter characteristic.

Specifically, in the Condition 1, a pass band is formed by the first resonant circuit 110 causing a radio-frequency signal of the first resonant frequency to flow from the IN terminal 101 to the OUT terminal 102, and attenuation bands are formed by the second resonant circuit 120 causing a radio-frequency signal of the second resonant frequency to flow from the IN terminal 101 to ground. Under the Condition 2, in contrast, a pass band is formed by the second resonant circuit 120 causing a radio-frequency signal of the second resonant frequency to flow from the IN terminal 101 to the OUT terminal 102, and attenuation bands are formed by the first resonant circuit 110 causing a radio-frequency signal of the first resonant frequency to flow from the IN terminal 101 to ground.

Accordingly, the filter 11 forms two filter characteristics in which the pass bands and the attenuation bands are interchanged by switching between the Condition 1 and the Condition 2 using the switches SW11 and SW12.

[1-4. Advantages, Etc.]

As described above, in the filter 11 (filter device) according to this embodiment, in response to the switching of the switches SW11 and SW12, a series-arm resonant circuit disposed in a path (series arm) along which a radio-frequency signal travels from the IN terminal 101 (input terminal) to the OUT terminal 102 (output terminal) and a parallel-arm resonant circuit disposed in a path (parallel-arm) connecting the path described above and ground are interchanged in position. At this time, since the resonant frequencies of the first resonant circuit 110 and the second resonant circuit 120 are different, the frequencies that define the pass band and the frequencies that define the attenuation bands are interchanged by interchanging the positions of the series-arm resonant circuit and the parallel-arm resonant circuit in response to the switching of the switches SW11 and SW12. Accordingly, two filter characteristics can be formed in which the pass bands and the attenuation bands are interchanged in response to the switching of the switches SW11 and SW12.

A multi-band filter may have a configuration in which elements of a filter supporting one band are additionally provided with another switch and another impedance element for switching between bands. However, this configuration includes an impedance element that is not used for the one band, which may hinder size reduction.

In contrast, according to this embodiment, two filter characteristics are formed by interchanging the positions of the series-arm resonant circuit and the parallel-arm resonant circuit without any other additional impedance element or the like for switching between bands. That is, only a few elements are required to form two filter characteristics, and thus size reduction can be achieved.

According to this embodiment, therefore, the compact filter 11 capable of supporting multiple bands can be implemented. That is, a compact, frequency-variable filter device (tunable filter) can be implemented.

In the filter 11 according to this embodiment, furthermore, the resonators 111 and 112 (plurality of first series-arm elements) and the resonators 113 and 114 (plurality of second series-arm elements) are each an acoustic wave resonator, and thus both the first filter characteristic (in this embodiment, "Condition 1" in FIG. 1E) and the second filter characteristic (in this embodiment, "Condition 2" in FIG. 1E) can implement filter characteristics with high steepness (high-selectivity filter characteristics). In addition, the pass bands and the attenuation bands of the first filter characteristic and the second filter characteristic are defined in the manner described above, and thus the first filter characteristic and the second filter characteristic can implement, for example, two BPF-type filter characteristics in which the pass bands and the attenuation bands are interchanged.

The filter 11 forms two BPF-type filter characteristics whose pass bands do not overlap with steep attenuation slopes from the pass bands to the attenuation bands partially overlapping with each other. Thus, the filter 11 is suitable for use as a tunable filter supporting two bands whose frequency ranges are included in the pass bands of the two filter characteristics.

That is, due to the structural and material factors of an acoustic wave resonator, there is a limitation on the lower limit and upper limit of a band of the acoustic wave resonator (difference frequency between a resonant point and an anti-resonant point). For this reason, the filter 11 is used as a tunable filter supporting two bands having the relationship described above, thereby suppressing the attenuation floating around a pass band (e.g., the range of 0 MHz or more and 30 MHz or less from the end of the pass band) to ensure sufficient attenuation, while suppressing the attenuation floating in the counterpart band (when the filter 11 is tuned to one of the two bands, the other band) to ensure sufficient attenuation.

In the filter 11 according to this embodiment, furthermore, in the first state (in this embodiment, the Condition 1), the switches SW11 and SW12 bring the first node N11 and ground into non-conduction and bring the second node N12 and ground into conduction. In the second state (in this embodiment, the Condition 2), the switches SW11 and SW12 bring the first node N11 and ground into conduction and bring the second node N12 and ground into non-conduction. Accordingly, in both the first state and the second state, a radio-frequency signal flowing from the IN terminal 101 to the OUT terminal 102 is transmitted without passing through the switches SW11 and SW12, which can reduce (improve) loss.

In this embodiment, the two SPST-type switches SW11 and SW12 have been described as switches that switch between the first state and the second state, by way of example. However, the switches may be constituted by a single SPDT (Single-Pole, Double-Throw) type switch.

Figure 2A:
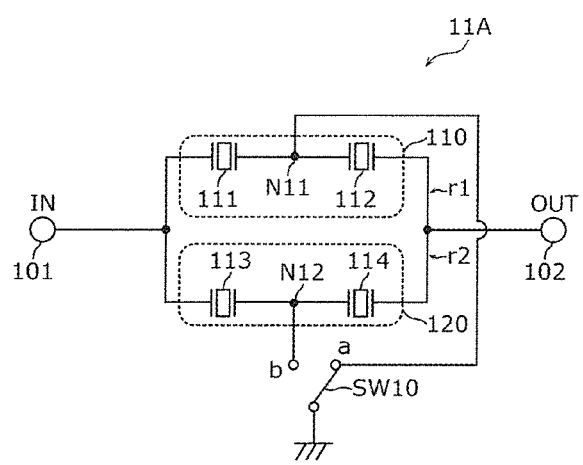
FIG. 2A is a circuit diagram of a filter including a switch according to a modification.
Figure 2B:
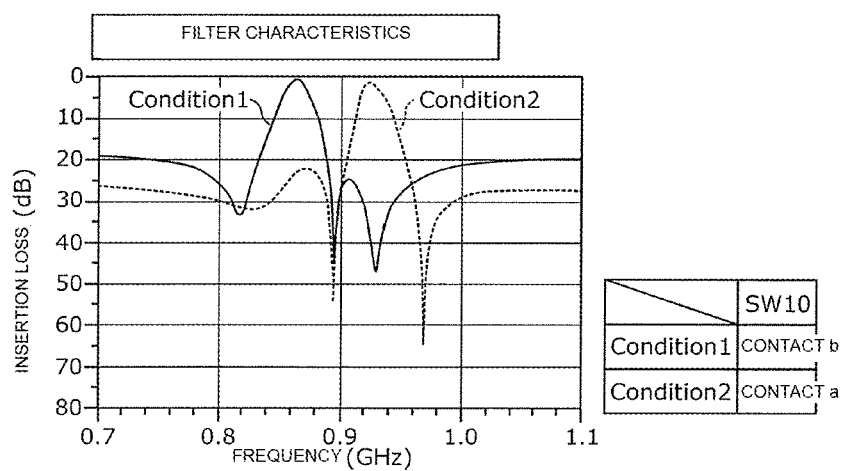
FIG. 2B is a graph illustrating the filter characteristics of the filter.

FIG. 2A is a circuit diagram of a filter 11A including a switch SW10. FIG. 2B is a graph illustrating the filter characteristics of the filter 11A.

The filter 11A illustrated in FIG. 2A includes the switch SW10, which has a first selection terminal (a contact a in FIG. 2A) connected to the first resonant circuit 110, a second selection terminal (a contact b in FIG. 2A) connected to the second resonant circuit 120, and a common terminal to be connected to one of the first selection terminal and the second selection terminal. Here, the first selection terminal is connected to the first node N11, the second selection terminal is connected to the second node N12, and the common terminal is connected to ground.

In the filter 11A having the configuration described above, the common terminal is connected to the second selection terminal at the switch SW10, thereby achieving a state similar to the Condition 1 in Embodiment 1 described above. The common terminal is connected to the first selection terminal, thereby achieving a state similar to the Condition 2 in Embodiment 1 described above. Accordingly, the filter 11A achieves advantages similar to those of the filter 11 according to Embodiment 1 described above. That is, two filter characteristics in which the pass bands and the attenuation bands are interchanged (see FIG. 2B) can be formed, and thus the compact filter 11A capable of supporting multiple bands can be implemented.

In addition, the use of the switch SW10 can reduce the number of terminals to be required, compared with the use of the switches SW11 and SW12. Thus, the filter 11A can be made further compact as a whole.

The number of first series-arm elements of the first resonant circuit 110 and the number of second series-arm elements of the second resonant circuit 120 are each desirably two or more and may be each three or more. When the number of first series-arm elements is three or more, the switch SW10 may switch conduction and non-conduction between ground and two or more points between three or more first series-arm elements (e.g., points between three or more first series-arm elements). That is, the number of first nodes N11 is not limited to one, and a plurality of first nodes N11 may be used. The same applies to the second node N12 when the number of second series-arm elements is three or more.

Modification 1 of Embodiment 1

An impedance element may be added to the impedance elements (here, the resonators 111 to 114) of the filter 11 according to Embodiment 1. That is, an additional element may be provided, which is an impedance element connected in series or parallel with at least one of the plurality of impedance elements (in Embodiment 1 described above, the resonators 111 to 114) of the first resonant circuit 110 and the second resonant circuit 120. Such an additional element changes the resonant frequency of the filter (filter device), and thus the filter characteristic in at least one of the Condition 1 (the first state) and the Condition 2 (the second state) can be adjusted. Accordingly, by adjusting an additional element to meet the required specifications, the desired band can be supported. The following describes such a filter according to Modification 1 of Embodiment 1 with reference to Example Configurations 1 to 5.

In the graphs illustrating the filter characteristics according to this modification, described below, filter characteristics when a capacitor is provided as an additional element are illustrated. However, the additional element is not limited to a capacitor and may be an inductor or an acoustic wave resonator. In the graphs illustrating the filter characteristics, the filter characteristics according to Embodiment 1 described above are also illustrated for comparison, with the filter characteristics according to this modification indicated by bold lines and the filter characteristics according to Embodiment 1 indicated by thin lines.

[1-5-1. Example Configuration 1]

Figure 3A:
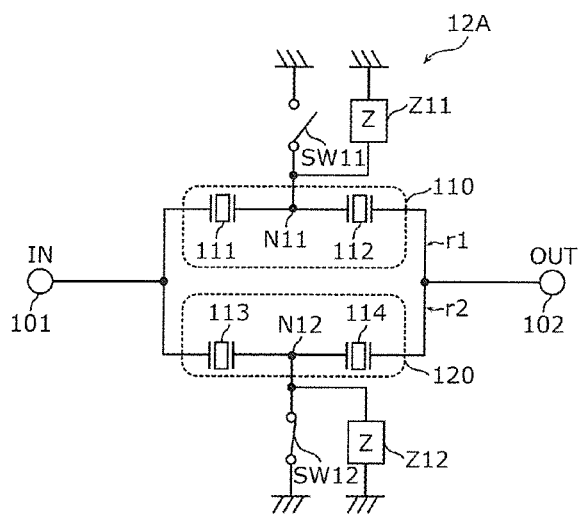
FIG. 3A is a circuit diagram of a filter according to Example Configuration 1 of Modification 1 of Embodiment 1.
Figure 3B:
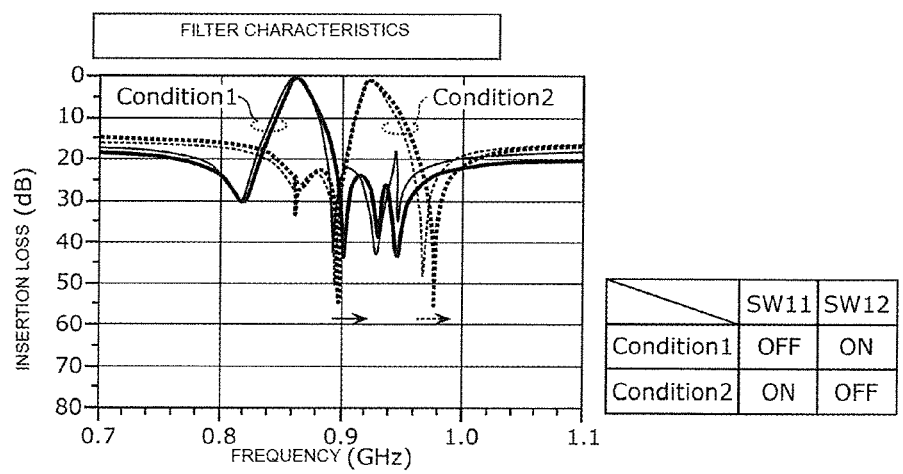
FIG. 3B is a graph illustrating the filter characteristics of the filter.

FIG. 3A is a circuit diagram of a filter 12A according to Example Configuration 1 of this modification. FIG. 3B is a graph illustrating the filter characteristics of the filter 12A according to Example Configuration 1 of this modification.

As illustrated in FIG. 3A, the filter 12A includes, as additional elements, an impedance element Z11 connected in parallel with the switch SW11, and an impedance element Z12 connected in parallel with the switch SW11. That is, the impedance element Z11 is connected in series with the resonator 111 between the IN terminal 101 and ground and is connected in series with the resonator 112 between the OUT terminal 102 and ground. The impedance element Z12 is connected in series with the resonator 113 between the IN terminal 101 and ground and is connected in series with the resonator 114 between the OUT terminal 102 and ground.

With the additional elements described above, as illustrated in FIG. 3B, the filter 12A can shift attenuation poles. In this example configuration, both in the Condition 1 and the Condition 2, the filter 12A shifts the attenuation poles to the high-frequency side with an increase in attenuation.

[1-5-2. Example Configuration 2]

Figure 4A:
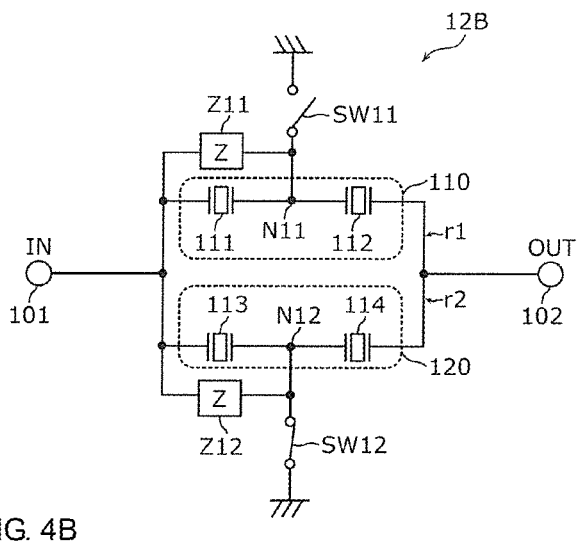
FIG. 4A is a circuit diagram of a filter according to Example Configuration 2 of Modification 1 of Embodiment 1.
Figure 4B:
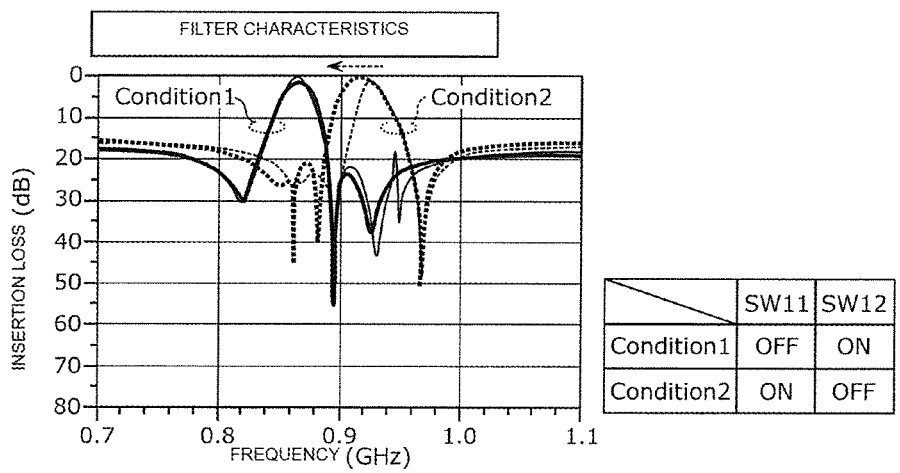
FIG. 4B is a graph illustrating the filter characteristics of the filter.

FIG. 4A is a circuit diagram of a filter 12B according to Example Configuration 2 of this modification. FIG. 4B is a graph illustrating the filter characteristics of the filter 12B according to Example Configuration 2 of this modification.

As illustrated in FIG. 4A, the filter 12B includes, as additional elements, an impedance element Z11 connected in parallel with the resonator 111 and an impedance element Z12 connected in parallel with the resonator 113. With the additional elements described above, as illustrated in FIG. 4B, the filter 12B can shift the end of the pass band. In this example configuration, the filter 12B greatly shifts the low-frequency end of the pass band to the low-frequency side in the Condition 2.

In Example Configurations 1 and 2, one of the impedance elements Z11 and Z12 is optional.

[1-5-3. Example Configuration 3]

Figure 5A:
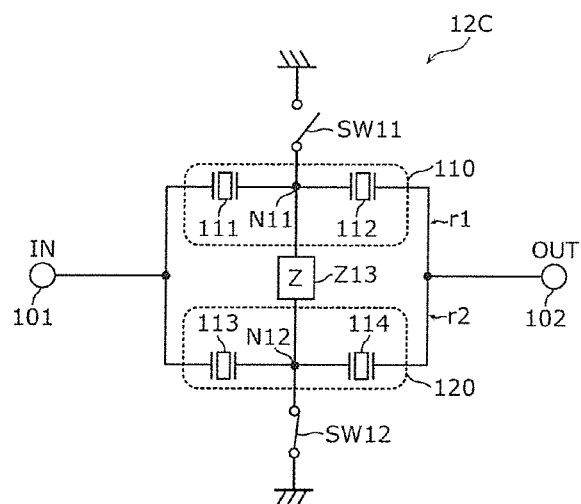
FIG. 5A is a circuit diagram of a filter according to Example Configuration 3 of Modification 1 of Embodiment 1.
Figure 5B:
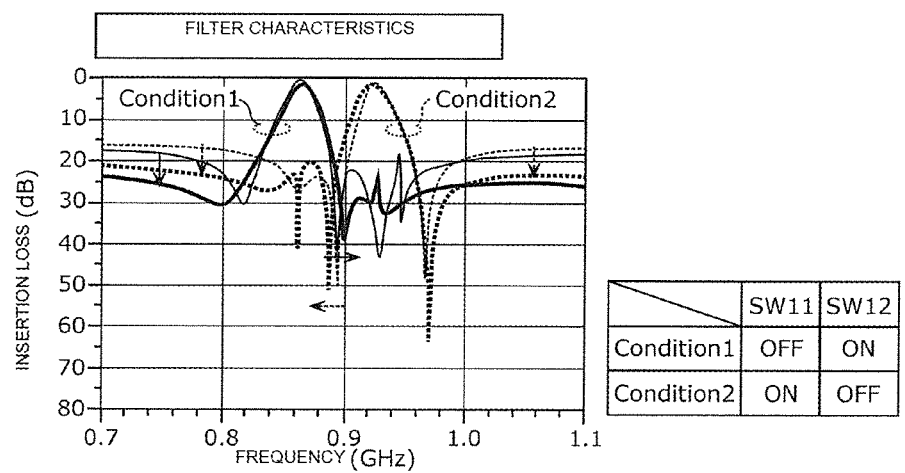
FIG. 5B is a graph illustrating the filter characteristics of the filter.

FIG. 5A is a circuit diagram of a filter 12C according to Example Configuration 3 of this modification. FIG. 5B is a graph illustrating the filter characteristics of the filter 12C according to Example Configuration 3 of this modification.

As illustrated in FIG. 5A, the filter 12C includes, as an additional element, an impedance element Z13 that connects the first node N11 and the second node N12 to each other. That is, the impedance element Z13 is connected in parallel with a circuit including a series-connection of the resonator 111 and the resonator 113 and is connected in parallel with a circuit including a series-connection of the resonator 112 and the resonator 114.

With the additional element described above, as illustrated in FIG. 5B, the filter 12C can shift an attenuation pole with an increase in attenuation over a wide range, compared with the filter 11. In this example configuration, the filter 12C shifts the attenuation pole to the high-frequency side with an increase in attenuation over a wide range in the Condition 1. Further, the filter 12C shifts the attenuation pole to the low-frequency side with an increase in attenuation over a wide range in the Condition 2.

When the number of first series-arm elements of the first resonant circuit 110 is three or more, an end of the impedance element Z13 may be connected to a point different from the first node N11 to which the switch SW11 is connected. That is, in this case, the end of the impedance element Z13 is desirably connected to any point between the plurality of first series-arm elements. Likewise, when the number of second series-arm elements of the second resonant circuit 120 is three or more, the other end of the impedance element Z13 may be connected to a point different from the second node N12 to which the switch SW12 is connected.

[1-5-4. Example Configuration 4]

Figure 6A:
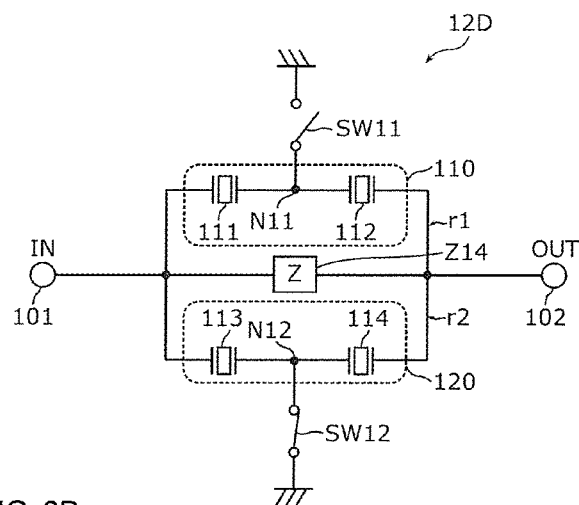
FIG. 6A is a circuit diagram of a filter according to Example Configuration 4 of Modification 1 of Embodiment 1.
Figure 6B:
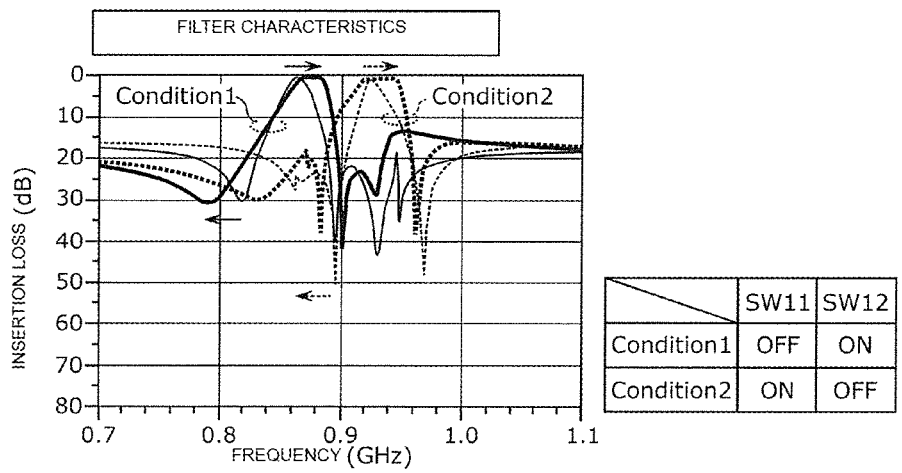
FIG. 6B is a graph illustrating the filter characteristics of the filter.

FIG. 6A is a circuit diagram of a filter 12D according to Example Configuration 4 of this modification. FIG. 6B is a graph illustrating the filter characteristics of the filter 12D according to Example Configuration 4 of this modification.

As illustrated in FIG. 6A, the filter 12D includes, as an additional element, an impedance element Z14 that connects the IN terminal 101 and the OUT terminal 102 to each other. That is, in this example configuration, the first resonant circuit 110 and the second resonant circuit 120 are connected in parallel with the impedance element Z14. With the additional element described above, as illustrated in FIG. 6B, the filter 12D can shift the high-frequency ends of the pass bands and the attenuation poles on the low-frequency side of the pass bands. In this example configuration, both in the Condition 1 and the Condition 2, the filter 12D shifts the high-frequency ends of the pass bands to the high-frequency side and shifts the attenuation poles on the low-frequency side of the pass bands to the low-frequency side.

[1-5-5. Example Configuration 5]

Figure 7A:
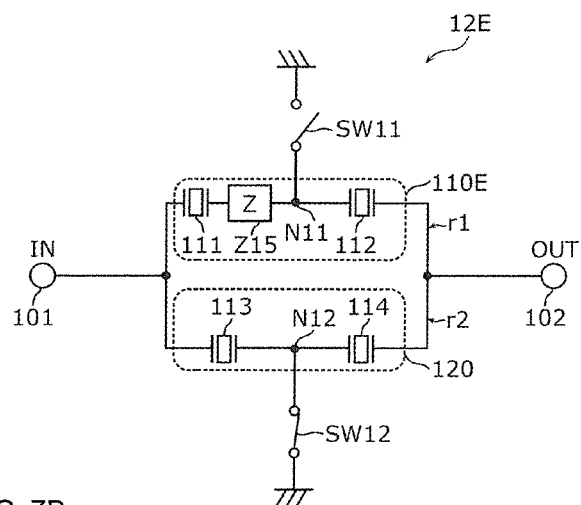
FIG. 7A is a circuit diagram of a filter according to Example Configuration 5 of Modification 1 of Embodiment 1.
Figure 7B:
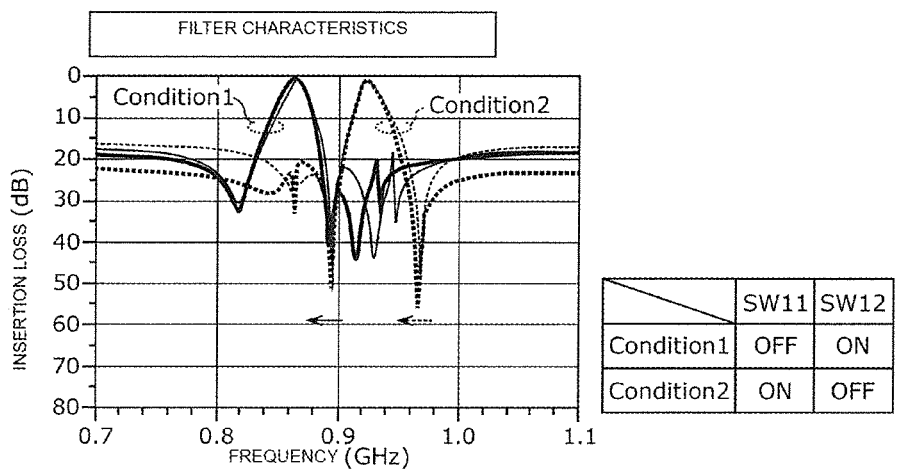
FIG. 7B is a graph illustrating the filter characteristics of the filter.

FIG. 7A is a circuit diagram of a filter 12E according to Example Configuration 5 of this modification. FIG. 7B is a graph illustrating the filter characteristics of the filter 12E according to Example Configuration 5 of this modification.

As illustrated in FIG. 7A, the filter 12E includes, as an additional element, an impedance element Z15 connected between the resonator 111 and the first node N11. With the additional element described above, as illustrated in FIG. 7B, the filter 12E can shift the attenuation poles on the high-frequency side of the pass bands. In this example configuration, both in the Condition 1 and the Condition 2, the filter 12E shifts the attenuation poles on the high-frequency side of the pass bands to the low-frequency side.

The impedance element Z15 may be disposed at any other position.

Modification 2 of Embodiment 1

Modification 1 of Embodiment 1 described above describes the addition of an additional element to the filter 11 according to Embodiment 1, thereby forming a filter characteristic different from that of the filter 11 in at least one of the Condition 1 and the Condition 2. This embodiment describes a configuration including an additional switch that selectively adds the additional element, thereby forming three or more filter characteristics.

That is, a filter according to this embodiment includes an additional switch connected in series with an additional element according to Modification 1 of Embodiment 1 described above, and a circuit including the additional element and the additional switch (here, a circuit including a series-connection of the additional element and the additional switch) is connected in series or parallel with at least one of a plurality of impedance elements that constitute a first resonant circuit and a second resonant circuit. Accordingly, the resonant frequency of the filter changes in accordance with the on and off of the additional switch. Thus, three or more multiple bands can be supported.

The configuration of the additional switch is not limited to any specific one. For example, the additional switch is an SPST-type switch having a configuration similar to that of the switches SW11 and SW22. Further, the additional switch may be contained in the same switch IC as that of the switches SW11 and SW22. Alternatively, the additional switch may be connected in parallel with the additional element, and a circuit including the additional element and the additional switch (here, a circuit including a parallel-connection of the additional element and the additional switch) may be connected in series with at least one of a plurality of impedance elements, for example.

In the following, a three-band filter according to Modification 2 of Embodiment 1 including an additional element and an additional switch will be described with reference to Example Configurations 1 to 5.

[1-6-1. Example Configuration 1]

Figure 8A:
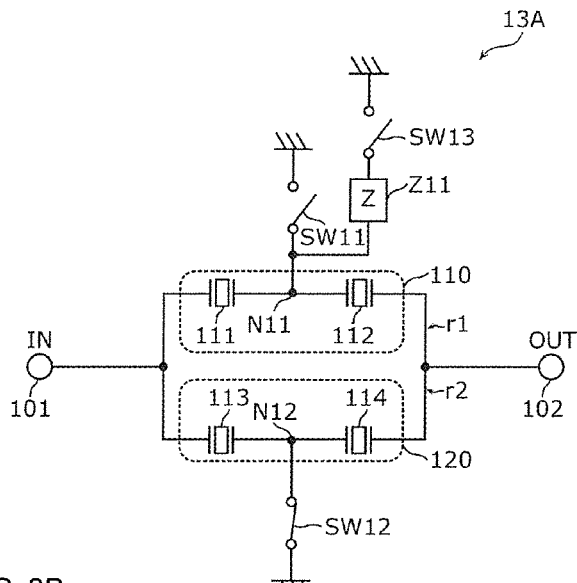
FIG. 8A is a circuit diagram of a filter according to Example Configuration 1 of Modification 2 of Embodiment 1.
Figure 8B:
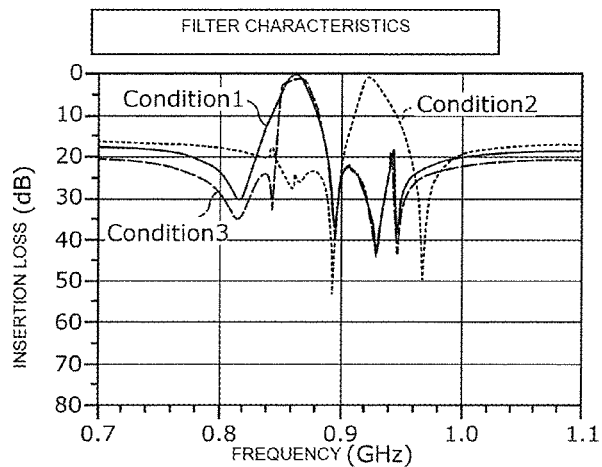
FIG. 8B is a graph illustrating the filter characteristics of the filter.

FIG. 8A is a circuit diagram of a filter 13A according to Example Configuration 1 of this modification. FIG. 8B is a graph illustrating the filter characteristics of the filter 13A according to Example Configuration 1 of this modification.

As illustrated in FIG. 8A, the filter 13A includes, as an additional element, the impedance element Z11 illustrated in FIG. 3A, and includes, as an additional switch, a switch SW13 connected in series with the impedance element Z11. In this example configuration, the switch SW13 is connected between the impedance element Z11 and ground.

With this configuration, as illustrated in FIG. 8B, the filter 13A can switch the bands to be supported by turning on and off the switches SW11 to SW13. That is, the additional switch (the switch SW13) is turned off to prevent the addition of the additional element, achieving a configuration similar to that of the filter 11 according to Embodiment 1. Thus, when the switch SW13 is off, two filter characteristics similar to those of the filter 11 ("Condition 1" and "Condition 2" in FIG. 8B) are formed in accordance with the on and off of the switches SW11 and SW12. On the other hand, the switch SW13 is turned on to add the additional element, and thus the filter 13A forms a filter characteristic ("Condition 3" in FIG. 8B) different from the two filter characteristics described above. Accordingly, the filter 13A can form three filter characteristics and can thus support three bands.

[1-6-2. Example Configuration 2]

Figure 9A:
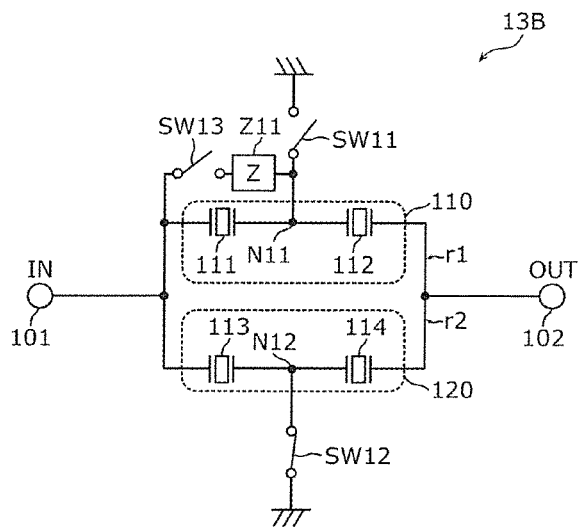
FIG. 9A is a circuit diagram of a filter according to Example Configuration 2 of Modification 2 of Embodiment 1.
Figure 9B:
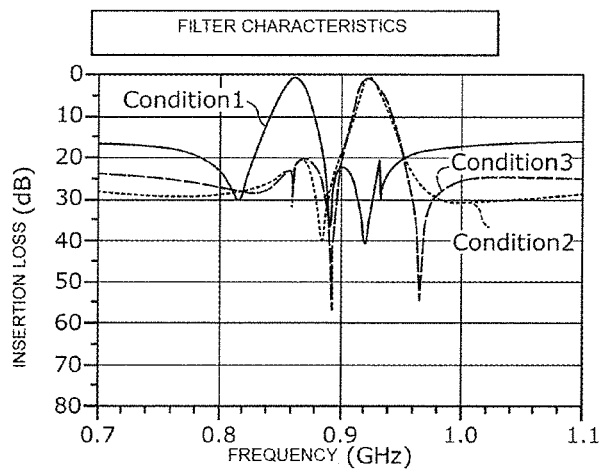
FIG. 9B is a graph illustrating the filter characteristics of the filter.

FIG. 9A is a circuit diagram of a filter 13B according to Example Configuration 2 of this modification. FIG. 9B is a graph illustrating the filter characteristics of the filter 13B according to Example Configuration 2 of this modification.

As illustrated in FIG. 9A, the filter 13B includes, as an additional element, the impedance element Z11 illustrated in FIG. 4A, and includes, as an additional switch, a switch SW13 connected in series with the impedance element Z11. With this configuration, as illustrated in FIG. 9B, similarly to the filter 13A, the filter 13B can form three filter characteristics by turning on and off the switches SW11 to SW13, and can thus support three bands.

[1-6-3. Example Configuration 3]

Figure 10A:
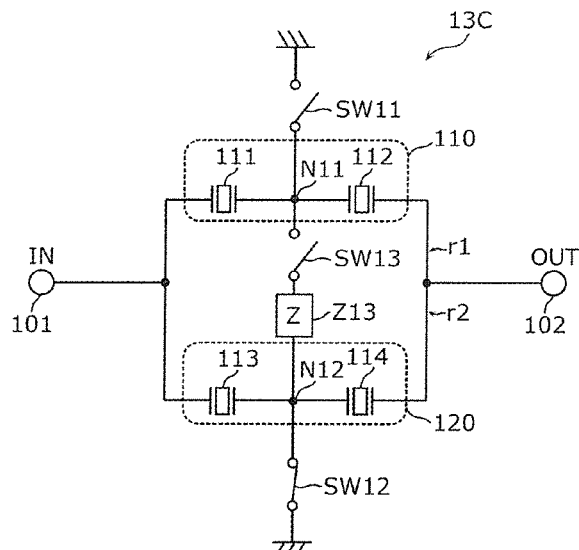
FIG. 10A is a circuit diagram of a filter according to Example Configuration 3 of Modification 2 of Embodiment 1.
Figure 10B:
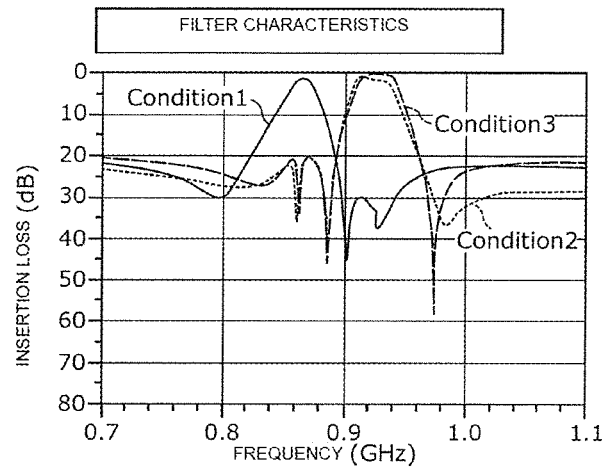
FIG. 10B is a graph illustrating the filter characteristics of the filter.

FIG. 10A is a circuit diagram of a filter 13C according to Example Configuration 3 of this modification. FIG. 10B is a graph illustrating the filter characteristics of the filter 13C according to Example Configuration 3 of this modification.

As illustrated in FIG. 10A, the filter 13C includes, as an additional element, the impedance element Z13 illustrated in FIG. 5A, and includes, as an additional switch, a switch SW13 connected in series with the impedance element Z11 between the first node N11 and the second node N12. With this configuration, as illustrated in FIG. 10B, similarly to the filter 13A, the filter 13C can form three filter characteristics by turning on and off the switches SW11 to SW13, and can thus support three bands.

[1-6-4. Example Configuration 4]

Figure 11A:
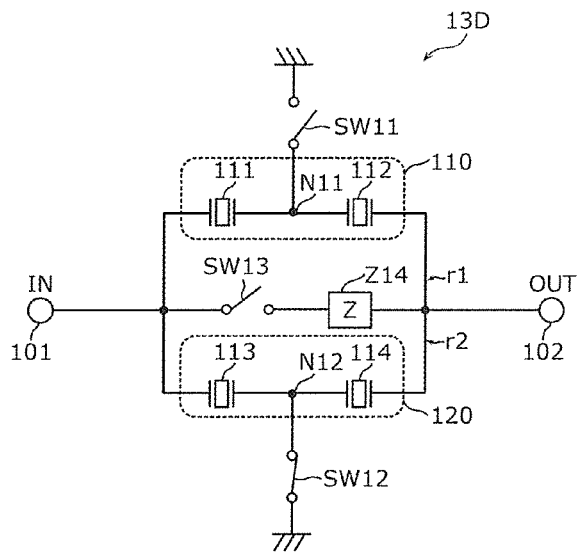
FIG. 11A is a circuit diagram of a filter according to Example Configuration 4 of Modification 2 of Embodiment 1.
Figure 11B:
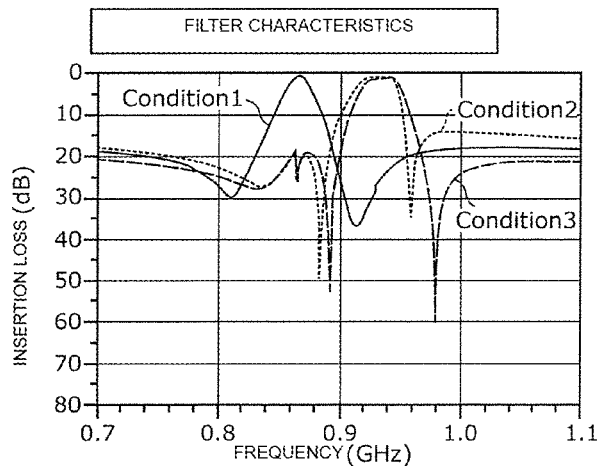
FIG. 11B is a graph illustrating the filter characteristics of the filter.

FIG. 11A is a circuit diagram of a filter 13D according to Example Configuration 4 of this modification. FIG. 11B is a graph illustrating the filter characteristics of the filter 13D according to Example Configuration 4 of this modification.

As illustrated in FIG. 11A, the filter 13D includes, as an additional element, the impedance element Z14 illustrated in FIG. 6A, and includes, as an additional switch, a switch SW13 connected in series with the impedance element Z14. That is, in this example configuration, the first resonant circuit 110, the second resonant circuit 120, and a series-connected circuit of the impedance element Z14 and the switch SW13 are connected in parallel. With this configuration, as illustrated in FIG. 11B, similarly to the filter 13A, the filter 13D can form three filter characteristics by turning on and off the switches SW11 to SW13, and can thus support three bands.

[1-6-5. Example Configuration 5]

When the switch SW13 (additional switch) and an additional element are connected in series, the connection order is not limited to any specific one. This will be described with reference to Example Configuration 5 in which the connection order of the switch SW13 and the impedance element Z11 is opposite to that according to Example Configuration 1.

Figure 12A:
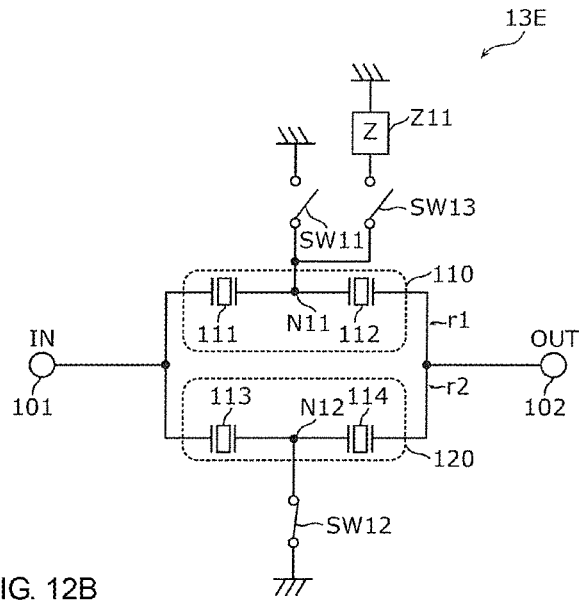
FIG. 12A is a circuit diagram of a filter according to Example Configuration 5 of Modification 2 of Embodiment 1.
Figure 12B:
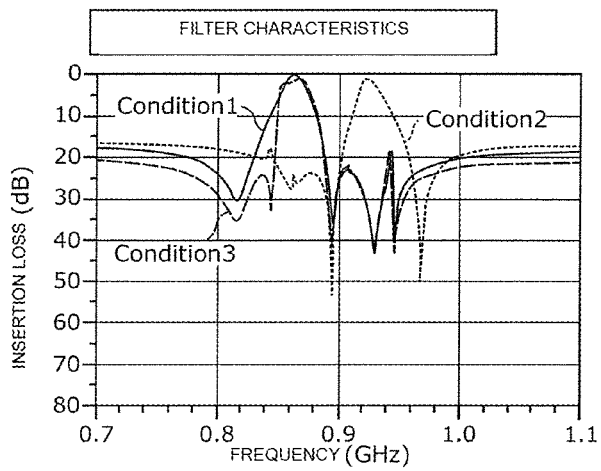
FIG. 12B is a graph illustrating the filter characteristics of the filter.

FIG. 12A is a circuit diagram of a filter 13E according to Example Configuration 5 of this modification. FIG. 12B is a graph illustrating the filter characteristics of the filter 13E according to Example Configuration 5 of this modification.

The filter 13E illustrated in FIG. 12A is different from the filter 13A illustrated in FIG. 8A only in the connection order of the switch SW13 and the impedance element Z11 (additional element). Specifically, in this configuration, the switch SW13 is connected between the first node N11 and the impedance element Z11.

As is apparent from the comparison between FIG. 12B and FIG. 8B, the filter 13E having the configuration described above can also form the same three filter characteristics as those of the filter 13A.

Modification 3 of Embodiment 1

The filters according to Embodiment 1 and the modifications thereof described above form two filter characteristics whose pass bands do not overlap with steep attenuation slopes from the pass bands to the attenuation bands partially overlapping with each other. Accordingly, the filters are suitable for use as a tunable filter supporting two bands whose frequency ranges do not overlap, with the gap between the frequency ranges being less than, for example, 50 MHz.

That is, due to the structural and material factors of an acoustic wave resonator, there is a limitation on the lower limit and upper limit of a band of the acoustic wave resonator (difference frequency between a resonant point and an anti-resonant point). For this reason, the filter 11 is used as a tunable filter supporting two bands having the relationship described above, thereby suppressing the attenuation floating around a pass band (e.g., the range of 0 MHz or more and 30 MHz or less from the end of the pass band) to ensure sufficient attenuation, while suppressing the attenuation floating in the counterpart band (when the filter 11 is tuned to one of the two bands, the other band) to ensure sufficient attenuation.

In this modification, such a filter will be described with reference to Example Configurations 1 to 3. The filter according to this modification is configured such that filters, each of which is any of the filters described in Embodiment 1 and Modifications 1 and 2 thereof described above, are cascade-connected (connected in cascade) in a plurality of stages.

With this configuration, the filter according to this modification is capable of more finely adjusting the bandpass characteristics (filter characteristics) of the entire filter. Accordingly, the switches in each stage are switched as appropriate to meet the required specifications, thereby enabling the desired band to be supported. In addition, in the filter according to this modification, filters, each of which is any of the filters according to Embodiment 1 and Modifications 1 and 2 thereof described above, are cascade-connected in a plurality of stages. This can improve the attenuation in the attenuation band.

Instead of a plurality of stages of filters, a single stage may be used. The number of stages of filters may be determined as appropriate to meet the required specifications or the like.

[1-7-1. Example Configuration 1]

Figure 13A:
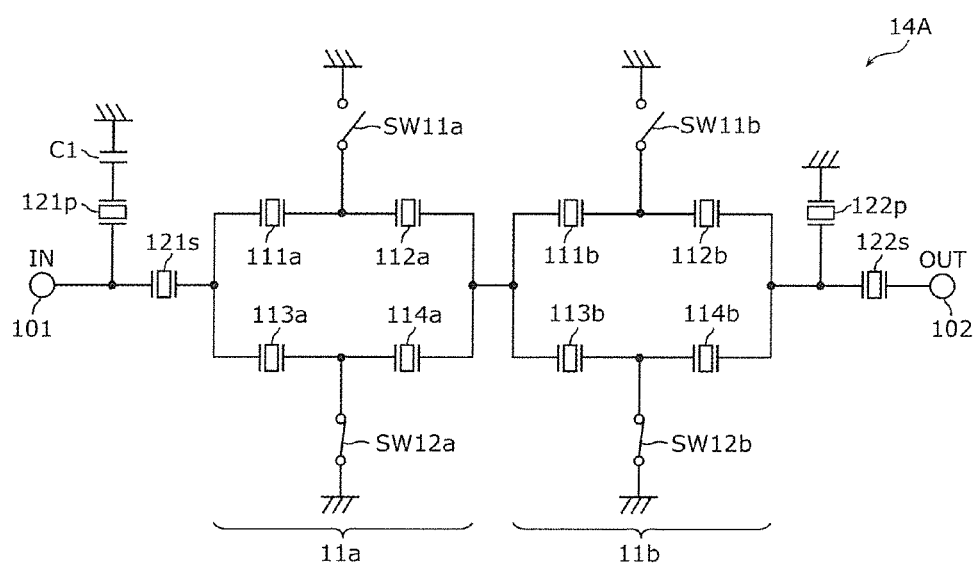
FIG. 13A is a circuit diagram of a filter according to Example Configuration 1 of Modification 3 of Embodiment 1.

FIG. 13A is a circuit diagram of a filter 14A according to Example Configuration 1 of this modification.

The filter 14A illustrated in FIG. 13A includes a filter structure 11a in the initial stage including switches SW11a and SW12a and resonators 111a to 114a, and a filter structure 11b in the subsequent stage including switches SW11b and SW12b and resonators 111b to 114b. Each of the filter structure 11a in the initial stage and the filter structure 11b in the subsequent stage corresponds to the filter 11 according to Embodiment 1 described above. That is, the filter 14A has two stages of filter structures.

The filter 14A further includes, between the IN terminal 101 and the filter structure 11a in the initial stage, a series-arm resonator 121s, a parallel-arm resonator 121p, and a capacitor C1 connected in series with the parallel-arm resonator 121p. The filter 14A further includes, between the filter structure 11b in the subsequent stage and the OUT terminal 102, a series-arm resonator 122s and a parallel-arm resonator 122p.

The filter 14A having the configuration described above can be used as a filter supporting, for example, LTE (Long Term Evolution) and supporting a plurality of bands (frequency ranges) specified by 3GPP (Third Generation Partnership Project). That is, the filter 14A is configured as, for example, a tunable filter that adjusts the constants of the elements thereof as appropriate, thereby supporting the transmission band of Band 5 and the transmission band of Band 8 or supporting the reception band of Band 5 and the reception band of Band 8.

Figure 13B:
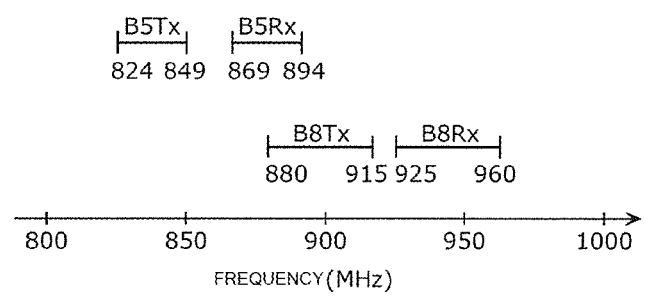
FIG. 13B is a diagram illustrating the frequency ranges assigned to Band 5 and Band 8.

FIG. 13B is a diagram illustrating the frequency ranges assigned to Band 5 and Band 8 in Example Configuration 1 of this modification. In FIG. 13B, the reception band (Rx band) or the transmission band (Tx band) of each band are simply represented using the name of the band followed by a symbol representing the reception band or the transmission band. For example, the reception band of Band 26 is represented as "B26Rx". The same applies to the following diagrams.

Figure 13C:
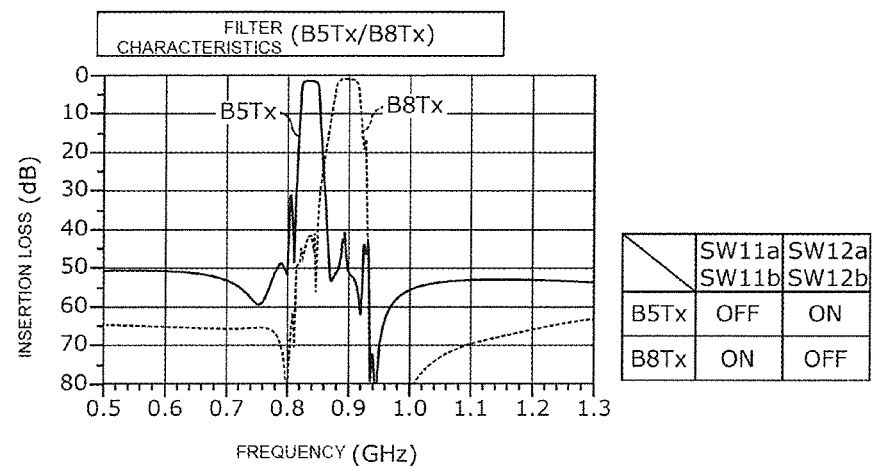
FIG. 13C is a graph illustrating the example filter characteristics of the filter.
Figure 13D:
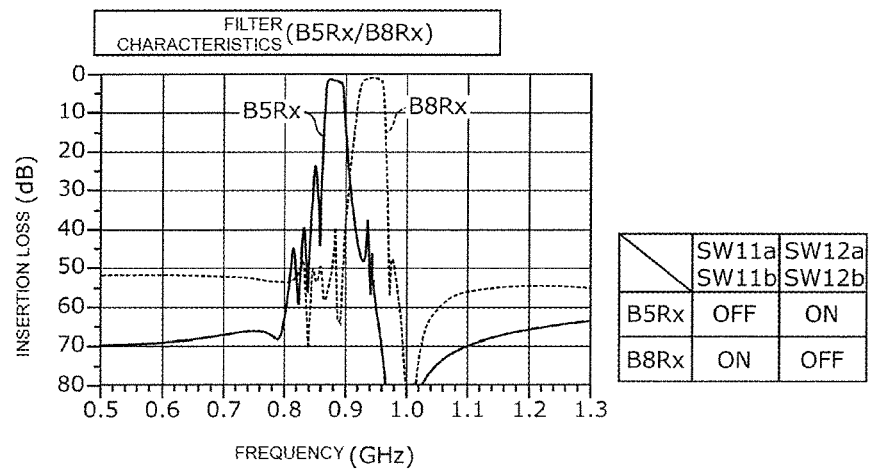
FIG. 13D is a graph illustrating the other example filter characteristics of the filter.

FIG. 13C is a graph illustrating the example filter characteristics of the filter 14A according to Example Configuration 1 of this modification. FIG. 13D is a graph illustrating the other example filter characteristics of the filter 14A according to Example Configuration 1 of this modification. Specifically, FIG. 13C illustrates the filter characteristics of the filter 14A configured as a tunable filter supporting the transmission band of Band 5 and the transmission band of Band 8, and FIG. 13D illustrates the filter characteristics of the filter 14A configured as a tunable filter supporting the reception band of Band 5 and the reception band of Band 8.

As illustrated in these figures, the filter 14A can support Band 5 by turning off the switches SW11a and SW11b and turning on the switches SW12a and SW12b, and support Band 8 by turning on the switches SW11a and SW11b and turning off the switches SW12a and SW12b.

The filter 14A having the configuration described above can constitute a more compact tunable filter than a configuration including the filters individually supporting Band 5 and Band 8.

Figures 14A, 14B:
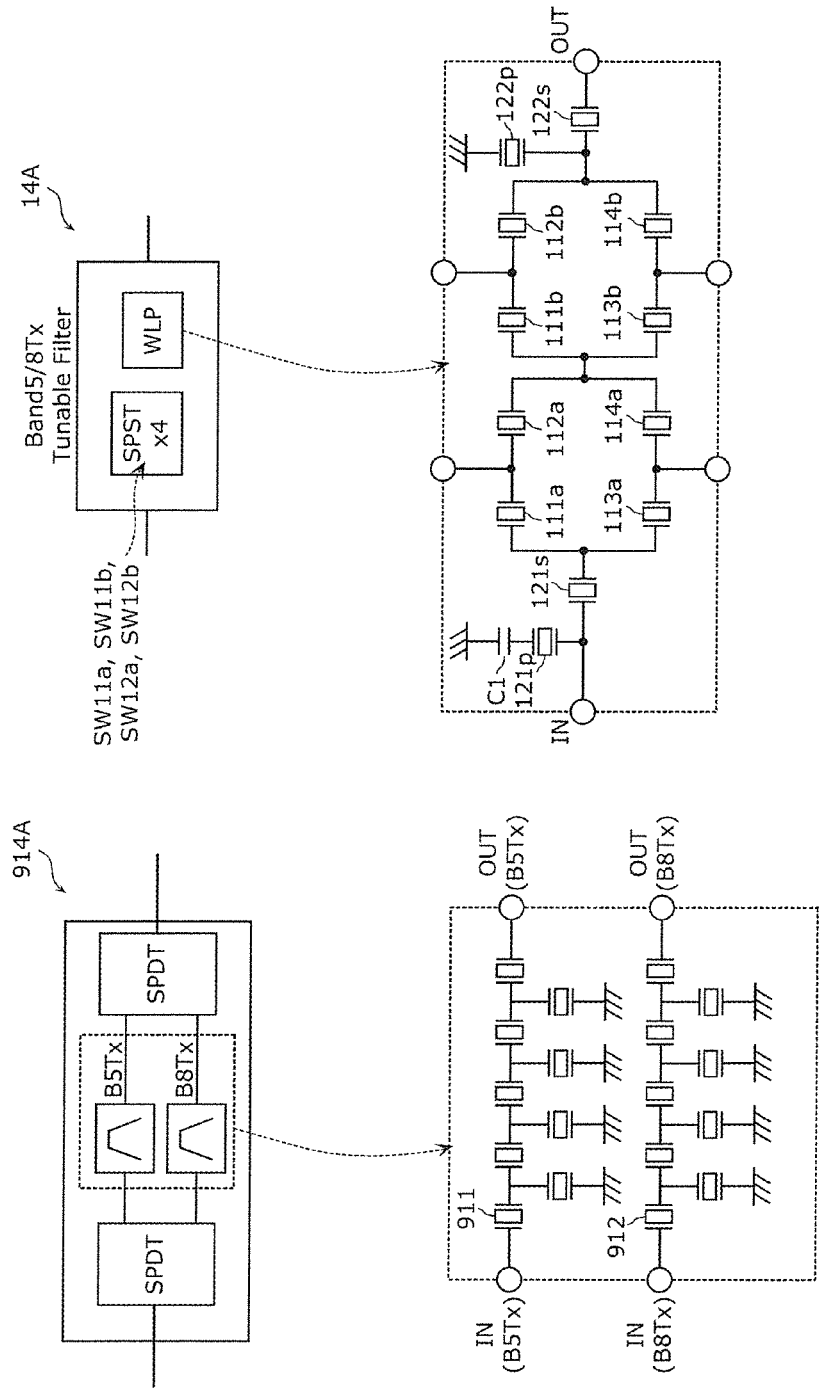
FIG. 14A is a diagram schematically illustrating the structure of the filter.
FIG. 14B is a diagram schematically illustrating the structure of a filter according to a comparative example of the filter.

FIG. 14A is a diagram schematically illustrating the structure of the filter 14A (tunable filter) according to Example Configuration 1 of this modification. FIG. 14B is a diagram schematically illustrating the structure of a filter 914A according to a comparative example of the filter 14A. In FIG. 14B, for simplicity of illustration, some portions are illustrated functionally rather than structurally.

As illustrated in FIG. 14A, the filter 14A according to this example configuration is constituted by, for example, a switch IC having four switches (the switches SW11a, SW11b, SW12a, and SW12b), each of which is an SPST-type switch, and a WLP (Wafer Level Package) substrate with piezoelectric properties, for example, having 12 resonators or the like constituting the filter 14A, except the four switches.

In contrast, as illustrated in FIG. 14B, the filter 914A according to the comparative example is constituted by, for example, a WLP substrate with piezoelectric properties that constitutes filters individually supporting Band 5 (here, B5Tx) and Band 8 (here, B8Tx), and a switch IC having two SPDT type switches that switch between these two filters. Specifically, the substrate with piezoelectric properties has nine resonators 911 constituting the filter supporting Band 5 and nine resonators 912 constituting the filter supporting Band 8 in order to achieve filter characteristics equivalent to the filter characteristics illustrated in FIG. 13C and FIG. 13D.

That is, the comparative example requires 18 resonators on the substrate with piezoelectric properties, whereas, this example configuration only requires 12 resonators on the substrate with piezoelectric properties to realize similar characteristics. Accordingly, this example configuration can reduce the number of elements of resonators, which is a large factor that hinders size reduction, compared with the comparative example, and can provide a compact tunable filter.

[1-7-2. Example Configuration 2]

Figure 15A:
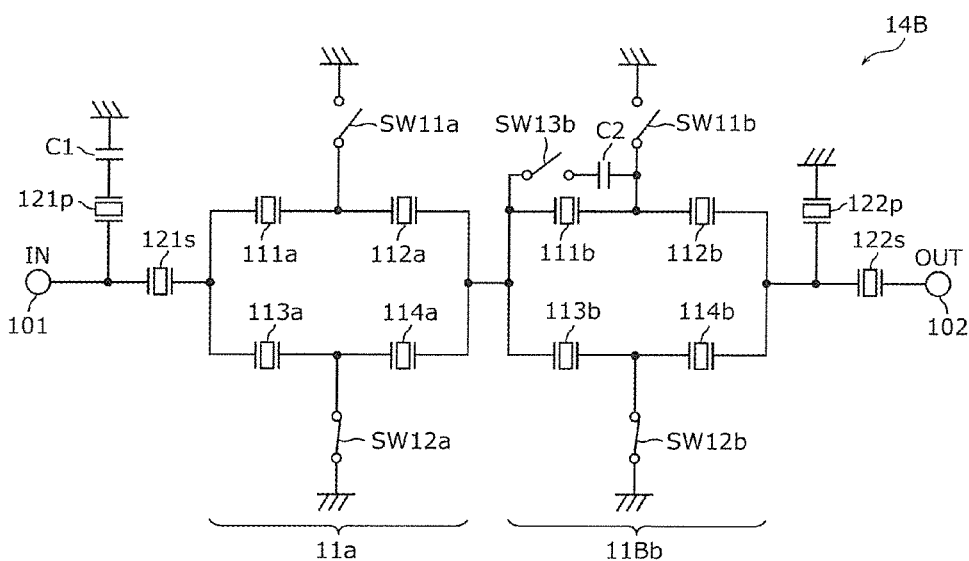
FIG. 15A is a circuit diagram of a filter according to Example Configuration 2 of Modification 3 of Embodiment 1.

FIG. 15A is a circuit diagram of a filter 14B according to Example Configuration 2 of this modification.

Unlike the filter 14A, the filter 14B illustrated in FIG. 15A includes a filter structure 11Bb in the subsequent stage, which corresponds to the filter 13B according to Example Configuration 2 of Modification 2 of Embodiment 1 described above. Specifically, the filter structure 11Bb in the subsequent stage includes a capacitor C2 as the impedance element Z11 described above.

The filter 14B having the configuration described above is configured as, for example, a tunable filter that adjusts the constants of the elements thereof as appropriate, thereby supporting the transmission band of Band 5, the transmission band of Band 8, and the transmission band of Band 18 or supporting the reception band of Band 5, the reception band of Band 8, and the reception band of Band 18.

Figure 15B:
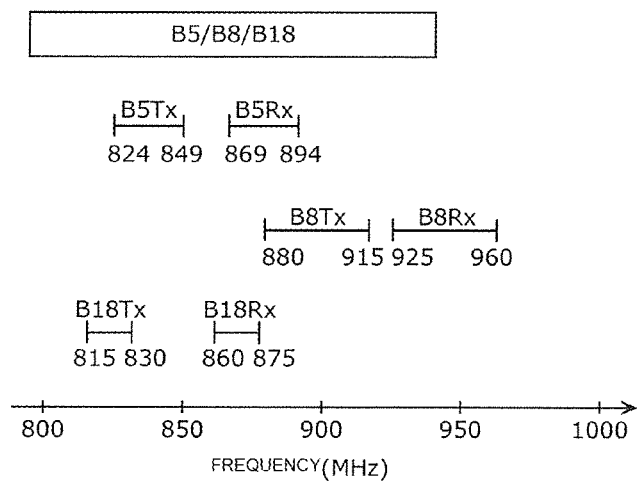
FIG. 15B is a diagram illustrating the frequency ranges assigned to Band 5, Band 8, and Band 18.

FIG. 15B is a diagram illustrating the frequency ranges assigned to Band 5, Band 8, and Band 18 in Example Configuration 2 of this modification.

Figure 15C:
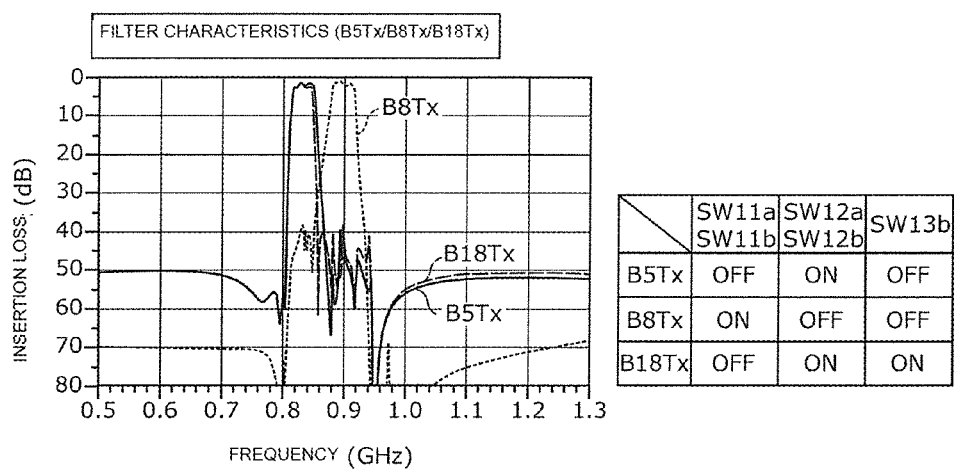
FIG. 15C is a graph illustrating the example filter characteristics of the filter.
Figure 15D:
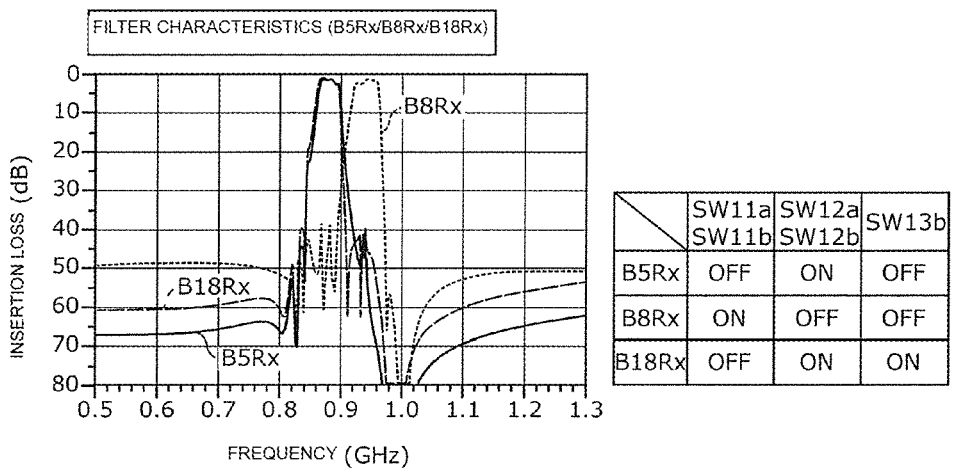
FIG. 15D is a graph illustrating the other example filter characteristics of the filter.

FIG. 15C is a graph illustrating the example filter characteristics of the filter 14B according to Example Configuration 2 of this modification. FIG. 15D is a graph illustrating the other example filter characteristics of the filter 14B according to Example Configuration 1 of this modification. Specifically, FIG. 15C illustrates the filter characteristics of the filter 14B configured as a tunable filter supporting the transmission band of Band 5, the transmission band of Band 8, and the transmission band of Band 18, and FIG. 15D illustrates the filter characteristics of the filter 14B configured as a tunable filter supporting the reception band of Band 5, the reception band of Band 8, and the reception band of Band 18.

As illustrated in these figures, the filter 14B can support Band 5 by turning off the switches SW11a, SW11b, and SW13b and turning on the switches SW12a and SW12b, and support Band 8 by turning on the switches SW11a and SW11b and turning off the switches SW12a, SW12b, and SW13b. The filter 14B can further support Band 18 by turning off the switches SW11a and SW11b and turning on the switches SW12a, SW12b, and SW13b.

The filter 14B having the configuration described above can be applied to a radio-frequency front-end circuit, a communication apparatus, and the like. Instead of the filter 14B, the filters according to the embodiment and the modifications described above or the filters according to embodiments and modifications described below can also be applied to a radio-frequency front-end circuit, a communication apparatus, and the like.

Figure 16A:
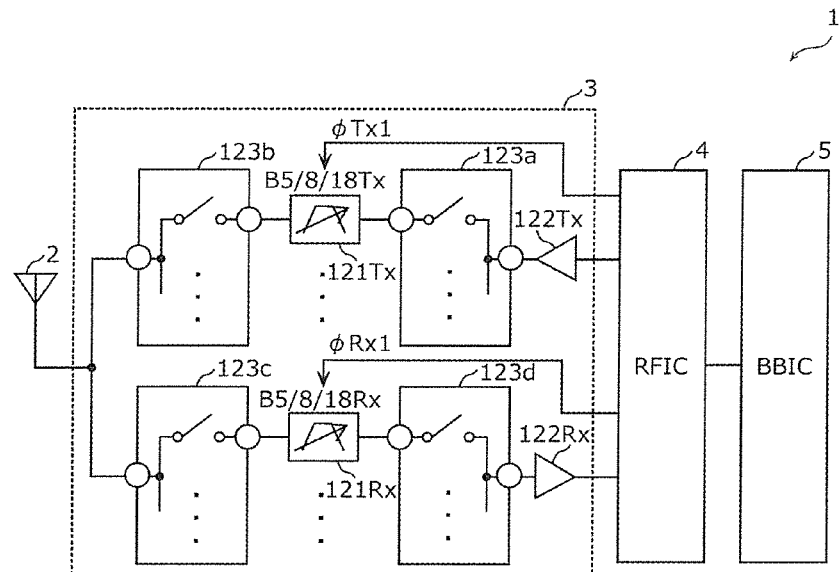
FIG. 16A is a configuration diagram of a communication apparatus according to Example Configuration 2 of Modification 3 of Embodiment 1.

FIG. 16A is a configuration diagram of a communication apparatus 1 according to Example Configuration 2 of this modification.

As illustrated in FIG. 16A, the communication apparatus 1 includes an antenna element 2, a radio-frequency front-end circuit 3, an RF signal processing circuit (RFIC) 4, and a baseband signal processing circuit (BBIC: Baseband Integrated Circuit) 5.

The antenna element 2 is a multi-band antenna that transmits or receives a radio-frequency signal. The antenna element 2 may be contained in the communication apparatus 1.

The RFIC 4 is an RF signal processing circuit that processes a radio-frequency signal transmitted or received by the antenna element 2. Specifically, the RFIC 4 performs signal processing on a radio-frequency reception signal inputted from the antenna element 2 via a reception-side signal path of the radio-frequency front-end circuit 3 by using down-conversion or the like, and outputs a low-frequency reception signal, which is generated as a result of the signal processing, to the baseband signal processing circuit 5. Further, the RFIC 4 performs signal processing on a low-frequency transmission signal inputted from the baseband signal processing circuit 5 by using up-conversion or the like, and outputs a radio-frequency transmission signal, which is generated as a result of the signal processing, to a transmission-side signal path of the radio-frequency front-end circuit 3.

The baseband signal processing circuit 5 is a circuit that performs signal processing using a low-frequency signal (such as a baseband signal or an IF (Intermediate Frequency) signal) having a lower frequency than a radio-frequency signal in the radio-frequency front-end circuit 3. For example, the baseband signal processing circuit 5 performs signal processing on a low-frequency reception signal inputted from the RFIC 4 to generate an audio signal, an image signal, or the like. Further, for example, the baseband signal processing circuit 5 performs signal processing on an input audio signal, image signal, or the like to generate a low-frequency transmission signal which is then outputted to the RFIC 4.

The radio-frequency front-end circuit 3 is a circuit that transmits a radio-frequency signal between the antenna element 2 and the RFIC 4. Specifically, the radio-frequency front-end circuit 3 transmits a radio-frequency transmission signal outputted from the RFIC 4 to the antenna element 2 via the transmission-side signal path. Further, the radio-frequency front-end circuit 3 transmits a radio-frequency reception signal received at the antenna element 2 to the RFIC 4 via the reception-side signal path.

Specifically, the radio-frequency front-end circuit 3 includes a transmit filter 121Tx, a receive filter 121Rx, a transmit amplifier circuit 122Tx such as a power amplifier, a receive amplifier circuit 122Rx such as a low noise amplifier, and switches 123a to 123d.

The transmit filter 121Tx corresponds to the filter 14B, which is configured to support the transmission band of Band 5, the transmission band of Band 8, and the transmission band of Band 18. The transmit filter 121Tx switches between the filter characteristics in accordance with a control signal φTx1 from a control unit (here, the RFIC 4) to switch the bands to be supported.

The receive filter 121Rx corresponds to the filter 14B, which is configured to support the reception band of Band 5, the reception band of Band 8, and the reception band of Band 18. The receive filter 121Rx switches between the filter characteristics in accordance with a control signal φRx1 from the control unit (here, the RFIC 4) to switch the bands to be supported.

The communication apparatus 1 having the configuration described above can be made more compact than that having a configuration according to the following comparative example including the filters individually supporting Band 5, Band 8, and Band 18.

Figure 16B:
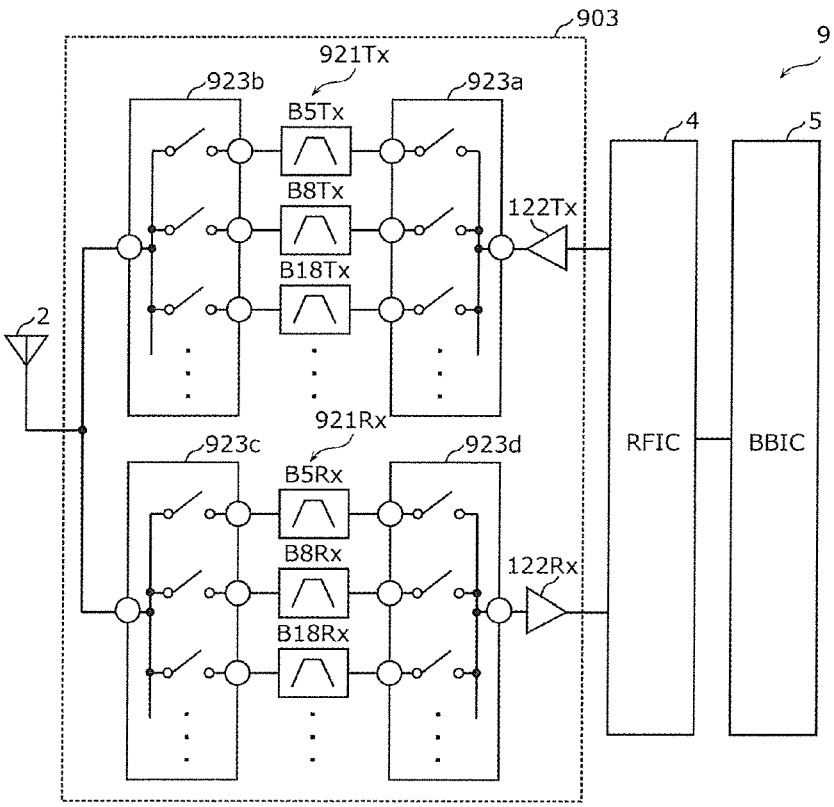
FIG. 16B is a configuration diagram of a communication apparatus according to a comparative example of the communication apparatus.

FIG. 16B is a configuration diagram of a communication apparatus 9 according to a comparative example of the communication apparatus 1.

Unlike the communication apparatus 1, the communication apparatus 9 illustrated in FIG. 16B includes a transmit filter group 921Tx and a receive filter group 921Rx, which are respectively constituted by a plurality of transmit filters and a plurality of receive filters individually supporting the respective bands. The communication apparatus 9 further includes switches 923a to 923d containing more elements accordingly. Thus, there is a limitation on the compactness of the communication apparatus 9.

Unlike the communication apparatus 9, the communication apparatus 1, which includes the compact multi-band transmit filter 121Tx and receive filter 121Rx, can be made compact. Furthermore, in the communication apparatus 1, the number of elements of the switches 123a to 123d connected to the transmit filter 121Tx and the receive filter 121Rx can be smaller than that in the communication apparatus 9. The communication apparatus 1 can thus be made further compact. These advantages are also achieved by the radio-frequency front-end circuit 3, when compared with a radio-frequency front-end circuit 903.

[1-7-3. Example Configuration 3]

The technique described above is applicable not only to a filter supporting a plurality of bands specified by 3GPP but also to, for example, a filter supporting a plurality of bands for which different bands (frequency ranges) are assigned to different regions, like an ISM (Industry Science Medical) band. In this example configuration, such a filter having a configuration supporting the 900 MHz band in the ISM band (hereinafter, ISM 900) will be described, by way of example.

Figure 17A:
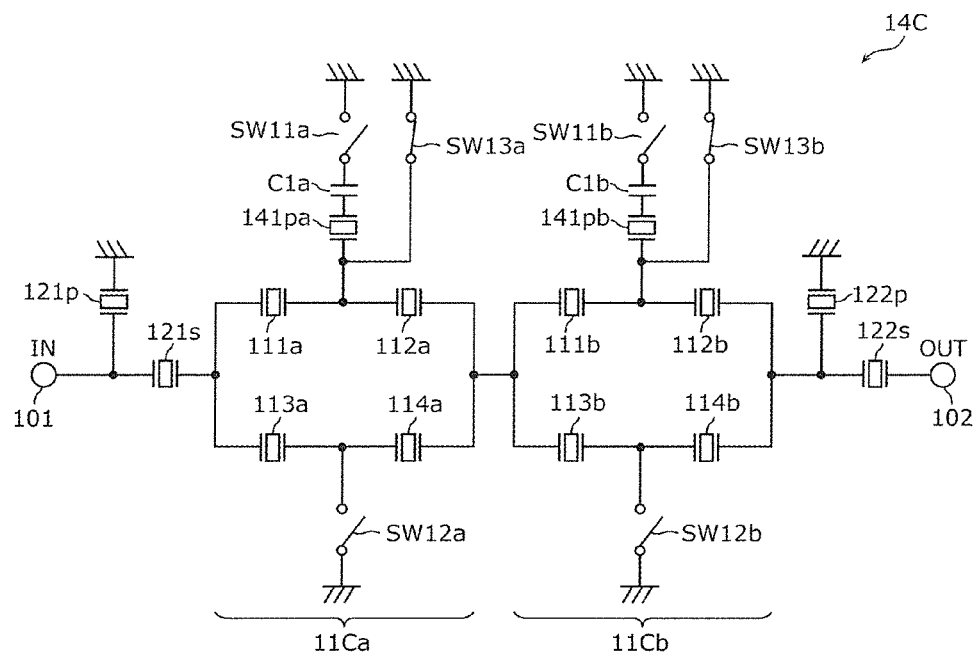
FIG. 17A is a circuit diagram of a filter according to Example Configuration 3 of Modification 3 of Embodiment 1.

FIG. 17A is a circuit diagram of a filter 14C according to Example Configuration 3 of this modification.

Unlike the filter 14A, the filter 14C illustrated in FIG. 17A does not include the capacitor C1, but includes a filter structure 11Ca in the preceding stage and a filter structure 11Cb in the subsequent stage, each of which corresponds to the filter 13A according to Example Configuration 1 of Modification 2 of Embodiment 1 described above. Specifically, the filter structure 11Ca in the preceding stage includes, as the impedance element Z11 described above, a series-connected circuit of a parallel-arm resonator 141pa and a capacitor C1a, and the filter structure 11Cb in the subsequent stage includes, as the impedance element Z11 described above, a series-connected circuit of a parallel-arm resonator 141pb and a capacitor C1b.

The filter 14C having the configuration described above is configured as a tunable filter that adjusts the constants of the elements thereof as appropriate, thereby supporting, for the ISM 900, for example, the communication band for Europe (EU), the communication band for the United States (US), and the communication band for Republic of Korea (KR).

Figure 17B:
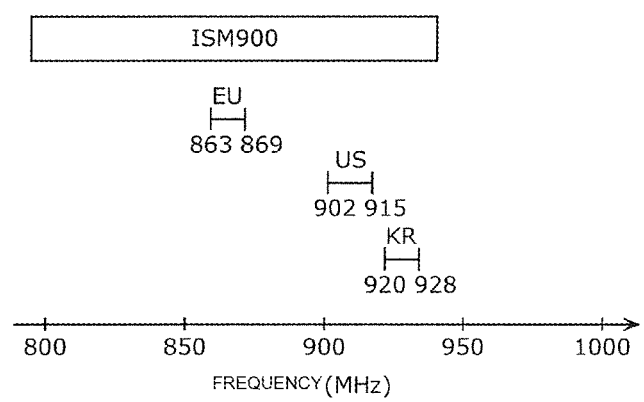
FIG. 17B is a diagram illustrating the ISM 900 frequency ranges assigned to EU, US, and KR.

FIG. 17B is a diagram illustrating the ISM 900 frequency ranges assigned to EU, US, and KR in to Example Configuration 3 of this modification.

Figure 17C:
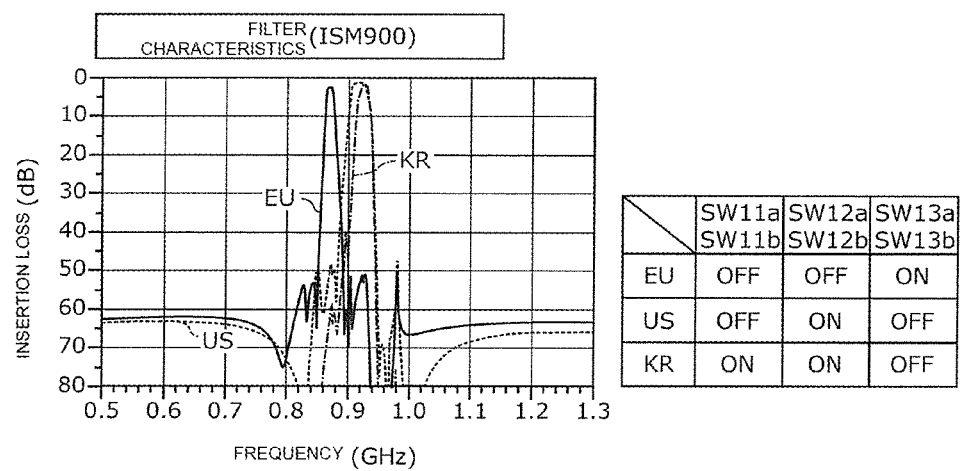
FIG. 17C is a graph illustrating the filter characteristics of the filter.

FIG. 17C is a graph illustrating the filter characteristics of the filter 14C according to Example Configuration 3 of this modification.

As illustrated in FIG. 17C, the filter 14C supports the band for EU by turning off the switches SW11a, SW11b, SW12a, and SW12b and turning on the switches SW13a and SW13b. Further, the filter 14C can support the band for US by turning off the switches SW11a, SW11b, SW13a, and SW13b and turning on the switches SW12a and SW12b. Further, the filter 14C can support the band for KR by turning on the switches SW11a, SW11b, SW12a, and SW12b and turning off the switches SW13a and SW13b.

A radio-frequency front-end circuit and a communication apparatus including the filter 14C having the configuration described above can achieve a configuration in which the communication band is optimized for the destination with a simple circuit configuration.

Figure 18A:
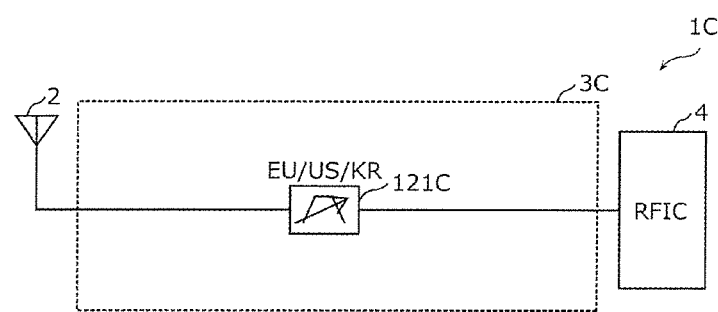
FIG. 18A is a configuration diagram of a communication apparatus according to Example Configuration 3 of Modification 3 of Embodiment 1.
Figure 18B:
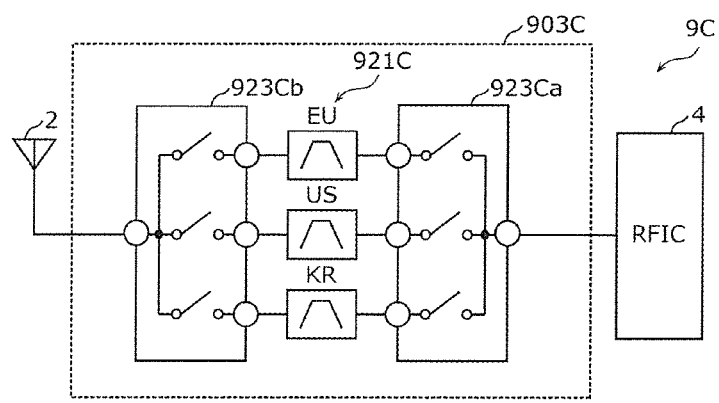
FIG. 18B is a configuration diagram of a communication apparatus according to a comparative example of the communication apparatus.

FIG. 18A is a configuration diagram of a communication apparatus 1C according to Example Configuration 3 of this modification. FIG. 18B is a configuration diagram of a communication apparatus 9C according to a comparative example. In these figures, for simplicity of illustration, a control line for switching between the bands of a filter 121C, which corresponds to the filter 14C, and elements of a transmit amplifier circuit, a receive amplifier circuit, and so on are not illustrated.

As is apparent from the comparison between FIG. 18A and FIG. 18B, the communication apparatus 1C, which includes the compact multi-band filter 121C, can be made more compact than the communication apparatus 9C, which includes a filter group 921C having a plurality of filters supporting the respective ISM 900 bands for the regions. Furthermore, unlike the communication apparatus 9C, the communication apparatus 1C does not include switches 923Ca and 923Cb connected to the filter group 921C and can thus be made further compact. These advantages are also achieved by a radio-frequency front-end circuit 3C, when compared with a radio-frequency front-end circuit 903C.

Embodiment 2

In Embodiment 1 and the modifications thereof described above, a switch or switches that switch conduction and non-conduction between the first path r1 and ground and between the second path r2 and ground are provided to interchange the positions of the series-arm resonant circuit and the parallel-arm resonant circuit. That is, in Embodiment 1 and the modifications thereof described above, a resonant circuit disposed in a path brought into conduction with ground by the switch among the first resonant circuit and the second resonant circuit serves as a parallel-arm resonant circuit, and the other resonant circuit serves as a series-arm resonant circuit.

In this embodiment, in contrast, a switch or switches that switch conduction and non-conduction between the first resonant circuit and the OUT terminal 102 and between the second resonant circuit and the OUT terminal 102 in the first path r1 and the second path r2 are provided to interchange the positions of the series-arm resonant circuit and the parallel-arm resonant circuit. That is, in this embodiment, a resonant circuit brought into conduction with the OUT terminal 102 by the switch among the first resonant circuit and the second resonant circuit serves as a series-arm resonant circuit, and the other resonant circuit serves as a parallel-arm resonant circuit.

[2-1. Configuration]

Figure 19A:
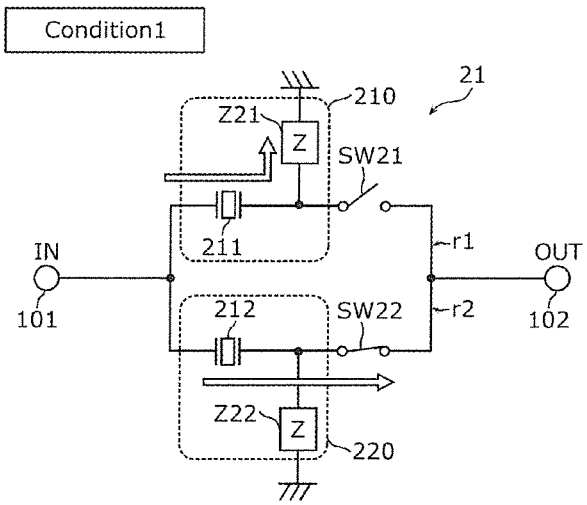
FIGS. 19A and 19B include circuit diagrams of a filter according to Embodiment 2.
Figure 19B:
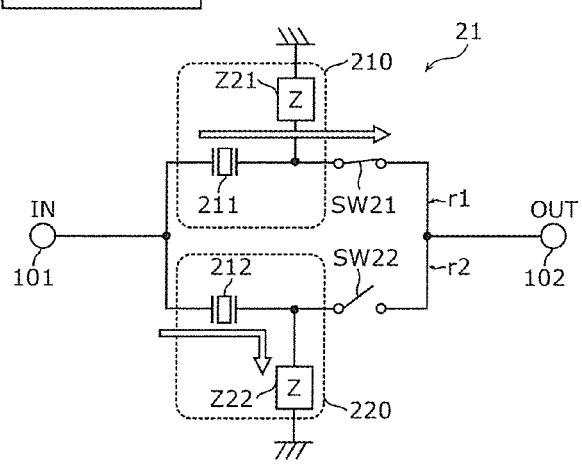

FIGS. 19A and 19B include circuit diagrams of a filter 21 according to this embodiment. Specifically, FIGS. 19A and 19B illustrate circuit diagrams in two states (Condition 1/2) in which switches SW21 and SW22 have different ON/OFF states. FIG. 19A is a circuit diagram in Condition 1, and FIG. 19B is a circuit diagram in Condition 2. FIGS. 19A and 19B also schematically illustrate radio-frequency signals that pass through the filter 21.

The filter 21 illustrated in FIGS. 19A and 19B is different from the filter 11 according to Embodiment 1 in a specific configuration of a first resonant circuit 210 disposed in the first path r1 and a second resonant circuit 220 disposed in the second path r2. Further, the filter 21 is different from the filter 11 in the connection of switches that switch between the two states.

In this embodiment, the first resonant circuit 210 includes a resonator 211 (first series-arm element) disposed in series in the first path r1, and an impedance element Z21 (first parallel-arm element) such as a capacitor that connects the first path r1 and ground to each other. Similarly to the first resonant circuit 110 according to Embodiment 1 described above, the first resonant circuit 210 has a first resonant frequency, and causes a radio-frequency signal of the first resonant frequency (i.e., a signal component of the first resonant frequency) included in the radio-frequency signal inputted to the IN terminal 101 to flow to the OUT terminal 102 or ground in accordance with the states (here, on and off) of the switches SW21 and SW22.

In this embodiment, the impedance element Z21 is connected closer to the OUT terminal 102 than the resonator 211. However, the impedance element Z21 may be connected closer to the IN terminal 101 than the resonator 211.

In this embodiment, the second resonant circuit 220 includes a resonator 212 (second series-arm element) disposed in series in the second path r2, and an impedance element Z22 (second parallel-arm element) such as a capacitor that connects the second path r2 and ground to each other. Similarly to the second resonant circuit 120 according to Embodiment 1 described above, the second resonant circuit 220 has a second resonant frequency different from the first resonant frequency, and causes a radio-frequency signal of the second resonant frequency (i.e., a signal component of the second resonant frequency) included in the radio-frequency signal inputted to the IN terminal 101 to flow to the OUT terminal 102 or ground in accordance with the states (here, on and off) of the switches SW21 and SW22.

In this embodiment, the impedance element Z22 is connected closer to the OUT terminal 102 than the resonator 212. However, the impedance element Z22 may be connected closer to the IN terminal 101 than the resonator 212.

The switches SW21 and SW22 are switches that are respectively connected to the first resonant circuit 210 and the second resonant circuit 220 and that switch between the Condition 1 and the Condition 2. In this embodiment, as illustrated in FIG. 19A, the Condition 1 is a state (i.e., a second state) in which a radio-frequency signal of the second resonant frequency is caused to flow from the IN terminal 101 (input terminal) to the OUT terminal 102 (output terminal) via the second resonant circuit 220 and a radio-frequency signal of the first resonant frequency is caused to flow from the IN terminal 101 to ground via the first resonant circuit 210. In this embodiment, as illustrated in FIG. 1B, the Condition 2 is a state (i.e., a first state) in which a radio-frequency signal of the first resonant frequency is caused to flow from the IN terminal 101 to the OUT terminal 102 via the first resonant circuit 210 and a radio-frequency signal of the second resonant frequency is caused to flow from the IN terminal 101 to ground via the second resonant circuit 220.

In this embodiment, in the Condition 1 (the second state), the switches SW21 and SW22 bring the first resonant circuit 210 and the OUT terminal 102 into non-conduction and bring the second resonant circuit 220 and the OUT terminal 102 into conduction. In the second state, accordingly, a path along which a radio-frequency signal travels from the IN terminal 101 to the OUT terminal 102 is the second path r2. In contrast, in the Condition 2 (the first state), the switches SW21 and SW22 bring the first resonant circuit 210 and the OUT terminal 102 into conduction and bring the second resonant circuit 220 and the OUT terminal 102 into non-conduction. In the first state, accordingly, the path described above is the first path r1.

Similarly to the switches SW11 and SW12 according to Embodiment 1 described above, the switches SW21 and SW22 are two SPST (Single-Pole, Single-Throw) type switches, each of which is exclusively turned on and off. Specifically, the switch SW21, which is arranged in the first path r1 between the first resonant circuit 210 and the OUT terminal 102, is turned on in the first state to bring the first resonant circuit 210 and the OUT terminal 102 into conduction, and is turned off in the second state to bring the first resonant circuit 210 and the OUT terminal 102 into non-conduction. The switch SW22, which is arranged in the second path r2 between the second resonant circuit 220 and the OUT terminal 102, is turned off in the first state to bring the second resonant circuit 220 and the OUT terminal 102 into non-conduction, and is turned on in the second state to bring the second resonant circuit 220 and the OUT terminal 102 into conduction.

The switches SW21 and SW22 may not necessarily be disposed between the first resonant circuit 210 and the OUT terminal 102 and between the second resonant circuit 220 and the OUT terminal 102, respectively, and may be disposed between the first resonant circuit 210 and the IN terminal 101 and between the second resonant circuit 220 and the IN terminal 101, respectively. Alternatively, one of the switch SW21 and the switch SW22 may be disposed between the corresponding one of the first resonant circuit 210 and the second resonant circuit 220 and the OUT terminal 102, and the other switch may be disposed between the other resonant circuit and the IN terminal 101.

[2-2. Operation]

In the filter 21 having the configuration described above, as in Embodiment 1 described above, the states (in this embodiment, on and off) of the switches SW21 and SW22 are switched in accordance with a control signal to interchange the positions of the series-arm resonant circuit and the parallel-arm resonant circuit.

Specifically, as illustrated in FIG. 19A, when the switch SW21 is off and the switch SW22 is on (the Condition 1), a series-arm resonant circuit is formed by the second resonant circuit 220 and a parallel-arm resonant circuit is formed by the first resonant circuit 210. In this case, in this embodiment, a ladder circuit is formed in which a single series-arm resonant circuit is formed by the resonator 212 and the impedance element Z22 and a single parallel-arm resonant circuit is formed by a series-connected circuit of the resonator 211 and the impedance element Z21.

In contrast, as illustrated in FIG. 19B, when the switch SW21 is on and the switch SW22 is off (the Condition 2), a series-arm resonant circuit is formed by the first resonant circuit 210 and a parallel-arm resonant circuit is formed by the second resonant circuit 220. In this case, in this embodiment, a ladder circuit is formed in which a single series-arm resonant circuit is formed by the resonator 211 and the impedance element Z21 and a single parallel-arm resonant circuit is formed by a series-connected circuit of the resonator 212 and the impedance element Z22.

[2-3. Characteristics]

Next, the filter characteristics (bandpass characteristics) of the filter 21, which are formed by the operation described above, will be described together with impedance characteristics that define the filter characteristics.

Figure 19C:
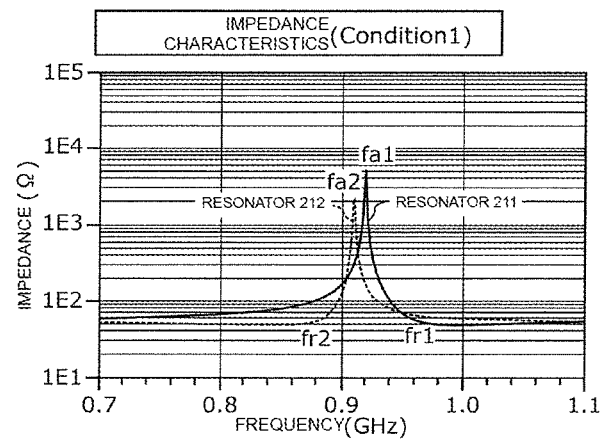
FIGS. 19C, 19D and 19E include graphs illustrating various characteristics of the filter according to Embodiment 2.
Figure 19D:
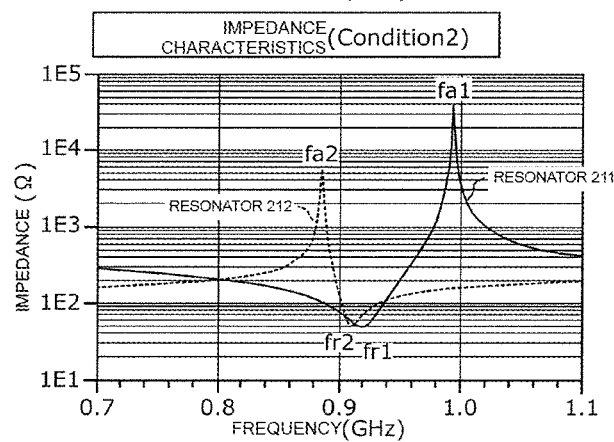
Figure 19E:
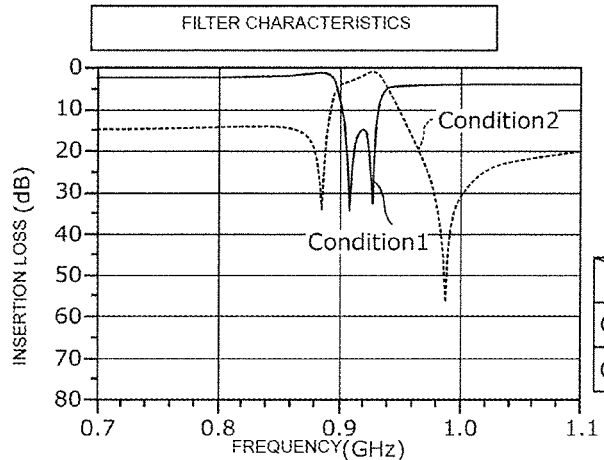

FIGS. 19C, 19D and 19E include graphs illustrating various characteristics of the filter 21. Specifically, FIG. 19C is a graph illustrating the impedance characteristics seen from the IN terminal 101 in the Condition 1, FIG. 19D is a graph illustrating the impedance characteristics seen from the IN terminal 101 in the Condition 2, and FIG. 19E is a graph illustrating the filter characteristics in the Conditions 1 and 2 for comparison.

As illustrated in FIGS. 19C, 19D and 19E, as in the embodiment described above, also in this embodiment, the frequencies at the resonant points fr1 and fr2 and the frequencies at the anti-resonant points fa1 and fa2 are interchanged in the Condition 1 and the Condition 2. Accordingly, as illustrated in FIG. 19E, the filter 21 can form two filter characteristics.

Specifically, the filter 21 forms a filter characteristic ("Condition 1" in FIG. 19E) in which, when seen from the IN terminal 101 in the Condition 1, a point at which the impedance of the resonator 211 (first series-arm element) reaches a local minimum (the resonant point fr1 in FIG. 19C) and a point at which the impedance of the resonator 212 (second series-arm element) reaches a local minimum (the resonant point fr2 in FIG. 19C) define a pass band and a point at which the impedance of the resonator 211 reaches a local maximum (the anti-resonant point fa1 in FIG. 19C) and a point at which the impedance of the resonator 212 reaches a local maximum (the anti-resonant point fa2 in FIG. 19C) define an attenuation band.

As illustrated in FIG. 19C, in the Condition 1, the frequencies at the resonant points fr1 and fr2 and the anti-resonant points fa1 and fa2 satisfy fr2<fa1<fr1 and fr2<fa2<fr1. Further, the impedances at frequencies lower than the resonant point fr2 and at frequencies higher than the resonant point fr1 are relatively low (e.g., less than 100Ω). Accordingly, a band elimination type filter characteristic (hereinafter, BEF-type filter characteristic) is formed at this time, which has an attenuation band having the points fa1 and fa2 as attenuation poles, a pass band including the point fr2 on the low-frequency side of the attenuation band, and a pass band including the point fr1 on the high-frequency side of the attenuation band.

In contrast, the filter 21 forms a filter characteristic ("Condition 2" in FIG. 19E) in which, when seen from the IN terminal 101 in the Condition 2, a point at which the impedance of the resonator 211 (first series-arm element) reaches a local minimum (the resonant point fr1 in FIG. 19D) and a point at which the impedance of the resonator 212 (second series-arm element) reaches a local minimum (the resonant point fr2 in FIG. 19D) define a pass band and a point at which the impedance of the resonator 211 reaches a local maximum (the anti-resonant point fa1 in FIG. 19D) and a point at which the impedance of the resonator 212 reaches a local maximum (the anti-resonant point fa2 in FIG. 19D) define an attenuation band.

As illustrated in FIG. 19D, in the Condition 2, the frequencies at the resonant points fr1 and fr2 and the anti-resonant points fa1 and fa2 satisfy fa2<fr1<fa1 and fa2<fr2<fa1. Further, the impedances at frequencies lower than the anti-resonant point fa2 and at frequencies higher than the anti-resonant point fa1 are relatively high (e.g., 100Ω or more). Accordingly, a BPF-type filter characteristic is formed at this time, which has a pass band including the points fr1 and fr2, an attenuation band having the point fa2 as an attenuation pole on the low-frequency side of the pass band, and an attenuation band having the point fa1 as an attenuation pole on the high-frequency side of the pass band.

The comparison between the two filter characteristics formed in the way described above ("Condition 1" and "Condition 2" in FIG. 19E) indicates the following.

A band that is a pass band in one filter characteristic is an attenuation band in the other filter characteristic, and a band that is an attenuation band in the one filter characteristic is a pass band in the other filter characteristic. Conversely, a band that is a pass band in the other filter characteristic is an attenuation band in the one filter characteristic, and a band that is an attenuation band in the other filter characteristic is a pass band in the one filter characteristic.

Specifically, in the Condition 1, a pass band is formed by the second resonant circuit 220 causing a radio-frequency signal of the second resonant frequency to flow from the IN terminal 101 to the OUT terminal 102, and an attenuation band is formed by the first resonant circuit 210 causing a radio-frequency signal of the first resonant frequency to flow from the IN terminal 101 to ground. In the Condition 2, in contrast, a pass band is formed by the first resonant circuit 210 causing a radio-frequency signal of the first resonant frequency to flow from the IN terminal 101 to the OUT terminal 102, and an attenuation band is formed by the second resonant circuit 220 causing a radio-frequency signal of the second resonant frequency to flow from the IN terminal 101 to ground.

That is, as in Embodiment 1 described above, the filter 21 according to this embodiment forms two filter characteristics in which the pass bands and the attenuation bands are interchanged by switching between the Condition 1 and the Condition 2 using the switches SW21 and SW22.

[2-4. Advantages, Etc.]

As described above, also in the filter 21 (filter device) according to this embodiment, in response to the switching of the switches SW21 and SW22, a series-arm resonant circuit disposed in a path (series arm) along which a radio-frequency signal travels from the IN terminal 101 (input terminal) to the OUT terminal 102 (output terminal) and a parallel-arm resonant circuit disposed in a path (parallel-arm) connecting the path described above and ground are interchanged in position. Accordingly, the filter 21 according to this embodiment can achieve advantages similar to those of Embodiment 1.

In the filter 21 according to this embodiment, furthermore, in the first state (in this embodiment, the Condition 2), the second resonant circuit 220 and one terminal among the IN terminal 101 and the OUT terminal 102 (in this embodiment, the OUT terminal 102) are brought into non-conduction, thereby preventing a radio-frequency signal of the second resonant frequency from being transmitted to the OUT terminal 102. In the second state (in this embodiment, the Condition 1), the first resonant circuit 210 and the one terminal described above are brought into non-conduction, thereby preventing a radio-frequency signal of the first resonant frequency from being transmitted to the OUT terminal 102. Accordingly, in both the first state and the second state, the attenuation in the attenuation band (in particular, the counterpart band) can be improved (increased).

In the filter 21 according to this embodiment, furthermore, the resonator 211 (first series-arm element) and the resonator 212 (second series-arm element) are each an acoustic wave resonator, and thus both the first filter characteristic (in this embodiment, "Condition 2" in FIG. 19E) and the second filter characteristic (in this embodiment, "Condition 1" in FIG. 19E) can implement filter characteristics with high steepness. Moreover, since the pass bands and the attenuation bands of the first filter characteristic and the second filter characteristic are specified in the way described above, the first filter characteristic and the second filter characteristic can implement, for example, BPF-type and BEF-type, two filter characteristics in which the pass bands and the attenuation bands are interchanged.

In this embodiment, the two SPST-type switches SW21 and SW22 have been described as switches that switch between the first state and the second state, by way of example. However, the switches may be constituted by a single SPDT type switch.

Figure 20A:
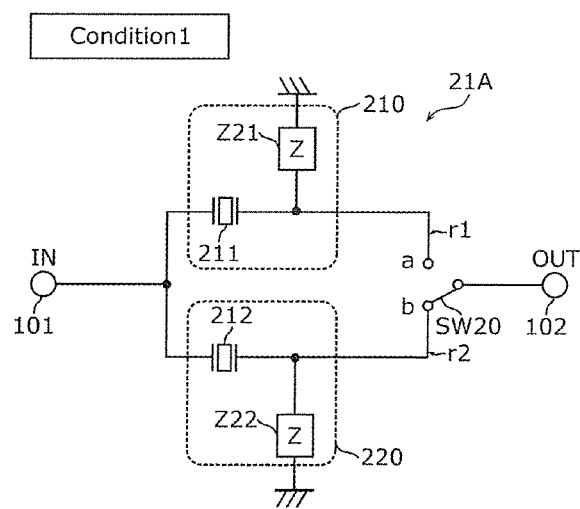
FIG. 20A is a circuit diagram of a filter including a switch according to a modification.
Figure 20B:
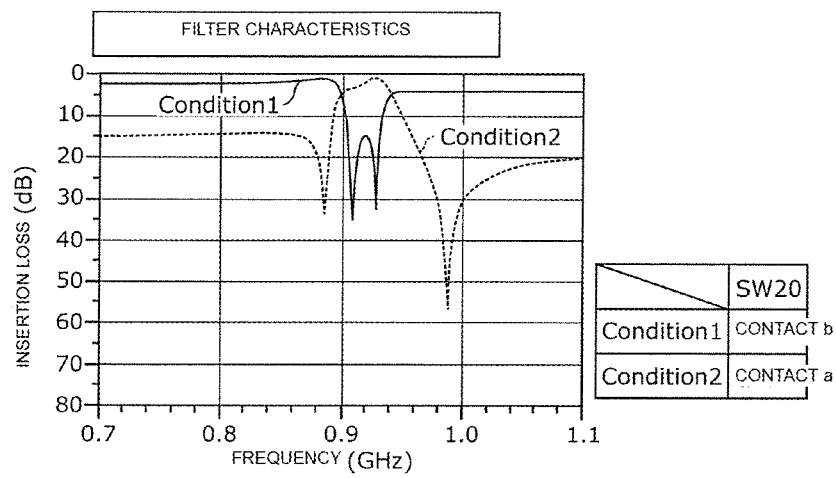
FIG. 20B is a graph illustrating the filter characteristics of the filter.

FIG. 20A is a circuit diagram of a filter 21A including a switch SW20. FIG. 20B is a graph illustrating the filter characteristics of the filter 21A.

The filter 11A illustrated in FIG. 2A includes the switch SW20, which has a first selection terminal (a contact a in FIG. 20A) connected to the first resonant circuit 210, a second selection terminal (a contact b in FIG. 20A) connected to the second resonant circuit 220, and a common terminal to be connected to one of the first selection terminal and the second selection terminal. Here, the first selection terminal is connected to the first resonant circuit 210 in the first path r1, the second selection terminal is connected to the second resonant circuit 220 in the second path r2, and the common terminal is connected to the OUT terminal 102.

In the filter 21A having the configuration described above, the common terminal is connected to the second selection terminal at the switch SW20, thereby achieving a state similar to the Condition 1 in Embodiment 2 described above. The common terminal is connected to the first selection terminal, thereby achieving a state similar to the Condition 1 in Embodiment 2 described above. The use of the switch SW20 can reduce the number of terminals to be required, compared with the use of the switches SW21 and SW22. Thus, the filter 21A can be made further compact as a whole.

Modification 1 of Embodiment 2

As in Modification 1 of Embodiment 1 in which the filter 11 according to Embodiment 1 is provided with an additional element, the filter 21 according to Embodiment 2 may be provided with an additional element. That is, an additional element may be provided, which is an impedance element connected in series or parallel with at least one of the plurality of impedance elements (in Embodiment 2 described above, the resonators 211 and 212 and the impedance elements Z21 and Z22) of the first resonant circuit 210 and the second resonant circuit 220. Accordingly, in at least one of the Condition 1 and the Condition 2, a filter characteristic different from that of the filter 21 can be formed. The following describes such a filter according to Modification 1 of Embodiment 2 with reference to Example Configurations 1 to 5.

In the graphs illustrating the filter characteristics according to this modification, described below, filter characteristics when a capacitor is provided as an additional element are illustrated, unless otherwise stated. However, the additional element is not limited to a capacitor and may be an inductor or an acoustic wave resonator. In the graphs illustrating the filter characteristics, the filter characteristics according to Embodiment 2 described above are also illustrated for comparison, with the filter characteristics according to this modification indicated by bold lines and the filter characteristics according to Embodiment 2 indicated by thin lines.

[2-5-1. Example Configuration 1]

Figure 21A:
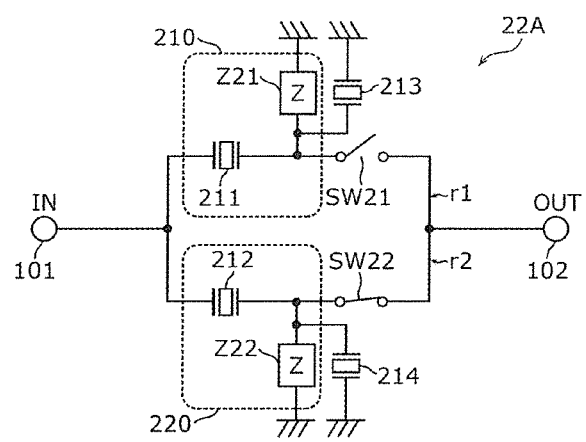
FIG. 21A is a circuit diagram of a filter according to Example Configuration 1 of Modification 1 of Embodiment 2.
Figure 21B:
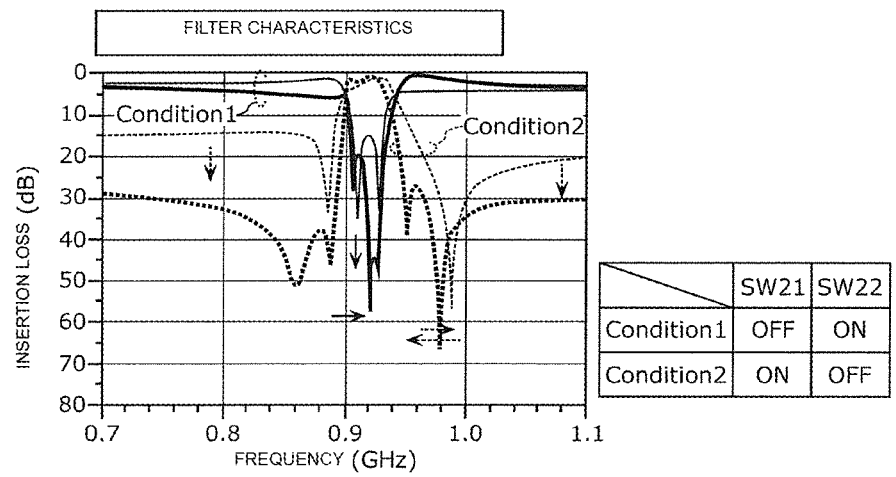
FIG. 21B is a graph illustrating the filter characteristics of the filter.

FIG. 21A is a circuit diagram of a filter 22A according to Example Configuration 1 of this modification. FIG. 21B is a graph illustrating the filter characteristics of the filter 22A according to Example Configuration 1 of this modification.

As illustrated in FIG. 21A, the filter 22A includes, as additional elements, a resonator 213 connected in parallel with the impedance element Z21 and a resonator 214 connected in parallel with the impedance element Z22. That is, the resonator 213 is connected in series with the resonator 211 between the IN terminal 101 and ground, and the resonator 214 is connected in series with the resonator 212 between the IN terminal 101 and ground.

With the additional elements described above, as illustrated in FIG. 21B, the filter 22A can shift the attenuation poles both in the Condition 1 and the Condition 2.

In this configuration, the additional elements (the resonators 213 and 214) are each an acoustic wave resonator. This can increase (improve) the attenuation in the attenuation band, providing the compact filter 22A capable of supporting multiple bands and having excellent attenuation characteristics.

In this example configuration, one of the resonators 213 and 214 is optional.

[2-5-2. Example Configuration 2]

Figure 22A:
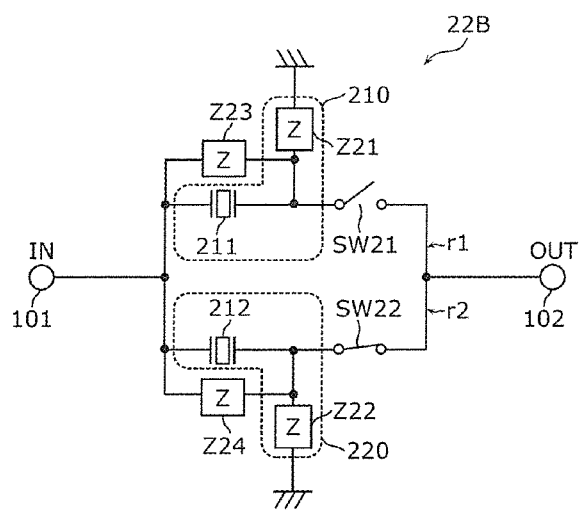
FIG. 22A is a circuit diagram of a filter according to Example Configuration 2 of Modification 1 of Embodiment 2.
Figure 22B:
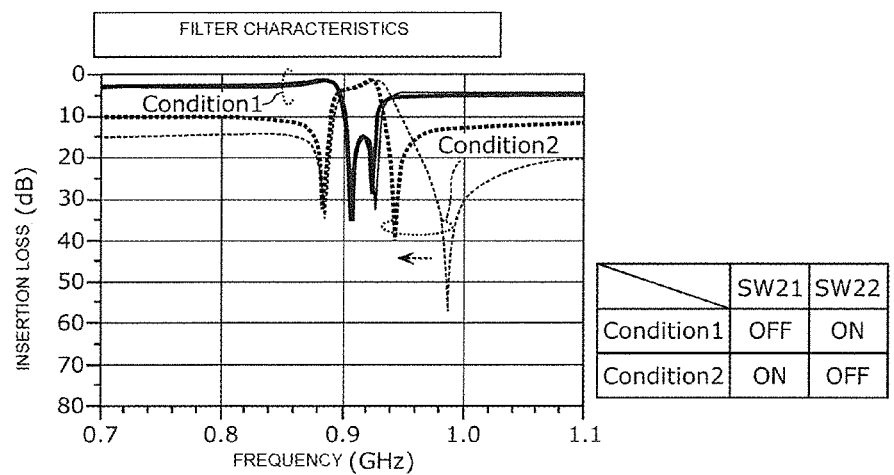
FIG. 22B is a graph illustrating the filter characteristics of the filter.

FIG. 22A is a circuit diagram of a filter 22B according to Example Configuration 2 of this modification. FIG. 22B is a graph illustrating the filter characteristics of the filter 22B according to Example Configuration 2 of this modification.

As illustrated in FIG. 22A, the filter 22B includes, as additional elements, an impedance element Z23 connected in parallel with the resonator 211 and an impedance element Z24 connected in parallel with the resonator 212. With the additional elements described above, as illustrated in FIG. 22B, the filter 22B greatly shifts the attenuation pole on the high-frequency side of the pass band to the low-frequency side in the Condition 2.

In this example configuration, one of the impedance elements Z23 and Z24 is optional.

[2-5-3. Example Configuration 3]

Figure 23A:
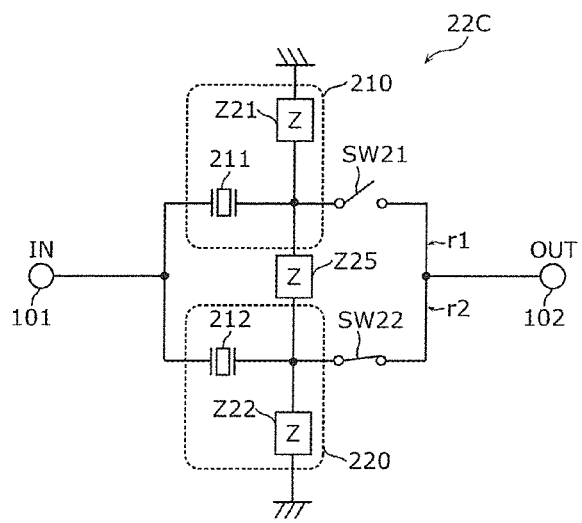
FIG. 23A is a circuit diagram of a filter according to Example Configuration 3 of Modification 1 of Embodiment 2.
Figure 23B:
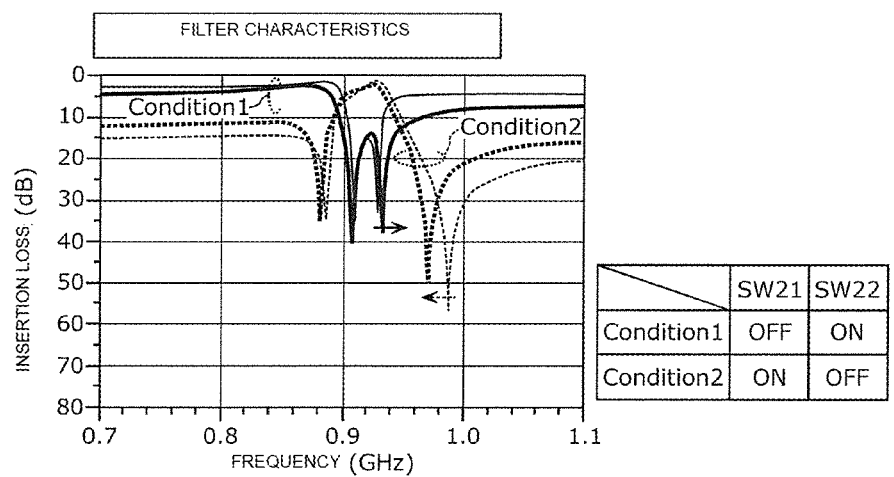
FIG. 23B is a graph illustrating the filter characteristics of the filter.

FIG. 23A is a circuit diagram of a filter 22C according to Example Configuration 3 of this modification. FIG. 23B is a graph illustrating the filter characteristics of the filter 22C according to Example Configuration 3 of this modification.

As illustrated in FIG. 23A, the filter 22C includes, as an additional element, an impedance element Z25 that connects a point (node) on the first path r1 in the first resonant circuit 210 and a point (node) on the second path r2 in the second resonant circuit 220 to each other. The point on the first path r1 is specifically a node between the resonator 211 (first series-arm element) and the impedance element Z21 (first parallel-arm element). The point on the second path r2 is specifically a node between the resonator 212 (second series-arm element) and the impedance element Z22 (second parallel-arm element). That is, the impedance element Z25 is connected in parallel with a circuit including a series-connection of the resonator 211 and the resonator 212.

With the additional element described above, as illustrated in FIG. 23B, the filter 22C can shift attenuation poles. In this example configuration, the filter 22C shifts the attenuation pole to the high-frequency side in the Condition 1, and shifts the attenuation pole to the low-frequency side in the Condition 2.

When the number of first series-arm elements of the first resonant circuit 210 is two or more, one end of the impedance element Z25 may be connected to a point different from the node between the first series-arm element and the first parallel-arm element. That is, in this case, the one end of the impedance element Z25 may be connected to any point between a plurality of first series-arm elements. Likewise, when the number of second series-arm elements of the second resonant circuit 220 is two or more, the other end of the impedance element Z25 may be connected to a point different from the node between the second series-arm element and the second parallel-arm element.

[2-5-4. Example Configuration 4]

Figure 24A:
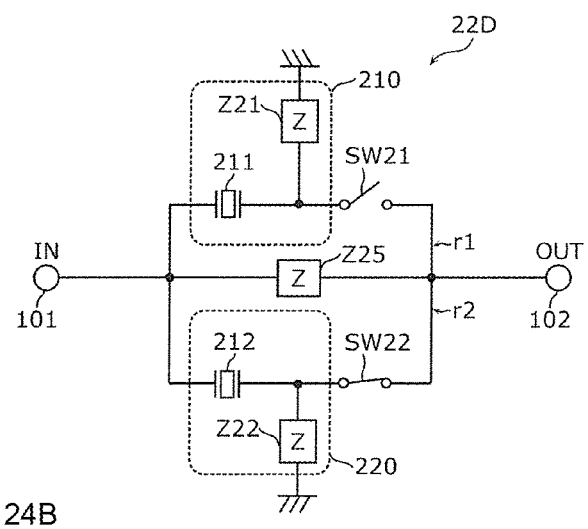
FIG. 24A is a circuit diagram of a filter according to Example Configuration 4 of Modification 1 of Embodiment 2.
Figure 24B:
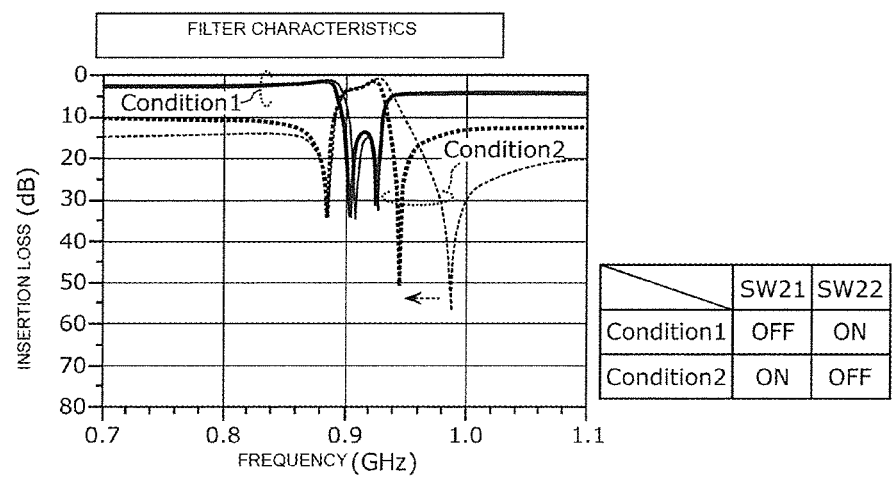
FIG. 24B is a graph illustrating the filter characteristics of the filter.

FIG. 24A is a circuit diagram of a filter 22D according to Example Configuration 4 of this modification. FIG. 24B is a graph illustrating the filter characteristics of the filter 22D according to Example Configuration 4 of this modification.

As illustrated in FIG. 24A, the filter 22D includes, as an additional element, an impedance element Z25 that connects the IN terminal 101 and the OUT terminal 102 to each other. That is, in this example configuration, the series-arm element of the first resonant circuit 210 (i.e., the resonator 211), the series-arm element of the second resonant circuit 220 (i.e., the resonator 212), and the impedance element Z25 are connected in parallel.

With the additional element described above, as illustrated in FIG. 24B, the filter 22D can shift an attenuation pole. In this example configuration, the filter 22D shifts the attenuation pole on the low-frequency side of the pass band to the low-frequency side in the Condition 2 in particular.

[2-5-5. Example Configuration 5]

Figure 25A:
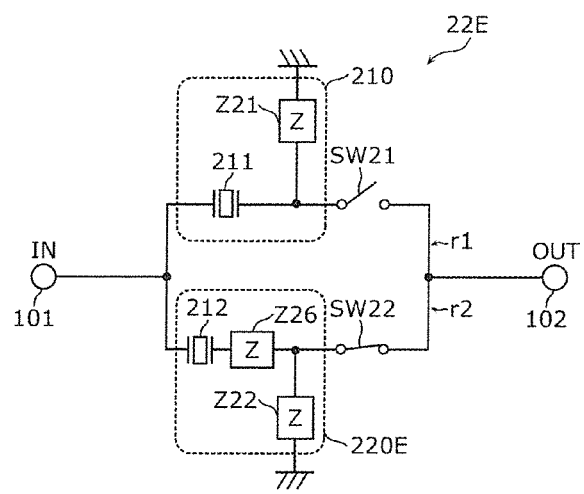
FIG. 25A is a circuit diagram of a filter according to Example Configuration 5 of Modification 1 of Embodiment 2.
Figure 25B:
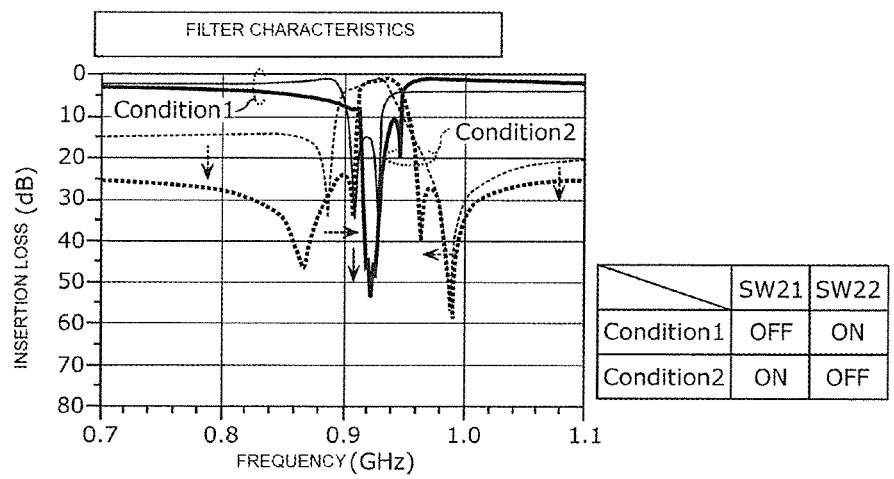
FIG. 25B is a graph illustrating the filter characteristics of the filter.

FIG. 25A is a circuit diagram of a filter 22E according to Example Configuration 5 of this modification. FIG. 25B is a graph illustrating the filter characteristics of the filter 22E according to Example Configuration 5 of this modification.

As illustrated in FIG. 25A, the filter 22E includes, as an additional element, an impedance element Z26 disposed in the second path r2. Accordingly, a second resonant circuit 220E according to this example configuration further includes the impedance element Z26, unlike the second resonant circuit 220 described above.

With the additional element described above, as illustrated in FIG. 25B, the filter 22E can shift the attenuation poles both in the Condition 1 and the Condition 2.

In this configuration, the additional element (the impedance element Z26) is an acoustic wave resonator. This can increase (improve) the attenuation in the attenuation band, providing the compact filter 22E capable of supporting multiple bands and having excellent attenuation characteristics.

Modification 2 of Embodiment 2

Modification 1 of Embodiment 2 described above describes the addition of an additional element to the filter 21 according to Embodiment 2, thereby forming a filter characteristic different from that of the filter 21 in at least one of the Condition 1 and the Condition 2. This embodiment describes a configuration including an additional switch that selectively adds the additional element, thereby forming three or more filter characteristics.

The advantages achieved by the provision of the additional element and additional switch, and the detailed configuration of the additional switch are similar to those in Modification 2 of Embodiment 1, and will not be described herein.

In the following, a three-band filter according to Modification 2 of Embodiment 2 including an additional element and an additional switch will be described with reference to Example Configurations 1 to 4.

[2-6-1. Example Configuration 1]

Figure 26A:
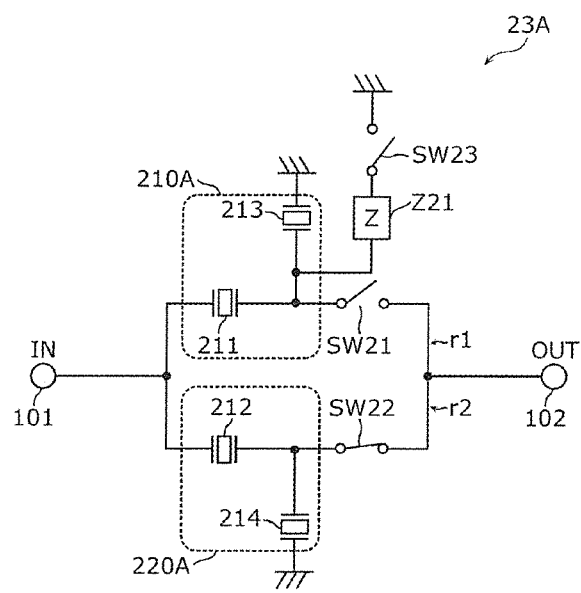
FIG. 26A is a circuit diagram of a filter according to Example Configuration 1 of Modification 2 of Embodiment 2.
Figure 26B:
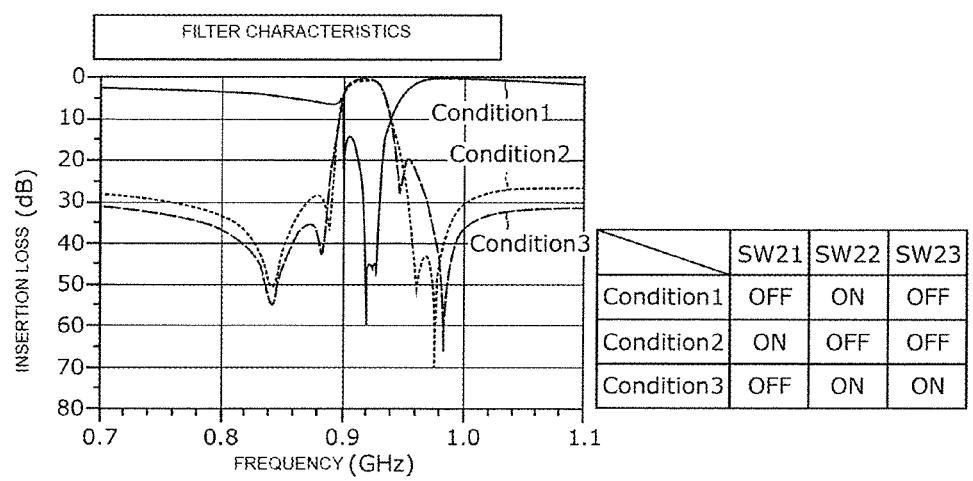
FIG. 26B is a graph illustrating the filter characteristics of the filter.

FIG. 26A is a circuit diagram of a filter 23A according to Example Configuration 1 of this modification. FIG. 26B is a graph illustrating the filter characteristics of the filter 23A according to Example Configuration 1 of this modification.

As illustrated in FIG. 26A, unlike the filter 22A illustrated in FIG. 21A, the filter 23A includes a first resonant circuit 210A formed by interchanging the positions of the impedance element Z21 and the resonator 213, and a second resonant circuit 220A formed by interchanging the positions of the impedance element Z22 and the resonator 214, and includes, as an additional switch, a switch SW23 connected in series with the impedance element Z21. In this example configuration, the impedance element Z22 is not included. That is, in this example configuration, the resonator 213 corresponds to a first parallel-arm element, and the resonator 214 corresponds to a second parallel-arm element, and the impedance element Z21 corresponds to an additional element.

With this configuration, as illustrated in FIG. 26B, the filter 23A can switch the bands to be supported by turning on and off the switches SW21 to SW23. That is, the additional switch (the switch SW23) is turned off to prevent the addition of the additional element, and, similarly to the filter 21 according to Embodiment 2, the filter 23A forms two filter characteristics ("Condition 1" and "Condition 2" in FIG. 26B). On the other hand, the switch SW23 is turned on to add the additional element, and thus the filter 23A forms a filter characteristic ("Condition 3" in FIG. 26B) different from the two filter characteristics described above. Accordingly, the filter 23A can form three filter characteristics by turning on and off the switches SW21 to SW23, and can thus support three bands.

[2-6-2. Example Configuration 2]

Figure 27A:
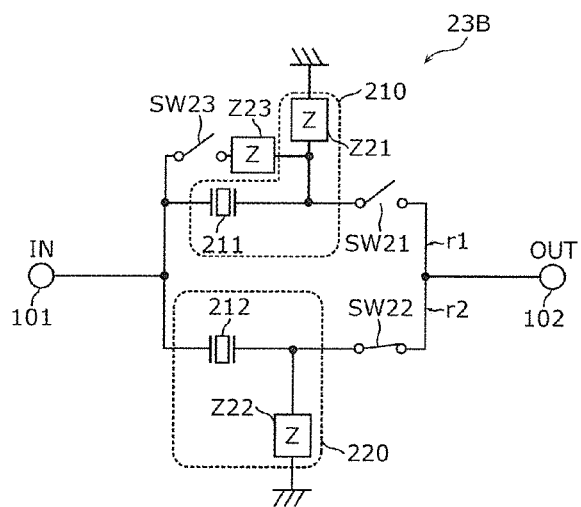
FIG. 27A is a circuit diagram of a filter according to Example Configuration 2 of Modification 2 of Embodiment 2.
Figure 27B:
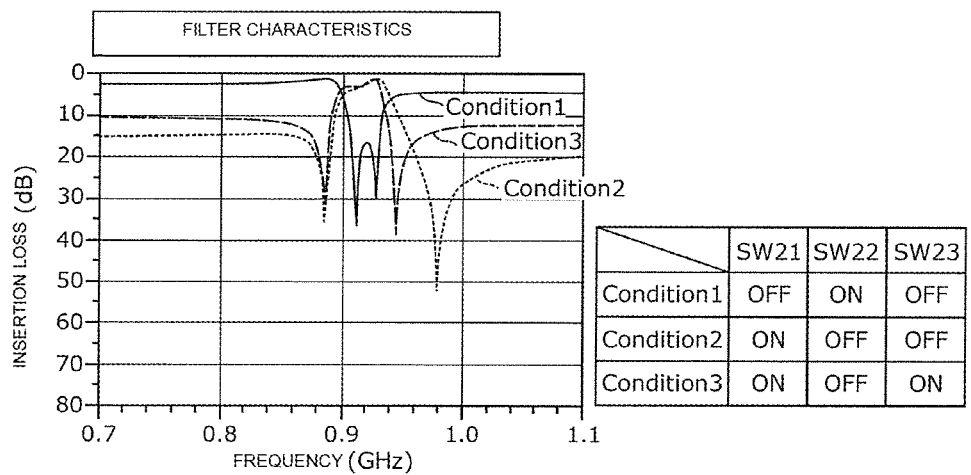
FIG. 27B is a graph illustrating the filter characteristics of the filter.

FIG. 27A is a circuit diagram of a filter 23B according to Example Configuration 2 of this modification. FIG. 27B is a graph illustrating the filter characteristics of the filter 23B according to Example Configuration 2 of this modification.

As illustrated in FIG. 27A, the filter 23B includes, as an additional element, the impedance element Z23 illustrated in FIG. 22A, and includes, as an additional switch, a switch SW23 connected in series with the impedance element Z23. With this configuration, as illustrated in FIG. 27B, similarly to the filter 23A described above, the filter 23B can form three filter characteristics by turning on and off the switches SW21 to SW23, and can thus support three bands.

[2-6-3. Example Configuration 3]

Figure 28A:
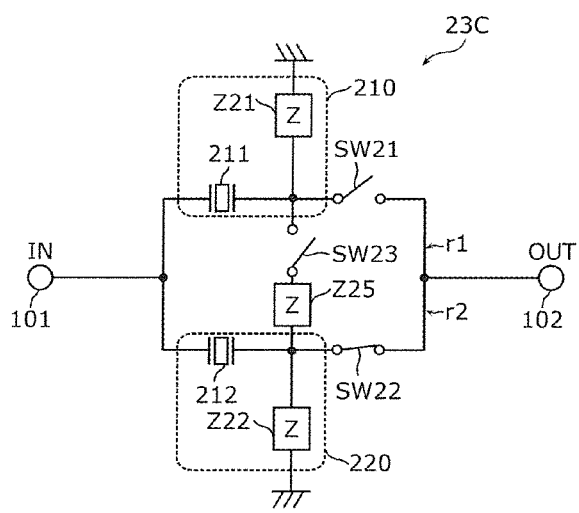
FIG. 28A is a circuit diagram of a filter according to Example Configuration 3 of Modification 2 of Embodiment 2.
Figure 28B:
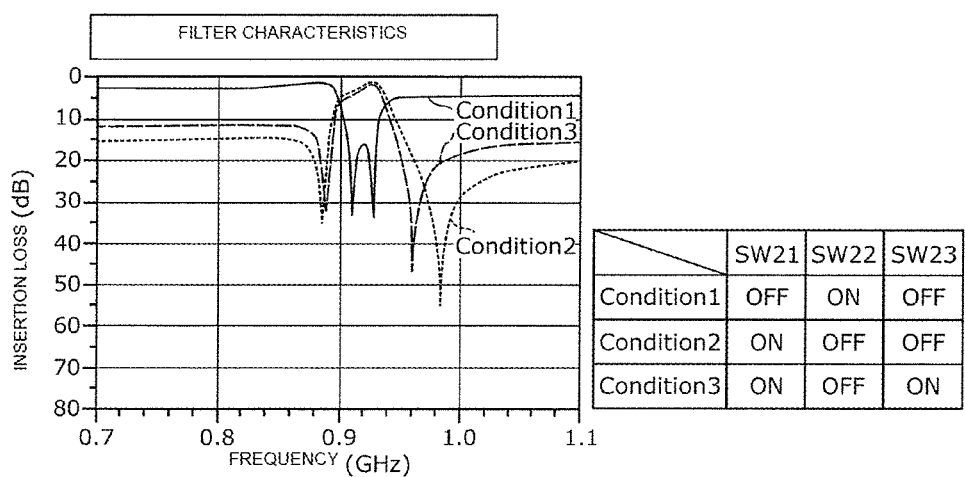
FIG. 28B is a graph illustrating the filter characteristics of the filter.

FIG. 28A is a circuit diagram of a filter 23C according to Example Configuration 3 of this modification. FIG. 28B is a graph illustrating the filter characteristics of the filter 23C according to Example Configuration 3 of this modification.

As illustrated in FIG. 28A, the filter 23C includes, as an additional element, the impedance element Z25 illustrated in FIG. 23A, and includes, as an additional switch, a switch SW23 connected in series with the impedance element Z25 between the first path r1 and the second path r2. With this configuration, as illustrated in FIG. 28B, similarly to the filter 23A described above, the filter 23C can form three filter characteristics by turning on and off the switches SW21 to SW23, and can thus support three bands.

[2-6-4. Example Configuration 4]

Figure 29A:
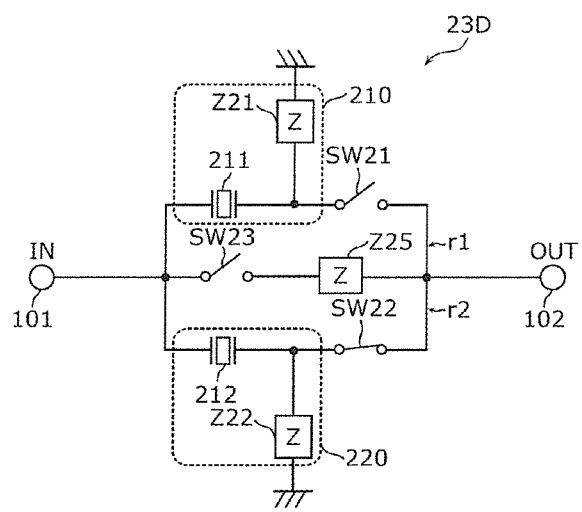
FIG. 29A is a circuit diagram of a filter according to Example Configuration 4 of Modification 2 of Embodiment 2.
Figure 29B:
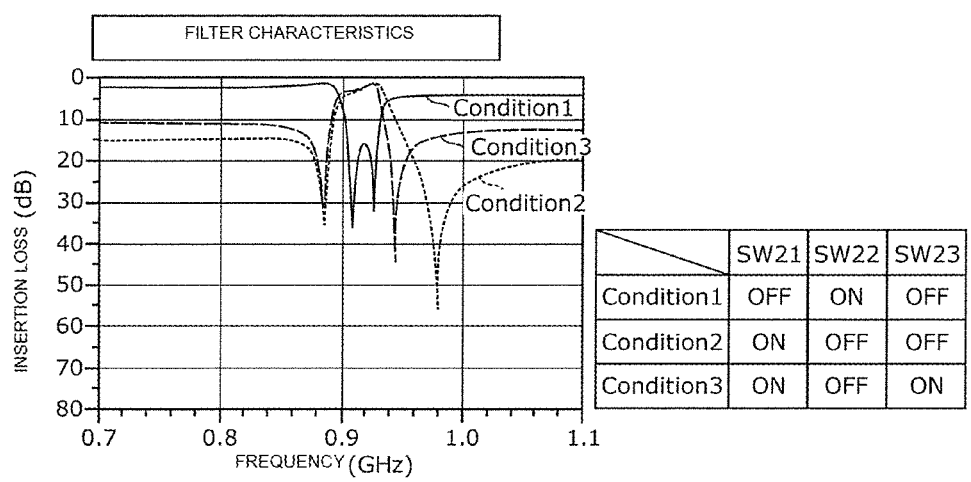
FIG. 29B is a graph illustrating the filter characteristics of the filter.

FIG. 29A is a circuit diagram of a filter 23D according to Example Configuration 4 of this modification. FIG. 29B is a graph illustrating the filter characteristics of the filter 23D according to Example Configuration 4 of this modification.

As illustrated in FIG. 29A, the filter 23D includes, as an additional element, the impedance element Z25 illustrated in FIG. 24A, and includes, as an additional switch, a switch SW23 connected in series with the impedance element Z24. With this configuration, as illustrated in FIG. 29B, similarly to the filter 23A described above, the filter 23D can form three filter characteristics by turning on and off the switches SW21 to SW23, and can thus support three bands.

Modification 3 of Embodiment 2

The filters according to Embodiment 2 and the modifications thereof described above can each switch between, for example, a state in which the filter allows a specific band to pass therethrough (a state in which a BPF-type filter characteristic is formed) and a state in which the filter attenuates only the specific band (a state in which a BEF-type filter characteristic is formed). Further, the filter achieves an advantage, in particular when the pass band of the BPF-type filter characteristic and the attenuation band of the BEF-type filter characteristic substantially coincide with each other. The filter is therefore suitable for use as a filter contained in a radio-frequency front-end circuit or the like for which the two states are required.

This modification describes filters contained in such a radio-frequency front-end circuit or the like with reference to Example Configurations 1 to 3. In this modification, the filters, each of which is any of the filters described in Embodiment 2 and Modifications 1 and 2 thereof described above, are cascade-connected (connected in cascade) in a plurality of stages, which is not limiting.

[2-7-1. Example Configuration 1]

Figure 30A:
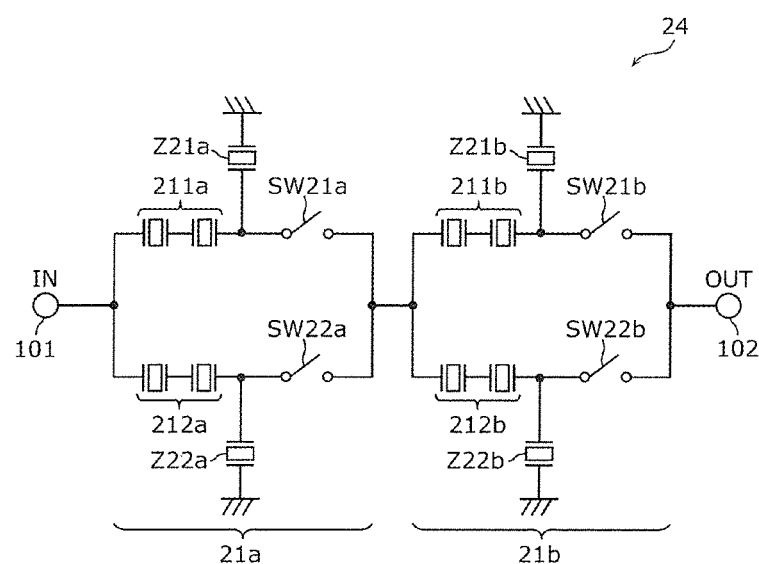
FIG. 30A is a circuit diagram of a filter according to Example Configuration 1 of Modification 3 of Embodiment 2.

FIG. 30A is a circuit diagram of a filter 24 according to Example Configuration 1 of this modification.

The filter 24 illustrated in FIG. 30A includes a filter structure 21a in the initial stage including switches SW21a and SW22a, resonators 211a and 212a, and impedance elements Z21a and Z22a, and a filter structure 21b in the subsequent stage including switches SW21b and SW22b, resonators 211b and 212b, and impedance elements Z21b and Z22b. Each of the filter structure 21a in the initial stage and the filter structure 21b in the subsequent stage corresponds to the filter 21 according to Embodiment 2 described above. That is, the filter 24 has two stages of filter structures.

The filter 24 having the configuration described above can be used as a tunable filter supporting, for example, PCS (Personal Communications Service), GSM (registered trademark) (Global System for Mobile communications), and GPS (Global Positioning System).

Figure 30B:
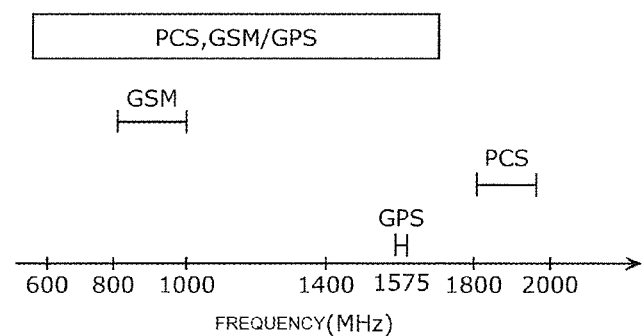
FIG. 30B is a diagram illustrating the frequency ranges assigned to PCS, GSM (registered trademark), and GPS.

FIG. 30B is a diagram illustrating the frequency ranges (bands) assigned to PCS, GSM (registered trademark), and GPS in Example Configuration 1 of this modification. As illustrated in FIG. 30B, the GPS band is positioned between the PCS band and the GSM (registered trademark) band.

Figure 30C:
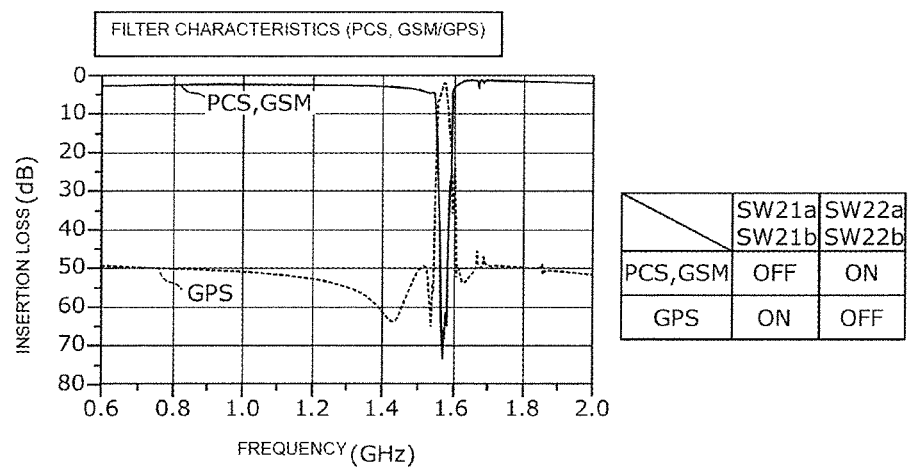
FIG. 30C is a graph illustrating the filter characteristics of the filter.

FIG. 30C is a graph illustrating the example filter characteristics of the filter 24 according to Example Configuration 1 of this modification.

As illustrated in FIG. 30C, the filter 24 allows the bands other than the GPS band to pass therethrough by turning off the switches SW21a and SW21b and turning on the switches SW22a and SW22b, and can thus support PCS and GSM (registered trademark). Further, the filter 24 allows the GPS band to pass therethrough by turning on the switches SW21a and SW21b and turning off the switches SW22a and SW22b, and can thus support GPS.

The filter 24 having the configuration described above can form a BPF-type filter characteristic in which the filter 24 allows the GPS band to pass therethrough and a BEF-type filter characteristic in which the filter 24 allows the bands other than the GPS band to pass therethrough. Accordingly, a compact radio-frequency front-end circuit can be implemented, which can ensure sufficient attenuation in the attenuation band, compared with a configuration including a switch that switches between the GPS band and the other bands.

Figure 31A:
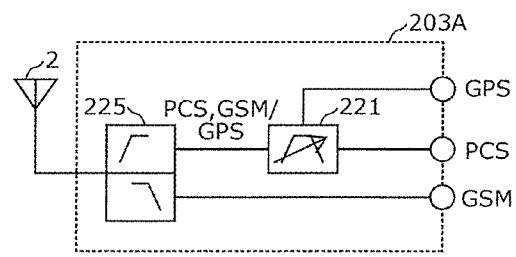
FIGS. 31A and 31B include configuration diagrams of radio-frequency front-end circuits according to Example Configuration 1 of Modification 3 of Embodiment 2.
Figure 31B:
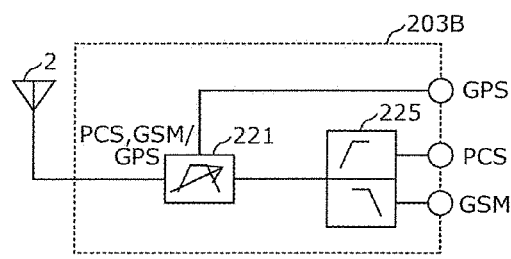
Figure 31C:
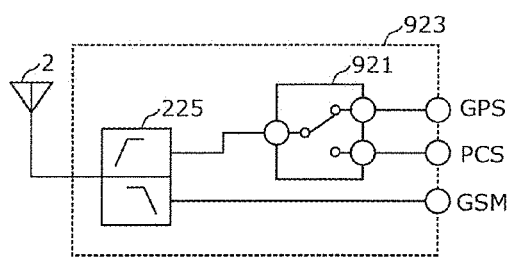
FIG. 31C is a configuration diagram of radio-frequency front-end circuits according to a comparative example of the radio-frequency front-end circuit.

FIGS. 31A and 31B include configuration diagrams of radio-frequency front-end circuits 203A and 203B according to Example Configuration 1 of this modification. FIG. 31C is a configuration diagram of a radio-frequency front-end circuit 923 according to a comparative example.

Specifically, each of the radio-frequency front-end circuit 203A illustrated in FIG. 31A and the radio-frequency front-end circuit 203B illustrated in FIG. 31B includes a tunable filter 221, which corresponds to the filter 24, and a diplexer 225 connected to the side of the tunable filter 221 closer to the antenna element 2 or connected to the opposite side of the tunable filter 221. The diplexer 225 separates a radio-frequency signal on the low-frequency side including the GSM (registered trademark) band and a radio-frequency signal on the high-frequency side including the GPS band and the PCS band from each other.

In contrast, the radio-frequency front-end circuit 923 illustrated in FIG. 31C includes the diplexer 225 and a switch 921 that switches between the GPS band (narrow band) and the other bands (wide band).

However, in a configuration including the switch 921, if the off characteristic of the switch 921 is not sufficiently small, one of the narrow band and the wide band, when selected, is likely to be affected by the other band, and it is difficult to ensure sufficient attenuation. It is conceivable to increase the number of internal switch elements of the switch 921 to ensure sufficient attenuation; however, due to the increase in the number of internal switch elements and the increase in the number of control lines that control the internal switch elements, size reduction is difficult to achieve.

In the configuration illustrated in FIGS. 31A and 31B, in contrast, the tunable filter 221, instead of the switch 921, can implement the PCS, GSM (registered trademark), and GPS enabled compact radio-frequency front-end circuits 203A and 203B that can ensure sufficient attenuation in the attenuation band.

[2-7-2. Example Configuration 2]

Further, the filter 24 described above can be used not only to switch the band assigned thereto but also to reduce the influence on the counterpart band when the band assigned thereto is not used.

Figure 32A:
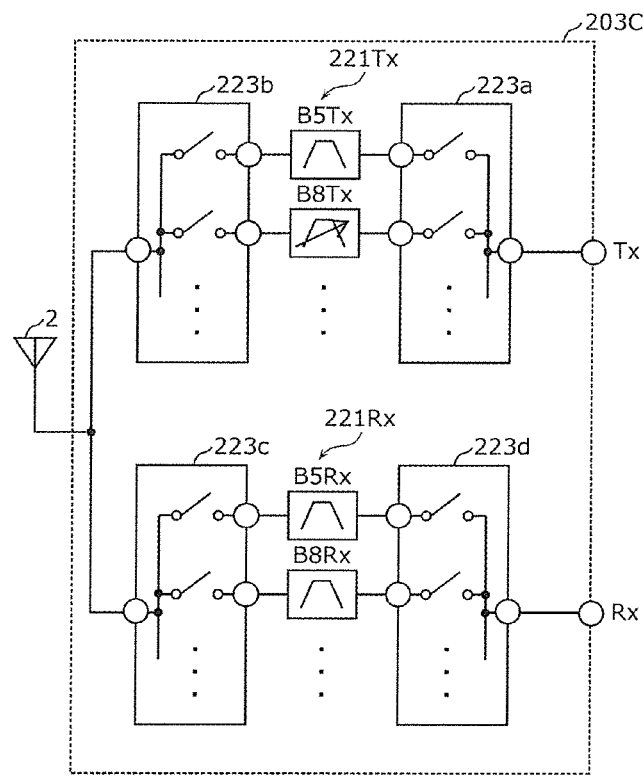
FIG. 32A is a configuration diagram of a radio-frequency front-end circuit according to Example Configuration 2 of Modification 3 of Embodiment 2.

FIG. 32A is a configuration diagram of a radio-frequency front-end circuit 203C according to Example Configuration 2 of this modification.

The radio-frequency front-end circuit 203C illustrated in FIG. 32A includes a transmit filter group 221Tx, which supports Band 5 and Band 8 and includes band-switching switches 223*a* and 223*b* disposed in a transmit path and a plurality of transmit filters individually supporting the respective bands, and a receive filter group 221Rx, which supports Band 5 and Band 8 and includes band-switching switches 223*c* and 223*d* disposed in a receive path and a plurality of receive filters individually supporting the respective bands. The transmit filter supporting Band 8 in the transmit filter group 221Tx corresponds to the filter 24 described above.

Figure 32B:
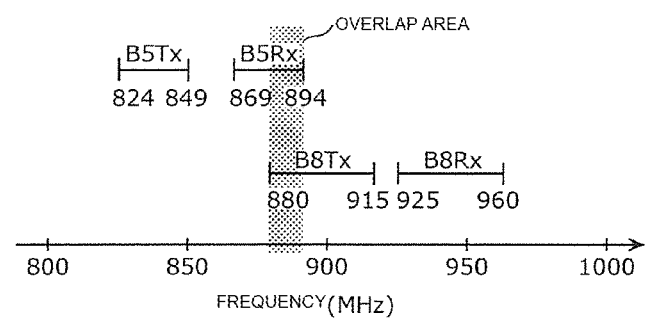
FIG. 32B is a diagram illustrating the frequency ranges assigned to Band 5 and Band 8.

FIG. 32B is a diagram illustrating the frequency ranges assigned to Band 5 and Band 8 in Example Configuration 2 of this modification. As indicated by an overlap area in FIG. 32B, the reception band of Band 5 partially overlaps with the transmission band of Band 8. Accordingly, in a configuration in which the transmit path and the receive path are connected in common to the single antenna element 2, even if Band 8 is not used (during non-use of Band 8) but Band 5 is used, consequences such as deterioration of isolation occurs in Band 5 due to the influence of the transmission band of Band 8.

Accordingly, the configuration of the filter 24 described above is applied to the transmit filter for Band 8 such that the band assigned thereto (here, the transmission band of Band 8) is attenuated during non-use of the band assigned thereto to reduce the influence (here, deterioration of reception sensitivity) on the counterpart band (here, the reception band of Band 5).

Figure 32C:
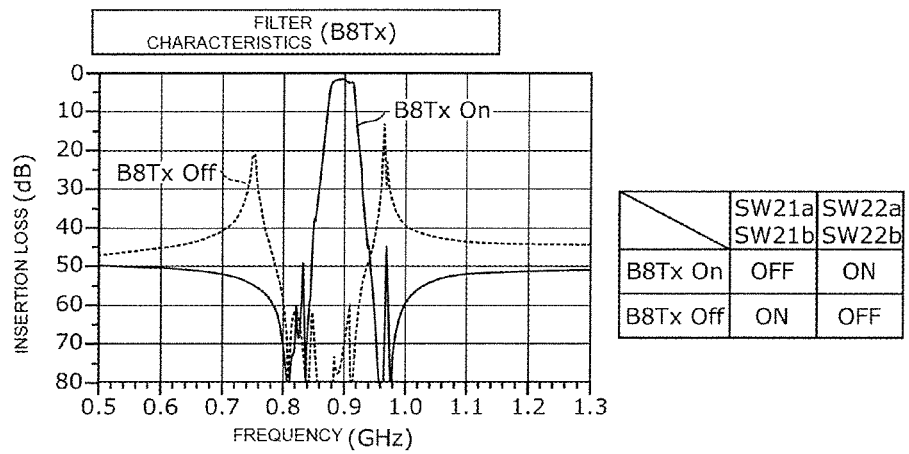
FIG. 32C is a graph illustrating the filter characteristics of a filter according to Example Configuration 2 of Modification 3 of Embodiment 2.
Figure 32D:
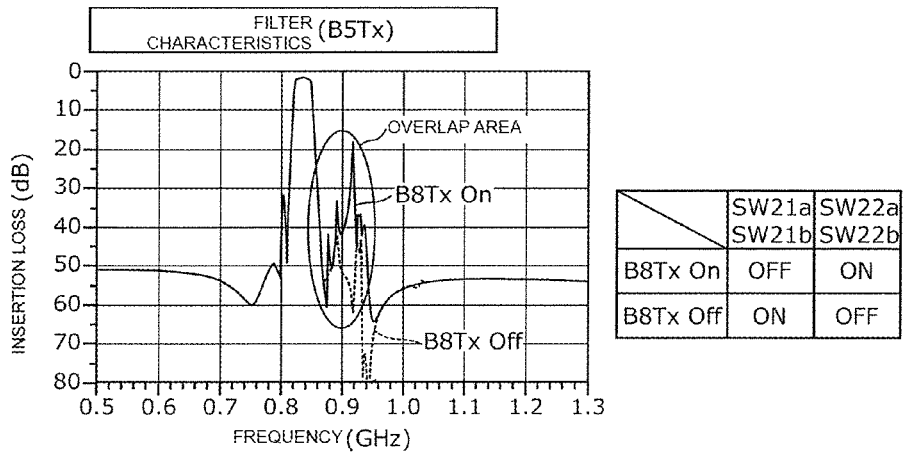
FIG. 32D is a graph illustrating the filter characteristics of the counterpart partner filter of the filter.

FIG. 32C is a graph illustrating the filter characteristics of the filter according to Example Configuration 2 of this modification (the transmit filter for Band 8). FIG. 32D is a graph illustrating the filter characteristics of the counterpart filter (transmit filter for Band 5) of the filter according to Example Configuration 2 of this modification.

As illustrated in FIG. 32C, the transmit filter for Band 8 allows, during the use of the band assigned thereto ("Band 8Tx On" in FIG. 32C), the band assigned thereto to pass therethrough by turning off the switches SW21*a* and SW21*b* and turning on the switches SW22*a* and SW22*b*. The filter 24 allows, during non-use of the band assigned thereto ("Band 8Tx Off" in FIG. 32C), the bands other than the band assigned thereto to pass therethrough by turning on the switches SW21*a* and SW21*b* and turning off the switches SW22*a* and SW22*b*. The illustrated filter characteristics (BEF-type filter characteristic and BPF-type filter characteristic) are an interchanged version of the filter characteristics of the filter 24. This is merely because the switches SW21*a* and SW21*b* and the switches SW22*a* and SW22*b* are interchanged in position.

As illustrated in FIG. 32D, the radio-frequency front-end circuit 203C includes the transmit filter for Band 8, which attenuates the band assigned thereto (Band 8) during non-use of the band assigned thereto. This can ensure greater attenuation in the overlap area between the transmission band of Band 8 and the reception band of Band 5. That is, the influence on the counterpart band (Band 5) can be reduced.

A technique for a filter having a single band assigned thereto to reduce the influence on the counterpart band when the band assigned thereto is not used has been described with reference to FIGS. 32A to 32D. A similar technique is also applicable to a filter having a plurality of bands assigned thereto.

For example, both the reception band of Band 5 and the reception band of Band 26 partially overlap with the transmission band of Band 8. Accordingly, a receive filter for Band 5 and Band 26 is implemented as the filter according to Modification 2 of Embodiment 2 described above such that, during non-use of Band 5 and Band 26, the filter attenuates the bands assigned thereto to reduce the influence on the counterpart band (Band 8).

Embodiment 3

In Embodiment 1 and the modifications thereof described above, a switch or switches that switch conduction and non-conduction between the first path r1 and ground and between the second path r2 and ground are provided to interchange the positions of the series-arm resonant circuit and the parallel-arm resonant circuit. In Embodiment 2 and the modifications thereof described above, a switch or switches that switch conduction and non-conduction between the first resonant circuit and the OUT terminal 102 and switch conduction and non-conduction between the second resonant circuit and the OUT terminal 102 in the first path r1 and the second path r2 are provided to interchange the positions of the series-arm resonant circuit and the parallel-arm resonant circuit.

In this embodiment, in contrast, the series-arm resonant circuit and the parallel-arm resonant circuit are interchanged in position by using the configurations described above in combination. That is, switches that switch conduction and non-conduction between one path among the first path r1 and the second path r2 and ground and that switch conduction and non-conduction between the OUT terminal 102 and the first resonant circuit and the second resonant circuit in the other path are provided to interchange the positions of the series-arm resonant circuit and the parallel-arm resonant circuit.

[3-1. Configuration]

Figure 33A:
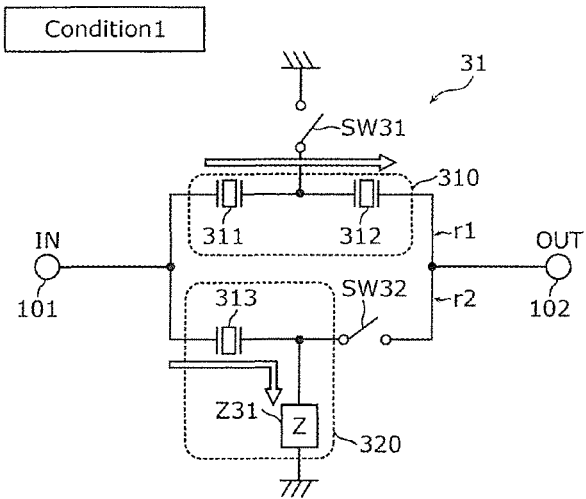
FIGS. 33A and 33B include circuit diagrams of a filter according to Embodiment 3.
Figure 33B:
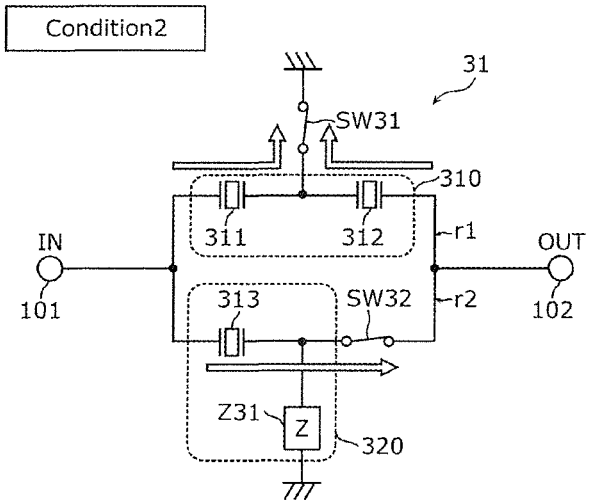

FIGS. 33A and 33B include circuit diagrams of a filter 31 according to this embodiment. Specifically, FIGS. 33A and 33B illustrate circuit diagrams in two states (Condition 1/2) in which switches SW31 and SW32 have different ON/OFF states. FIG. 33A is a circuit diagram in Condition 1, and FIG. 33B is a circuit diagram in Condition 2. FIGS. 33A and 33B also schematically illustrate radio-frequency signals that pass through the filter 31.

The filter 31 illustrated in FIGS. 33A and 33B includes a first resonant circuit 310 and the switch SW31, which respectively correspond to the first resonant circuit 110 and the switch SW11 of the filter 11 according to Embodiment 1 described above, and a second resonant circuit 320 and the switch SW32, which respectively correspond to the second resonant circuit 220 and the switch SW22 of the filter 21 according to Embodiment 2 described above. The first resonant circuit 310 includes resonators 311 and 312, which respectively correspond to the resonators 111 and 112 of the first resonant circuit 110. The second resonant circuit 320 includes a resonator 313 and an impedance element Z31, which respectively correspond to the resonator 212 and the impedance element Z22 of the second resonant circuit 220. Thus, the first resonant circuit 310, the second resonant circuit 320, and the switches SW31 and SW32 will not be described in detail.

[3-2. Operation]

In the filter 31 having the configuration described above, as in Embodiments 1 and 2 described above, in response to the switching of the states (in this embodiment, on and off) of the switches SW31 and SW32 in accordance with a control signal, the series-arm resonant circuit and the parallel-arm resonant circuit are interchanged in position.

Specifically, as illustrated in FIG. 33A, when the switch SW31 is off and the switch SW32 is off (the Condition 1), a series-arm resonant circuit is formed by the first resonant circuit 310 and a parallel-arm resonant circuit is formed by the second resonant circuit 320. In this case, in this embodiment, a ladder circuit is formed in which a single series-arm resonant circuit is formed by a series-connected circuit of the resonator 311 and the resonator 312 and a single parallel-arm resonant circuit is formed by a series-connected circuit of the resonator 313 and the impedance element Z31.

In contrast, as illustrated in FIG. 33B, when the switch SW31 is on and the switch SW32 is on (the Condition 2), a series-arm resonant circuit is formed by the second resonant circuit 320 and a parallel-arm resonant circuit is formed by the first resonant circuit 310. In this case, in this embodiment, a n-type ladder circuit is formed in which a single series-arm resonant circuit is formed by the resonator 313 and the impedance element Z31 and two parallel-arm resonant circuits are each formed by one of the resonator 311 and the resonator 312.

[3-3. Characteristics]

Next, the filter characteristics (bandpass characteristics) of the filter 31, which are formed by the operation described above, will be described together with impedance characteristics that define the filter characteristics.

[3-3-1. When Impedance Element is Capacitor]

First, a description will be given of a case where a capacitor is disposed as the impedance element Z31 (hereinafter, Z=C).

Figure 33C:
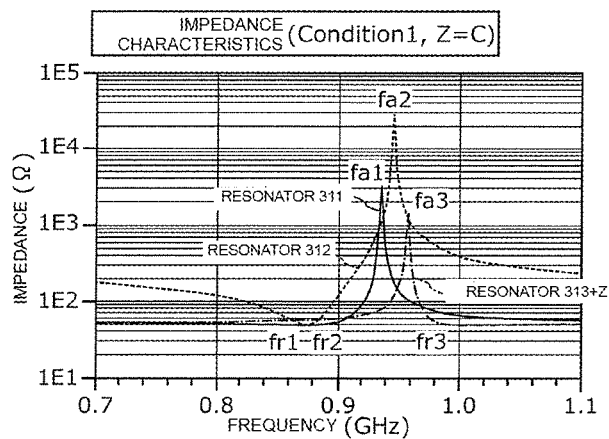
FIGS. 33C, 33D and 33E include graphs illustrating various characteristics of the filter in the case of Z=C.
Figure 33D:
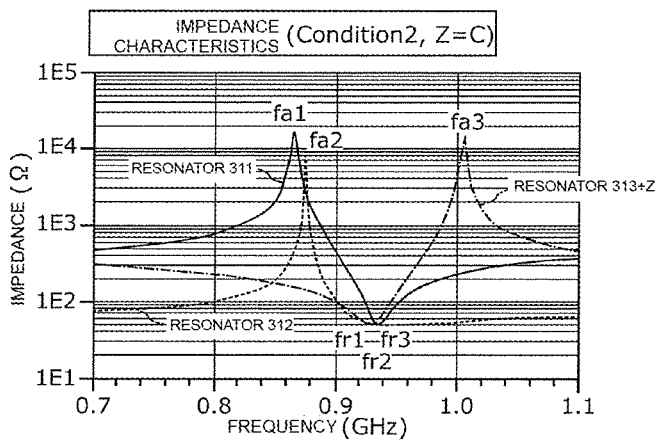
Figure 33E:
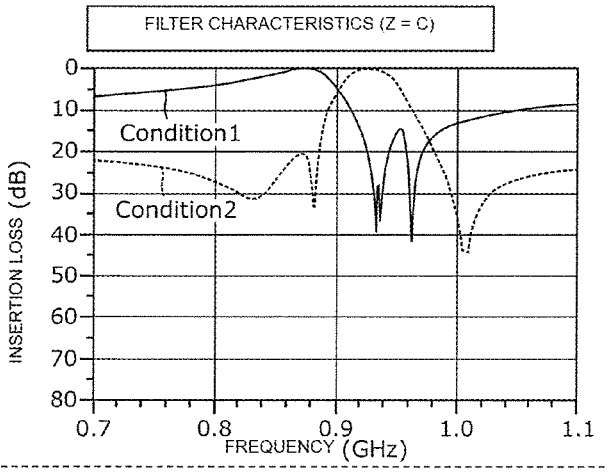

FIGS. 33C, 33D and 33E include graphs illustrating various characteristics of the filter 31 in the case of Z=C. Specifically, FIG. 33C is a graph illustrating the impedance characteristics seen from the IN terminal 101 in the Condition 1, FIG. 33D is a graph illustrating the impedance characteristics seen from the IN terminal 101 in the Condition 2, and FIG. 33E is a graph illustrating the filter characteristics in the Conditions 1 and 2 for comparison. In FIGS. 33C and 33D, the impedance denoted by "the resonator 313+Z" is the combined impedance of the resonator 313 and the impedance element Z31 when seen from the IN terminal 101. This also applies to FIG. 33E.

As illustrated in FIGS. 33C, 33D and 33E, also in this embodiment, as in Embodiments 1 and 2 described above, the frequencies at the resonant points fr1 to fr3 and the frequencies at the anti-resonant points fa1 to fa3 are interchanged in the Condition 1 and the Condition 2. Accordingly, as illustrated in FIG. 33E, the filter 31 can form two filter characteristics.

Specifically, the filter 31 forms a filter characteristic ("Condition 1" in FIG. 33E) in which, when seen from the IN terminal 101 in the Condition 1, points at which the impedances of the resonators 311 and 312 (plurality of first series-arm elements) reach a local minimum (the resonant points fr1 and fr2 in FIG. 33C) and a point at which the impedance of the resonator 313 (second series-arm element) reaches a local minimum (more specifically, the resonant point fr3 in FIG. 33C at which the combined impedance of the resonator 313 and the impedance element Z31 reaches a local minimum) define a pass band, and points at which the impedances of the resonators 311 and 312 reach a local maximum (the anti-resonant points fa1 and fa2 in FIG. 33C) and a point at which the impedance of the resonator 313 reaches a local maximum (more specifically, the anti-resonant point fa3 in FIG. 33C at which the combined impedance of the resonator 313 and the impedance element Z31 reaches a local maximum) define an attenuation band.

As illustrated in FIG. 33C, in the Condition 1, the frequencies at the resonant points fr1 to fr3 and the anti-resonant points fa1 to fa3 satisfy fr2<fa1<fr3 and fr1<fa2<fr3. Further, the impedances at frequencies lower than the resonant points fr1 and fr2 are relatively low (e.g., less than 150Ω). Further, the impedances at frequencies higher than the anti-resonant points fa1 and fa2 are relatively high (e.g., 500Ω or more). Accordingly, an LPF-type filter characteristic is formed at this time, which has a pass band including the points fr1 and fr2 and an attenuation band having the points fa1 to fa3 as attenuation poles.

In contrast, the filter 31 forms a filter characteristic ("Condition 2" in FIG. 33E) in which, when seen from the IN terminal 101 in the Condition 2, points at which the impedances of the resonators 311 and 312 (plurality of first series-arm elements) reach a local minimum (the resonant points fr1 and fr2 in FIG. 33C) and a point at which the impedance of the resonator 313 (second series-arm element) reaches a local minimum (the resonant point fr3 in FIG. 33C) define a pass band, and points at which the impedances of the resonators 311 and 312 (plurality of first series-arm elements) reach a local maximum (the anti-resonant points fa1 and fa2 in FIG. 33D) and a point at which the impedance of the resonator 313 (second series-arm element) reaches a local maximum (the anti-resonant point fa3 in FIG. 33D) define an attenuation band.

As illustrated in FIG. 33D, in the Condition 2, the frequencies at the resonant points fr1 to fr3 and the anti-resonant points fa1 to fa3 satisfy fa2<fr1<fa3 and fa1<fr2<fa3. The impedances among the points fa1 and fa2 and the point fa3 are relatively low (e.g., less than 150Ω). Accordingly, a BPF-type filter characteristic is formed at this time, which has a pass band including the points fr1 and fr2, an attenuation band having the points fa1 and fa2 as attenuation poles on the low-frequency side of the pass band, and an attenuation band having the point fa3 as attenuation poles on the high-frequency side of the pass band.

The comparison between the two filter characteristics formed in the way described above ("Condition 1" and "Condition 2" in FIG. 33E) indicates the following.

A band that is a pass band in one filter characteristic is an attenuation band in the other filter characteristic, and a band that is an attenuation band in the one filter characteristic is a pass band in the other filter characteristic. Conversely, a band that is a pass band in the other filter characteristic is an attenuation band in the one filter characteristic, and a band that is an attenuation band in the other filter characteristic is a pass band in the one filter characteristic.

Specifically, in the Condition 1, a pass band is formed by the first resonant circuit 310 causing a radio-frequency signal of the first resonant frequency to flow from the IN terminal 101 to the OUT terminal 102, and an attenuation band is formed by the second resonant circuit 320 causing a radio-frequency signal of the second resonant frequency to flow from the IN terminal 101 to ground. In the Condition 2, in contrast, a pass band is formed by the second resonant circuit 320 causing a radio-frequency signal of the second resonant frequency to flow from the IN terminal 101 to the OUT terminal 102, and an attenuation band is formed by the first resonant circuit 310 causing a radio-frequency signal of the first resonant frequency to flow from the IN terminal 101 to ground.

That is, as in Embodiments 1 and 2 described above, the filter 31 according to this embodiment forms two filter characteristics (in the case of Z=C, the LPF-type filter characteristic and the BPF-type filter characteristic) in which the pass bands and the attenuation bands are interchanged by switching between the Condition 1 and the Condition 2 using the switches SW31 and SW32.

[3-3-2. When Impedance Element is Inductor]

Next, a description will be given of a case where an inductor is disposed as the impedance element Z31 (hereinafter, Z=L).

Figure 33F:
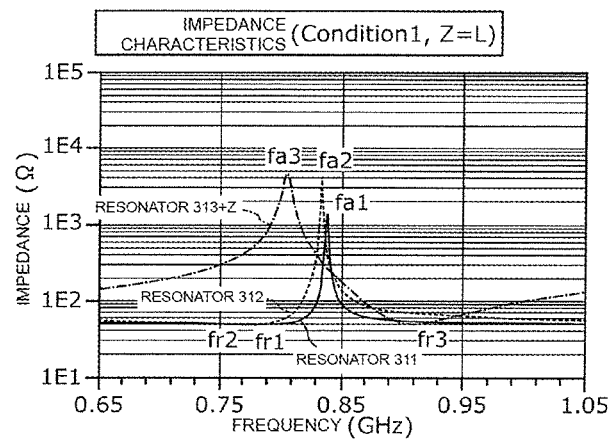
FIGS. 33F, 33G and 33H include graphs illustrating various characteristics of the filter in the case of Z=L.
Figure 33G:
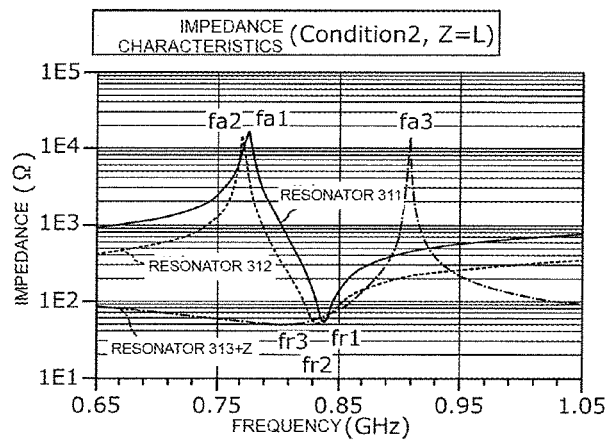
Figure 33H:
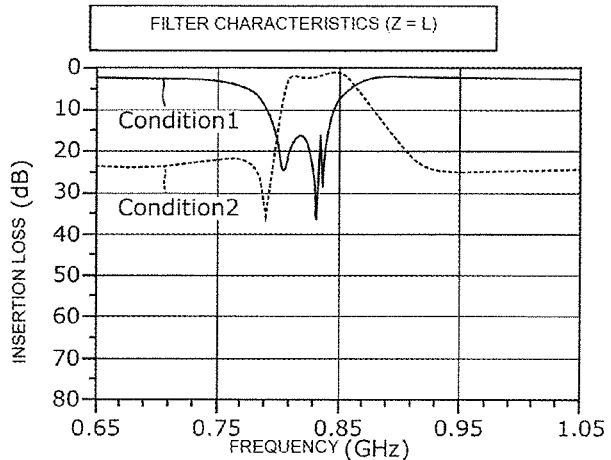

FIGS. 33F, 33G and 33H include graphs illustrating various characteristics of the filter 31 in the case of Z=L.

As illustrated in FIGS. 33F, 33G and 33H, in the case of Z=L, the combined impedance of the resonator 313 and the impedance element Z31 ("resonator 313+Z" in FIGS. 33F and 33G) is different from that in the case of Z=C, and thus the filter characteristics are different from those in the case of Z=C.

Specifically, as illustrated in FIG. 33F, in the Condition 1, the frequencies at the resonant points fr1 to fr3 and the anti-resonant points fa1 to fa3 satisfy fa1<fr3 and fa2<fr3. Further, the impedances at frequencies lower than the anti-resonant points fa1 and fa2 are relatively high. Accordingly, an HPF-type filter characteristic is formed at this time, which has a pass band including the point fr3 and an attenuation band having the points fa1 to fa3 as attenuation poles.

In the Condition 2, in contrast, as illustrated in FIG. 33G, the frequencies at the resonant points fr1 to fr3 and the anti-resonant points fa1 to fa3 satisfy fa2<fr1<fa3, fa1<fr2<fa3, fa2<fr3, and fa1<fr3. The impedances among the points fa1 and fa2 and the point fa3 are relatively low. Accordingly, a BPF-type filter characteristic is formed at this time, which has a pass band including the points fr1 to fr3, an attenuation band having the points fa1 and fa2 as attenuation poles on the low-frequency side of the pass band, and an attenuation band having the point fa3 as attenuation poles on the high-frequency side of the pass band.

Accordingly, also in the case of Z=L, the filter 31 according to this embodiment forms two filter characteristics (in the case of Z=L, the HPF-type filter characteristic and the BPF-type filter characteristic) in which the pass bands and the attenuation bands are interchanged.

[3-4. Advantages, Etc.]

As described above, also in the filter 31 (filter device) according to this embodiment, in response to the switching of the switches SW31 and SW32, a series-arm resonant circuit disposed in a path (series arm) along which a radio-frequency signal travels from the IN terminal 101 (input terminal) to the OUT terminal 102 (output terminal) and a parallel-arm resonant circuit disposed in a path (parallel-arm) connecting the path described above and ground are interchanged in position. Accordingly, the filter 31 according to this embodiment can achieve advantages similar to those of Embodiment 1.

In the filter 31 according to this embodiment, furthermore, in the first state (in this embodiment, the Condition 1), a radio-frequency signal of the first resonant frequency flowing from the IN terminal 101 to the OUT terminal 102 is transmitted without passing through a switch, thereby reducing the loss in the pass band. In the first state, furthermore, the second resonant circuit 320 and one terminal among the IN terminal 101 and the OUT terminal 102 (in this embodiment, the OUT terminal 102) are brought into non-conduction, thereby preventing a radio-frequency signal of the second resonant frequency from being transmitted to the OUT terminal 102. Accordingly, the attenuation in the attenuation band can be improved (increased). That is, in this embodiment, a satisfactory filter characteristic can be formed in the first state, in particular.

In the filter 31 according to this embodiment, furthermore, the resonators 311 and 312 (plurality of first series-arm elements) and the resonator 313 (second series-arm element) are each an acoustic wave resonator, and thus both the first filter characteristic (in this embodiment, "Condition 1" in FIG. 33E or FIG. 33H) and the second filter characteristic (in this embodiment, "Condition 2" in FIG. 33E or FIG. 33H) can implement filter characteristics with high steepness. Moreover, since the pass bands and the attenuation bands of the first filter characteristic and the second filter characteristic are specified in the way described above, the first filter characteristic and the second filter characteristic can implement, for example, low-pass type (or high-pass type) and BPF-type, two filter characteristics in which the pass bands and the attenuation bands are interchanged. In the following, the low-pass-type filter characteristic is referred to sometimes as an LPF-type filter characteristic, and the high-pass-type filter characteristic as an HPF-type filter characteristic.

Modification 1 of Embodiment 3

As in Modification 1 of Embodiment 1 described above or Modification 1 of Embodiment 2 described above, the filter 31 according to Embodiment 3 may be provided with an additional element. That is, an additional element may be provided, which is an impedance element connected in series or parallel with at least one of the plurality of impedance elements (in Embodiment 3 described above, the resonators 311 to 313 and the impedance element Z31) that constitute the first resonant circuit 310 and the second resonant circuit 320. Accordingly, in at least one of the Condition 1 and the Condition 2, a filter characteristic different from that of the filter 31 can be formed. The following describes such a filter according to Modification 1 of Embodiment 3 with reference to Example Configurations 1 to 6.

In this modification, a capacitor C31 is provided as the impedance element Z31. In the graphs illustrating the filter characteristics according to this modification, described below, filter characteristics when a capacitor is provided as an additional element are illustrated, unless otherwise stated. However, each of the impedance element Z31 and the additional element is not limited to a capacitor and may be an inductor or an acoustic wave resonator. In the graphs illustrating the filter characteristics, the filter characteristics according to Embodiment 3 described above in the case of Z=C are also illustrated for comparison, with the filter characteristics according to this modification indicated by bold lines and the filter characteristics according to Embodiment 3 indicated by thin lines.

[3-5-1. Example Configuration 1]

Figure 34A:
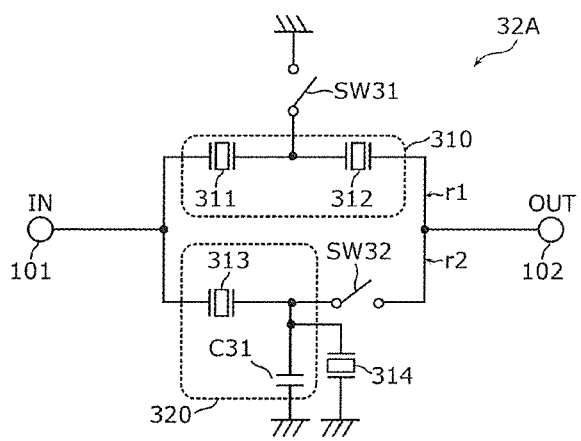
FIG. 34A is a circuit diagram of a filter according to Example Configuration 1 of Modification 1 of Embodiment 3.
Figure 34B:
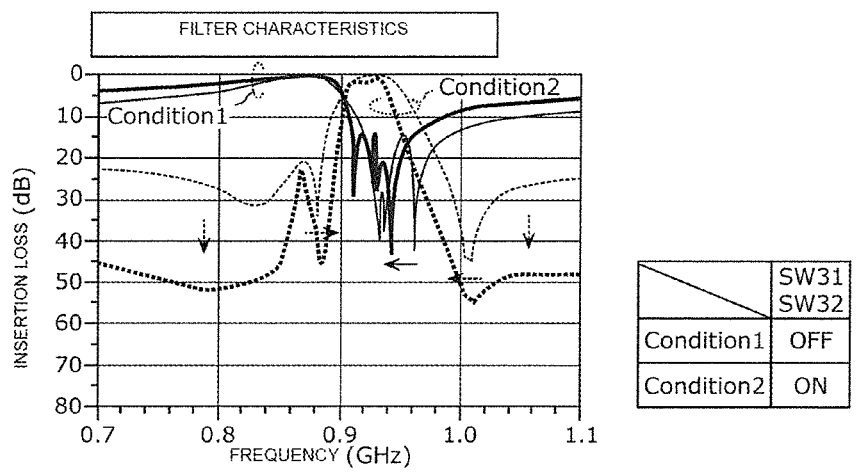
FIG. 34B is a graph illustrating the filter characteristics of the filter.

FIG. 34A is a circuit diagram of a filter 32A according to Example Configuration 1 of this modification. FIG. 34B is a graph illustrating the filter characteristics of the filter 32A according to Example Configuration 1 of this modification.

As illustrated in FIG. 34A, the filter 32A includes, as an additional element, a resonator 314 connected in parallel with the capacitor C31. The resonator 314 corresponds to the resonator 214 of the filter 22A described above.

With the additional element described above, as illustrated in FIG. 34B, the filter 32A can shift the attenuation poles both in the Condition 1 and the Condition 2.

In this configuration, the additional element (the resonator 314) is an acoustic wave resonator. This can increase (improve) the attenuation in the attenuation band, providing the compact filter 32A capable of supporting multiple bands and having excellent attenuation characteristics.

[3-5-2. Example Configuration 2]

Figure 35A:
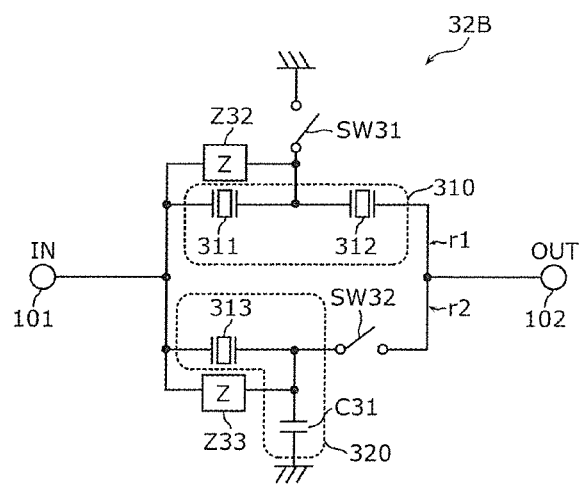
FIG. 35A is a circuit diagram of a filter according to Example Configuration 2 of Modification 1 of Embodiment 3.
Figure 35B:
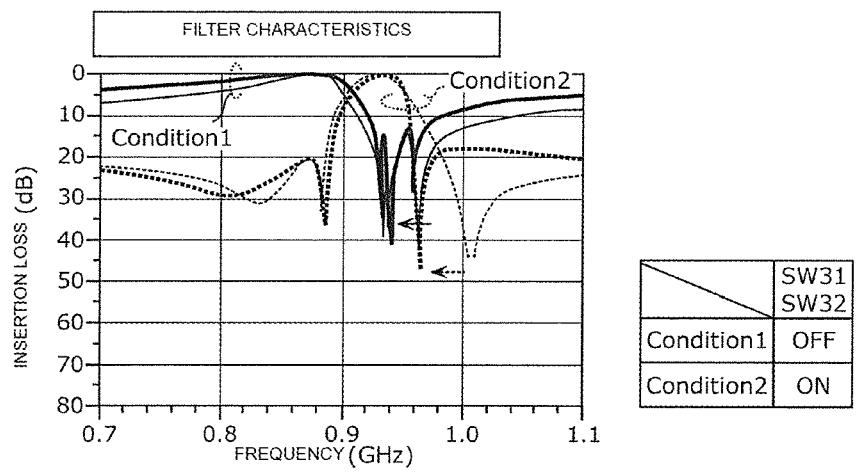
FIG. 35B is a graph illustrating the filter characteristics of the filter.

FIG. 35A is a circuit diagram of a filter 32B according to Example Configuration 2 of this modification. FIG. 35B is a graph illustrating the filter characteristics of the filter 32B according to Example Configuration 2 of this modification.

As illustrated in FIG. 35A, the filter 32B includes, as additional elements, an impedance element Z32 connected in parallel with the resonator 311 and an impedance element Z33 connected in parallel with the resonator 313. The impedance element Z32 corresponds to the impedance element Z11 of the filter 12B described above, and the impedance element Z33 corresponds to the impedance element Z24 of the filter 22B described above.

With the additional elements described above, as illustrated in FIG. 35B, the filter 32B greatly shifts the attenuation pole on the high-frequency side of the pass band to the low-frequency side in the Condition 2 in particular.

In this example configuration, one of the impedance elements Z32 and Z33 is optional.

[3-5-3. Example Configuration 3]

Figure 36A:
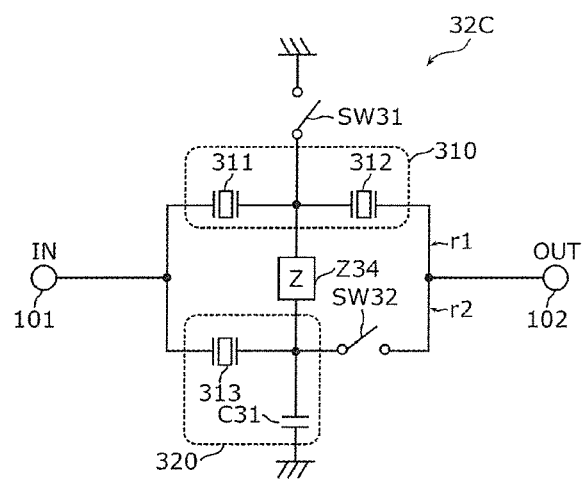
FIG. 36A is a circuit diagram of a filter according to Example Configuration 3 of Modification 1 of Embodiment 3.
Figure 36B:
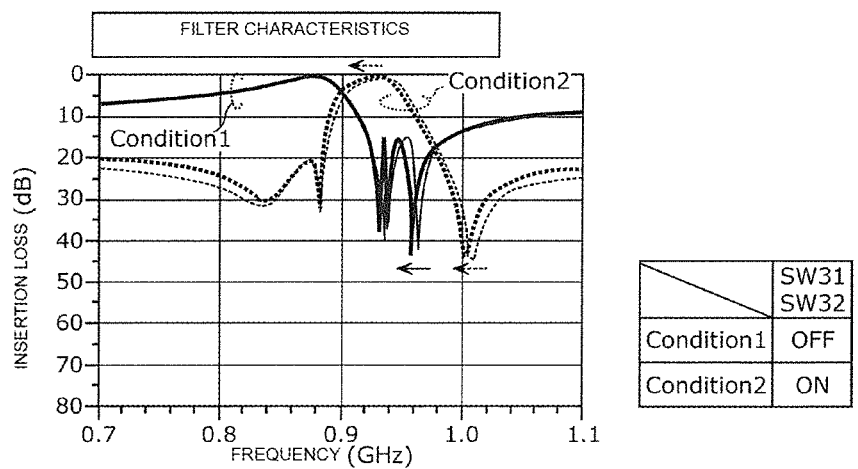
FIG. 36B is a graph illustrating the filter characteristics of the filter.

FIG. 36A is a circuit diagram of a filter 32C according to Example Configuration 3 of this modification. FIG. 36B is a graph illustrating the filter characteristics of the filter 32C according to Example Configuration 3 of this modification.

As illustrated in FIG. 36A, the filter 32C includes, as an additional element, an impedance element Z34. The impedance element Z34 corresponds to the impedance element Z13 of the filter 12C described above or the impedance element Z25 of the filter 22C described above.

With the additional element described above, as illustrated in FIG. 36B, the filter 32C can shift attenuation poles and a pass band. In this example configuration, the filter 32C shifts the attenuation poles to the low-frequency side both in the Condition 1 and the Condition 2, and shifts the pass band to the low-frequency side in the Condition 2.

[3-5-4. Example Configuration 4]

Figure 37A:
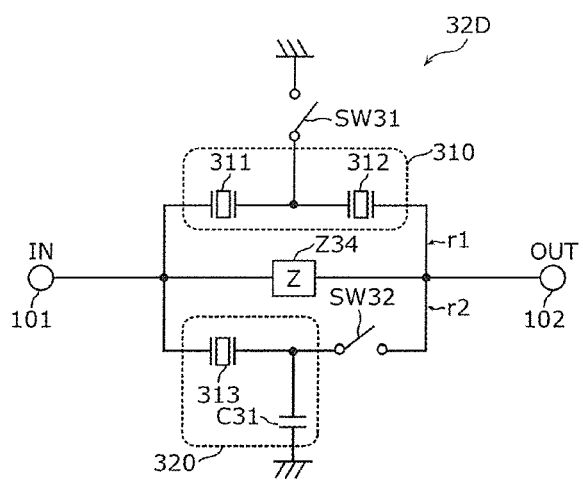
FIG. 37A is a circuit diagram of a filter according to Example Configuration 4 of Modification 1 of Embodiment 3.
Figure 37B:
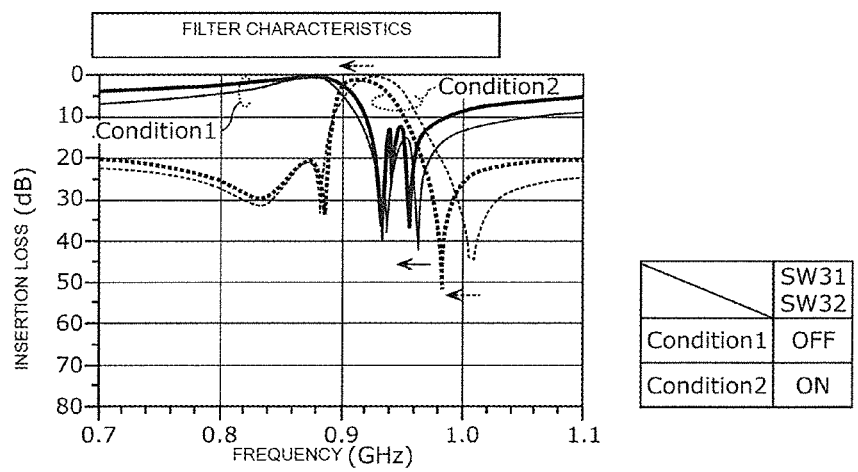
FIG. 37B is a graph illustrating the filter characteristics of the filter.

FIG. 37A is a circuit diagram of a filter 32D according to Example Configuration 4 of this modification. FIG. 37B is a graph illustrating the filter characteristics of the filter 32D according to Example Configuration 4 of this modification.

As illustrated in FIG. 37A, the filter 32D includes, as an additional element, the impedance element Z34 that connects the IN terminal 101 and the OUT terminal 102 to each other. The impedance element Z34 corresponds to the impedance element Z14 of the filter 12D described above or the impedance element Z25 of the filter 22D described above.

With the additional element described above, as illustrated in FIG. 37B, similarly to the filter 32C described above, the filter 32D can shift attenuation poles and a pass band.

[3-5-5. Example Configuration 5]

Figure 38A:
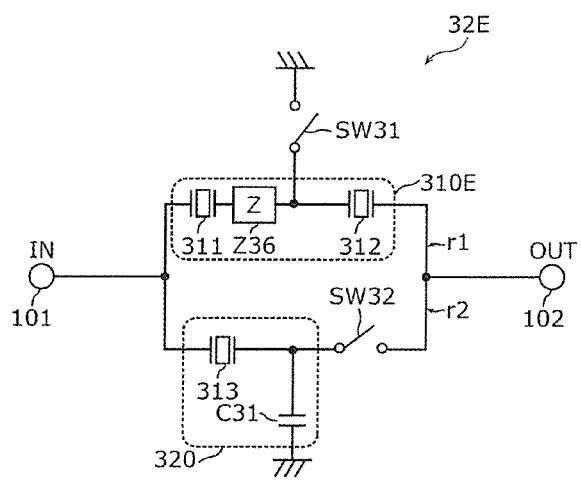
FIG. 38A is a circuit diagram of a filter according to Example Configuration 5 of Modification 1 of Embodiment 3.
Figure 38B:
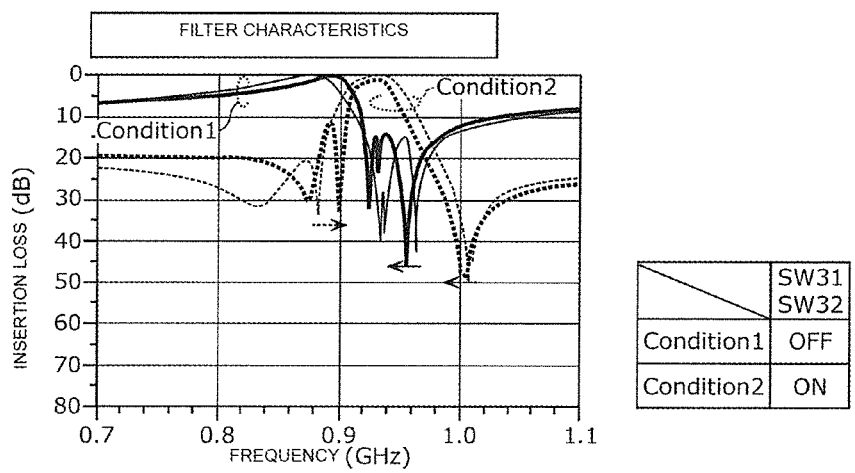
FIG. 38B is a graph illustrating the filter characteristics of the filter.

FIG. 38A is a circuit diagram of a filter 32E according to Example Configuration 5 of this modification. FIG. 38B is a graph illustrating the filter characteristics of the filter 32E according to Example Configuration 5 of this modification.

As illustrated in FIG. 38A, the filter 32E includes, as an additional element, an impedance element Z36 disposed in the first path r1. Accordingly, unlike the first resonant circuit 310 described above, a first resonant circuit 310E according to this example configuration further includes the impedance element Z36. The impedance element Z36 corresponds to the impedance element Z15 of the filter 12E described above.

With the additional element described above, as illustrated in FIG. 38B, the filter 32E can shift the attenuation poles both in the Condition 1 and the Condition 2.

[3-5-6. Example Configuration 6]

The impedance element Z36 may be disposed in the second path r2.

Figure 39A:
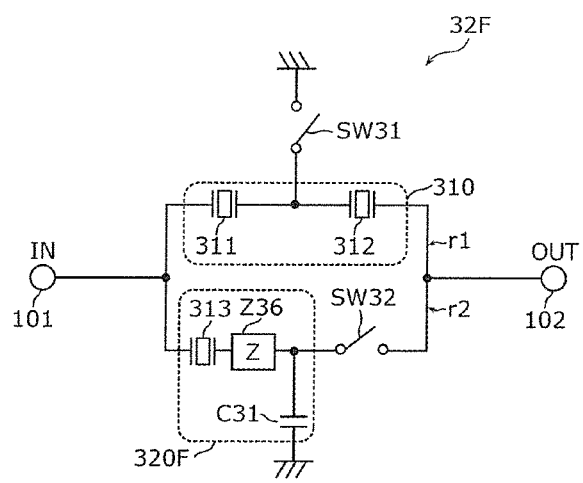
FIG. 39A is a circuit diagram of a filter according to Example Configuration 6 of Modification 1 of Embodiment 3.
Figure 39B:
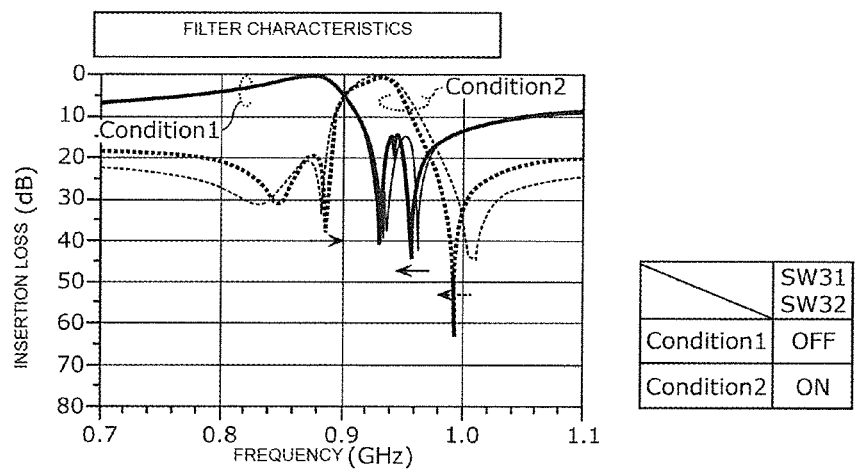
FIG. 39B is a graph illustrating the filter characteristics of the filter.

FIG. 39A is a circuit diagram of a filter 32F according to Example Configuration 6 of this modification having the configuration described above. FIG. 39B is a graph illustrating the filter characteristics of the filter 32F according to Example Configuration 6 of this modification.

As illustrated in FIG. 39A, the filter 32F includes, as an additional element, an impedance element Z36 disposed in the second path r2. Accordingly, unlike the second resonant circuit 320 described above, a second resonant circuit 320F according to this example configuration further includes the impedance element Z36.

With the additional element described above, as illustrated in FIG. 39B, similarly to the filter 32E described above, the filter 32F can shift attenuation poles.

In this configuration, the additional element (the impedance element Z36) is an acoustic wave resonator. This can increase (improve) the attenuation in the attenuation band, providing the compact filter 32F capable of supporting multiple bands and having excellent attenuation characteristics.

Modification 2 of Embodiment 3

Modification 1 of Embodiment 3 described above describes the addition of an additional element to the filter 31 according to Embodiment 3, thereby forming a filter characteristic different from that of the filter 31 in at least one of the Condition 1 and the Condition 2. This embodiment describes a configuration including an additional switch that selectively adds the additional element, thereby forming three or more filter characteristics.

The advantages achieved by the provision of the additional element and additional switch, and the detailed configuration of the additional switch are similar to those in Modification 2 of Embodiment 1 or Modification 2 of Embodiment 2, and will not be described herein.

In the following, a three-band filter according to Modification 2 of Embodiment 3 including an additional element and an additional switch will be described with reference to Example Configurations 1 to 4.

[3-6-1. Example Configuration 1]

Figure 40A:
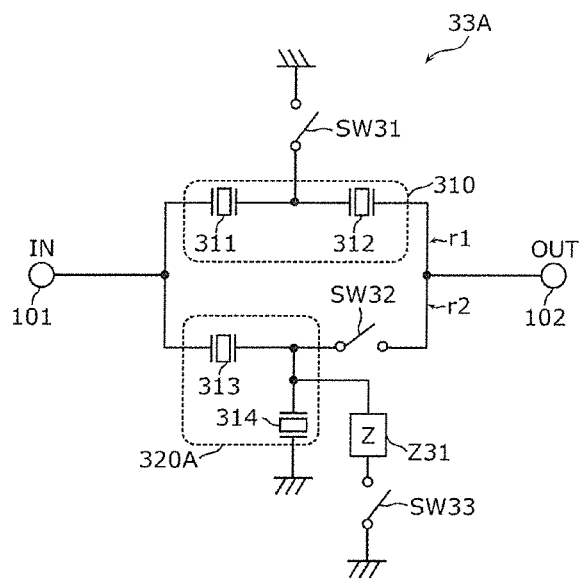
FIG. 40A is a circuit diagram of a filter according to Example Configuration 1 of Modification 2 of Embodiment 3.
Figure 40B:
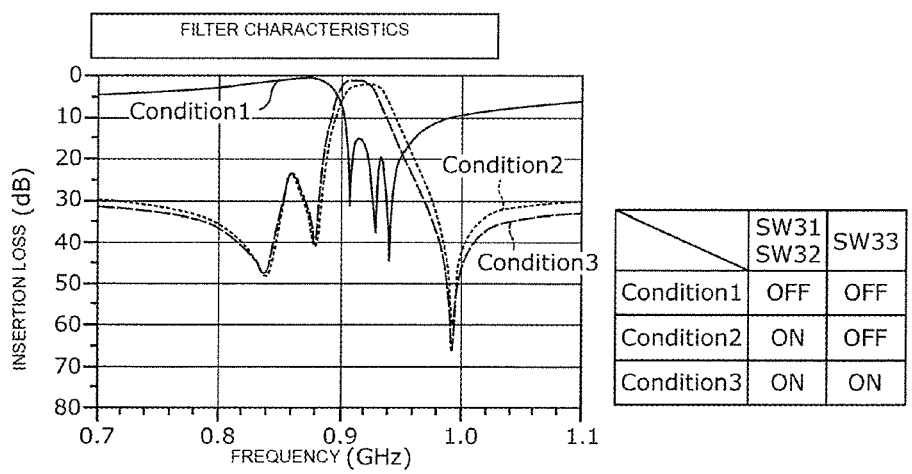
FIG. 40B is a graph illustrating the filter characteristics of the filter.

FIG. 40A is a circuit diagram of a filter 33A according to Example Configuration 1 of this modification. FIG. 40B is a graph illustrating the filter characteristics of the filter 33A according to Example Configuration 1 of this modification.

As illustrated in FIG. 40A, unlike the filter 32A illustrated in FIG. 34A, the filter 33A includes a second resonant circuit 320A formed by interchanging the positions of the impedance element Z31 (corresponding to the capacitor C31 in FIG. 34A) and the resonator 314, and includes, as an additional switch, a switch SW33 connected in series with the impedance element Z31. That is, in this example configuration, the resonator 314 corresponds to a second parallel-arm element, and the impedance element Z31 corresponds to an additional element.

With this configuration, as illustrated in FIG. 40B, the filter 33A can switch the bands to be supported by turning on and off the switches SW31 to SW33. That is, the additional switch (the switch SW33) is turned off to prevent the addition of the additional element, and, similarly to the filter 31 according to Embodiment 3, the filter 33A forms two filter characteristics ("Condition 1" and "Condition 2" in FIG. 40B). On the other hand, the switch SW33 is turned on to add the additional element, and thus the filter 33A forms a filter characteristic ("Condition 3" in FIG. 40B) different from the two filter characteristics described above. Accordingly, the filter 33A can form three filter characteristics by turning on and off the switches SW31 to SW33, and can thus support three bands.

[3-6-2. Example Configuration 2]

Figure 41A:
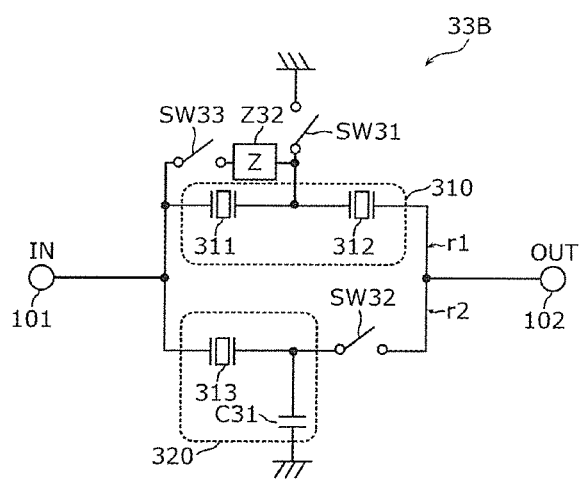
FIG. 41A is a circuit diagram of a filter according to Example Configuration 2 of Modification 2 of Embodiment 3.
Figure 41B:
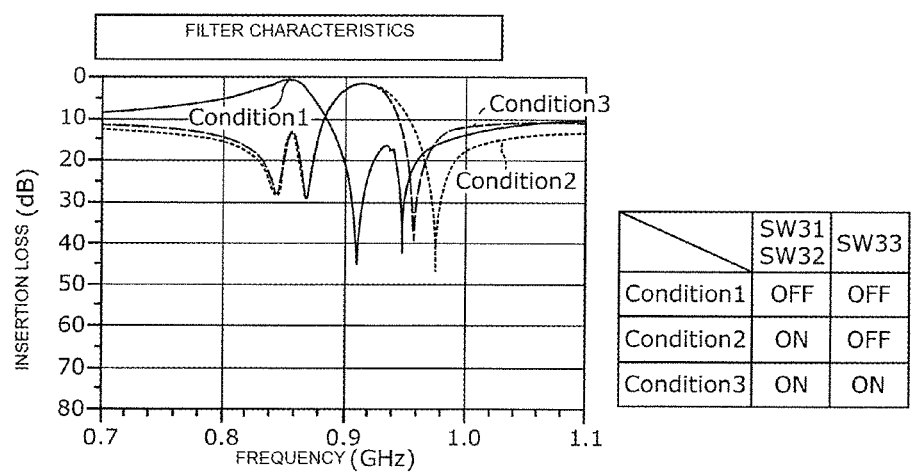
FIG. 41B is a graph illustrating the filter characteristics of the filter.

FIG. 41A is a circuit diagram of a filter 33B according to Example Configuration 2 of this modification. FIG. 41B is a graph illustrating the filter characteristics of the filter 33B according to Example Configuration 2 of this modification.

As illustrated in FIG. 41A, the filter 33B includes, as an additional element, the impedance element Z32 illustrated in FIG. 35A, and includes, as an additional switch, a switch SW33 connected in series with the impedance element Z32. With this configuration, as illustrated in FIG. 41B, similarly to the filter 33A described above, the filter 33B can form three filter characteristics by turning on and off the switches SW31 to SW33, and can thus support three bands.

[3-6-3. Example Configuration 3]

Figure 42A:
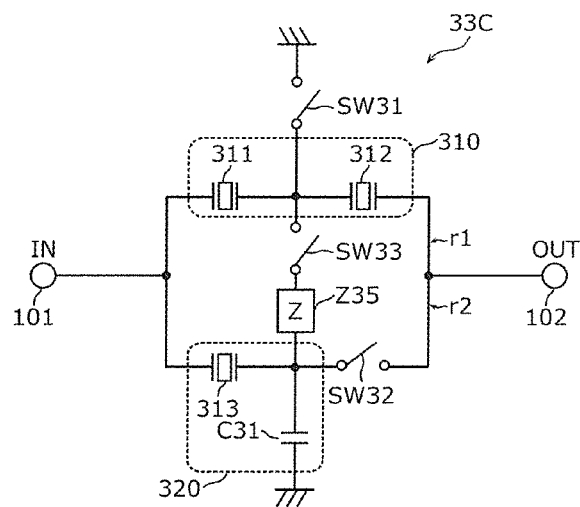
FIG. 42A is a circuit diagram of a filter according to Example Configuration 3 of Modification 2 of Embodiment 3.
Figure 42B:
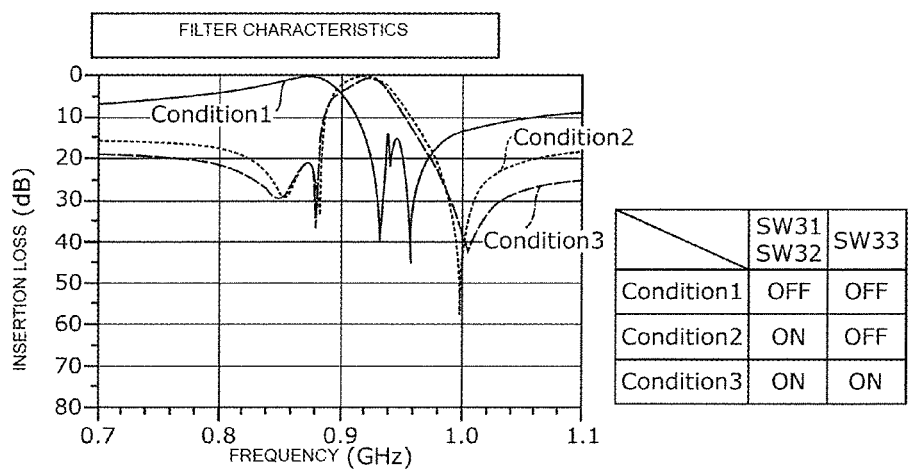
FIG. 42B is a graph illustrating the filter characteristics of the filter.

FIG. 42A is a circuit diagram of a filter 33C according to Example Configuration 3 of this modification. FIG. 42B is a graph illustrating the filter characteristics of the filter 33C according to Example Configuration 3 of this modification.

As illustrated in FIG. 42A, the filter 33C includes, as an additional element, the impedance element Z35, and includes, as an additional switch, a switch SW33 connected in series with the impedance element Z35 between the first path r1 and the second path r2. With this configuration, as illustrated in FIG. 42B, similarly to the filter 33A described above, the filter 33C can form three filter characteristics by turning on and off the switches SW31 to SW33, and can thus support three bands.

[3-6-4. Example Configuration 4]

Figure 43A:
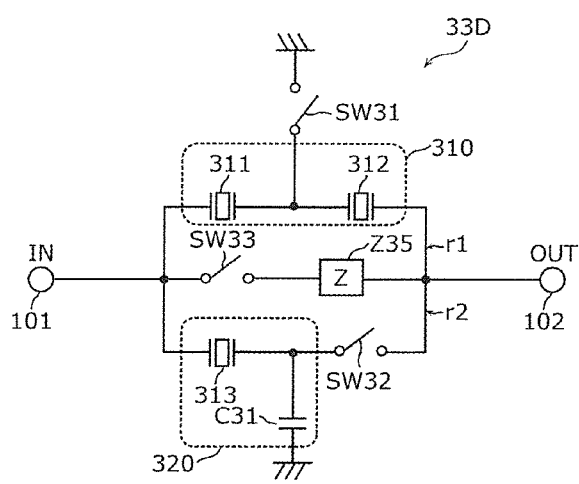
FIG. 43A is a circuit diagram of a filter according to Example Configuration 4 of Modification 2 of Embodiment 3.
Figure 43B:
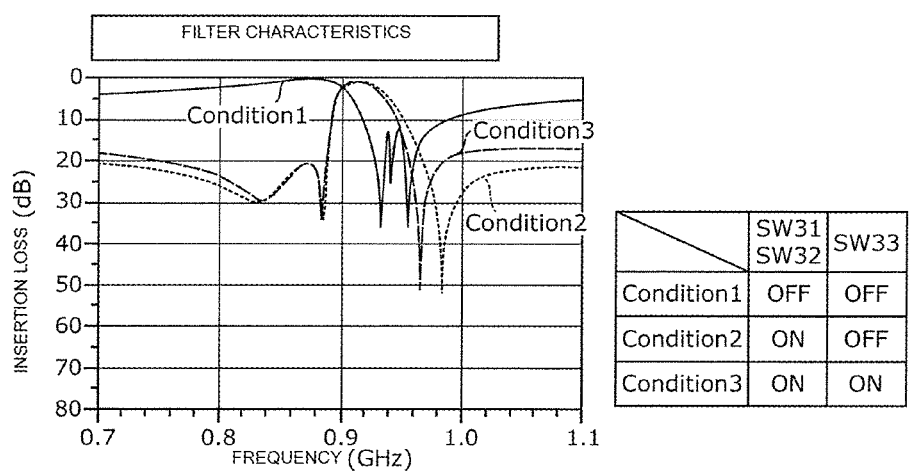
FIG. 43B is a graph illustrating the filter characteristics of the filter.

FIG. 43A is a circuit diagram of a filter 33D according to Example Configuration 4 of this modification. FIG. 43B is a graph illustrating the filter characteristics of the filter 33D according to Example Configuration 4 of this modification.

As illustrated in FIG. 43A, the filter 33D includes, as an additional element, the impedance element Z35, and includes, as an additional switch, a switch SW33 connected in series with the impedance element Z35. With this configuration, as illustrated in FIG. 43B, similarly to the filter 33A described above, the filter 33D can form three filter characteristics by turning on and off the switches SW31 to SW33, and can thus support three bands.

Modification 3 of Embodiment 3

The filters according to Embodiment 3 and the modifications thereof described above can each switch between a state in which a BPF-type filter characteristic is formed and a state in which an LPF-type filter characteristic (or HPF-type filter characteristic) is formed. Further, the filter achieves an advantage, in particular when the pass band of the BPF-type filter characteristic and the attenuation band near the pass band of the LPF-type (or HPF-type) filter characteristic substantially coincide with each other. The filter is therefore suitable for use as a tunable filter supporting, for example, the LTE TDD (Time Division Duplex) Band and the LTE FDD (Frequency Division Duplex) Band. This modification describes such a filter with reference to Example Configurations 1 to 3.

[3-7-1. Example Configuration 1]

Figure 44A:
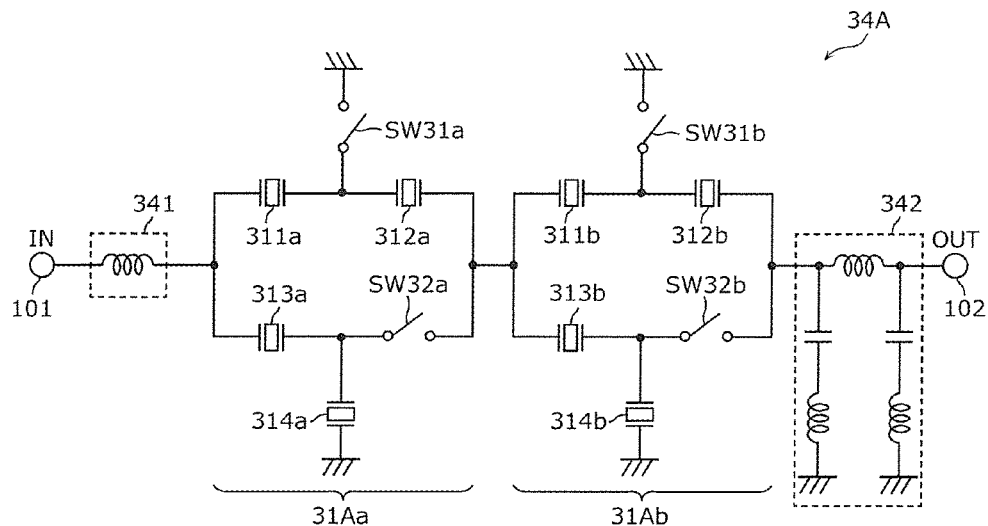
FIG. 44A is a circuit diagram of a filter according to Example Configuration 1 of Modification 3 of Embodiment 3.

FIG. 44A is a circuit diagram of a filter 34A according to Example Configuration 1 of this modification.

The filter 34A illustrated in FIG. 44A includes a filter structure 31Aa in the initial stage including switches SW31$a$ and SW32$a$ and resonators 311$a$ to 314$a$, and a filter structure 31Ab in the subsequent stage including switches SW31$b$ and SW32$b$ and resonators 311$b$ to 314$b$. The filter 34A further includes an LPF-type matching circuit 341 disposed between the IN terminal 101 and the filter structure 31Aa in the initial stage, and an LPF-type matching circuit 342 disposed between the filter structure 31Ab in the subsequent stage and the OUT terminal 102. Each of the filter structure 31Aa in the initial stage and the filter structure 31Ab in the subsequent stage corresponds to the filter according to Embodiment 3 or Modification 1 thereof described above. That is, the filter 34A is configured such that filters, each of which is the filter according to Embodiment 3 or Modification 1 thereof described above, are cascade-connected (connected in cascade) in a plurality of stages.

The filter 34A having the configuration described above can be used as, for example, a tunable filter supporting TDD Band 44 and FDD Band 5.

Figure 44B:
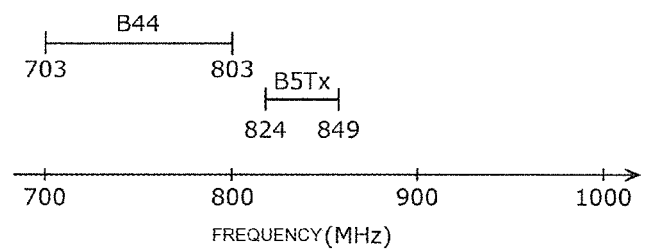
FIG. 44B is a diagram illustrating the frequency ranges assigned to the transmission and reception of Band 44 and the transmission of Band 5.

FIG. 44B is a diagram illustrating the frequency ranges assigned to the transmission and reception of Band 44 and the transmission of Band 5 in Example Configuration 1 of this modification.

Figure 44C:
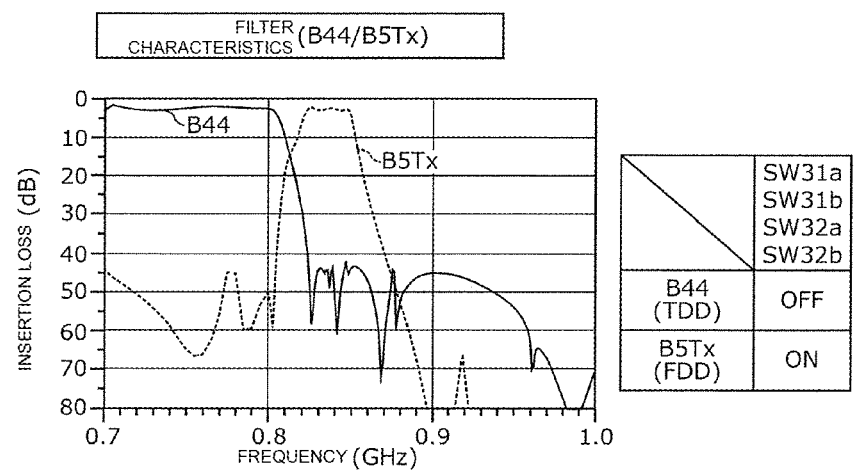
FIG. 44C is a graph illustrating the filter characteristics of the filter.

FIG. 44C is a graph illustrating the filter characteristics of the filter 34A according to Example Configuration 1 of this modification.

As illustrated in FIG. 44C, the filter 34A forms an LPF-type filter characteristic in which the filter 34A allows the Band 44 band to pass therethrough and attenuates the transmission band of Band 5 by turning off the switches SW31$a$, SW32$a$, SW31$b$, and SW32$b$, and can thus support TDD Band 44. Further, the filter 34A forms a BPF-type filter characteristic in which the filter 34A attenuates the Band 44 band and allows the transmission band of Band 5 to pass therethrough by turning on the switches SW31$a$, SW32$a$, SW31$b$, and SW32$b$, and can thus support the transmission band of FDD Band 5.

[3-7-2. Example Configuration 2]

Figure 45A:
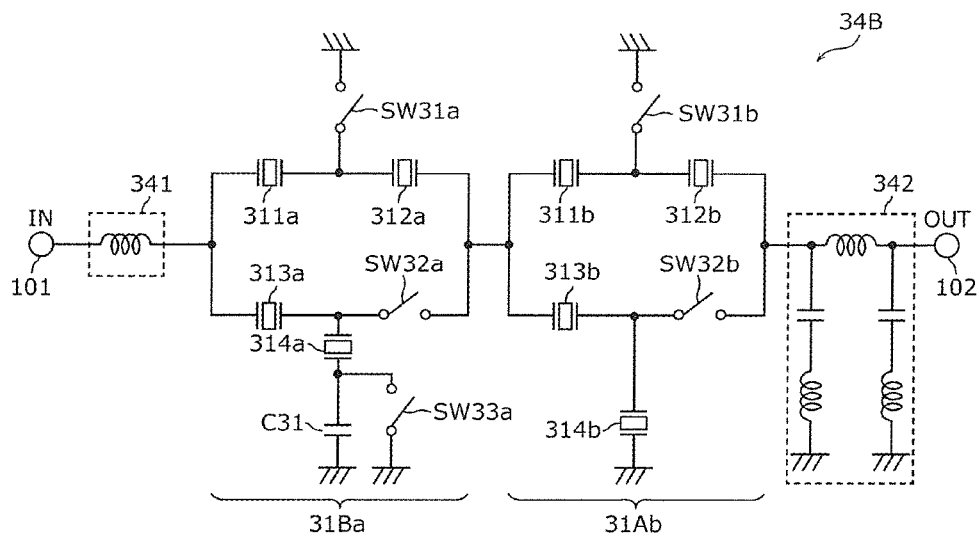
FIG. 45A is a circuit diagram of a filter according to Example Configuration 2 of Modification 3 of Embodiment 3.

FIG. 45A is a circuit diagram of a filter 34B according to Example Configuration 2 of this modification.

The filter 34B illustrated in FIG. 45A includes, instead of the filter structure 31Aa in the initial stage of the filter 34A, a filter structure 31Ba in the initial stage including a capacitor C31 (additional element) and a switch SW33a (additional switch). The filter structure 31Ba in the initial stage corresponds to the filter according to Modification 2 of Embodiment 3 described above.

The filter 34B having the configuration described above can be used as a tunable filter supporting FDD Band 26 in addition to the bands supported by the filter 34A.

Figure 45B:
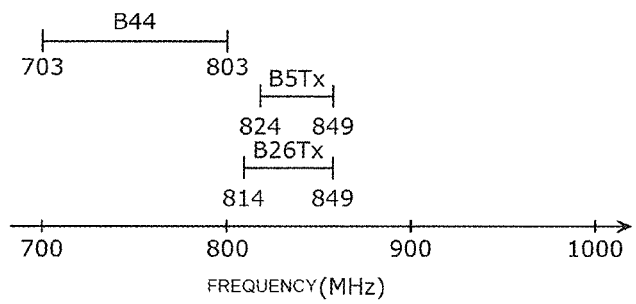
FIG. 45B is a diagram illustrating the frequency ranges assigned to the transmission and reception of Band 44, the transmission of Band 5 and the transmission of Band 26.

FIG. 45B is a diagram illustrating the frequency ranges assigned to the transmission and reception of Band 44, transmission of Band 5, and the transmission of Band 26 according to Example Configuration 2 of this modification.

Figure 45C:
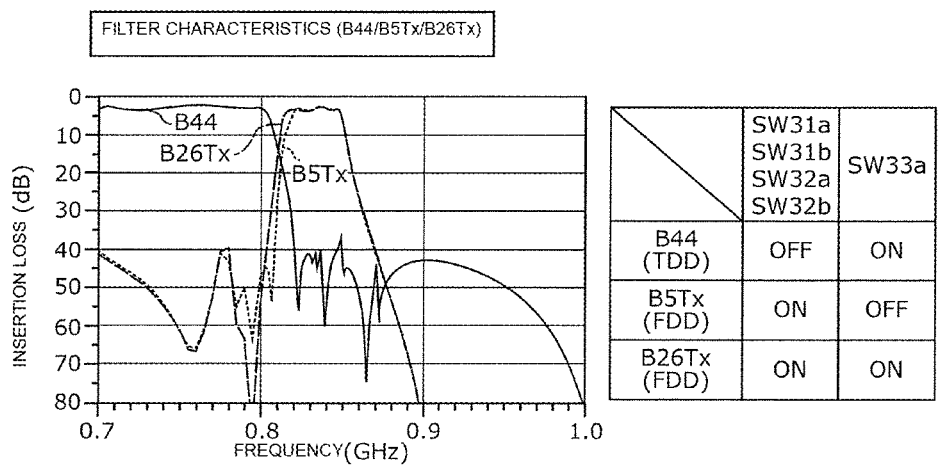
FIG. 45C is a graph illustrating the filter characteristics of the filter.

FIG. 45C is a graph illustrating the filter characteristics of the filter 34B according to Example Configuration 2 of this modification.

As illustrated in FIG. 45C, the filter 34B can support, like the filter 34A, TDD Band 44 by turning off the switches SW31a, SW32a, SW31b, and SW32b and turning off the switch SW33a. Further, the filter 34B can support, like the filter 34A, the transmission band of FDD Band 5 by turning on the switches SW31a, SW32a, SW31b, and SW32b and turning off the switch SW33a. Further, the filter 34B forms a BPF-type filter characteristic in which the filter 34B attenuates the Band 44 band and allows the transmission band of Band 26 to pass therethrough by turning on the switches SW31a, SW32a, SW31b, and SW32b and turning on the switch SW33a, and can thus support the transmission band of FDD Band 26.

Figure 46A:
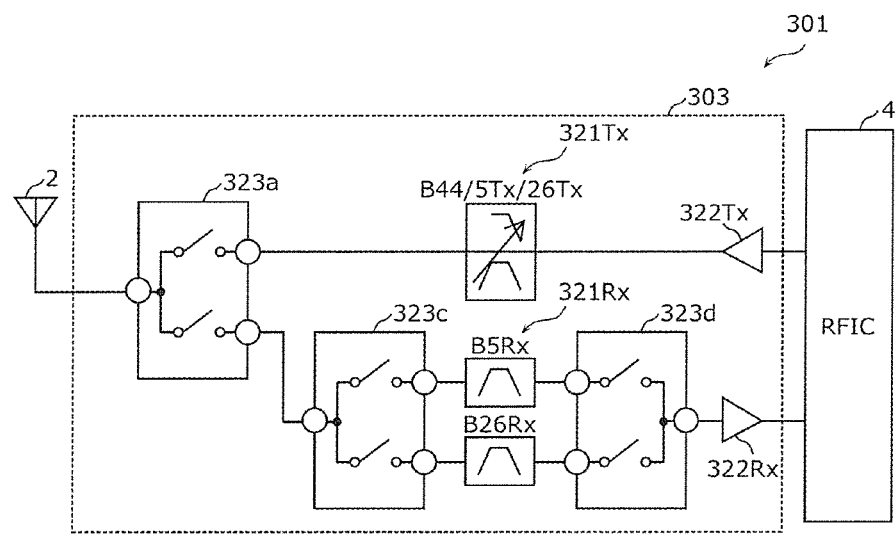
FIG. 46A is a configuration diagram of a radio-frequency front-end circuit according to Example Configuration 2 of Modification 3 of Embodiment 3.
Figure 46B:
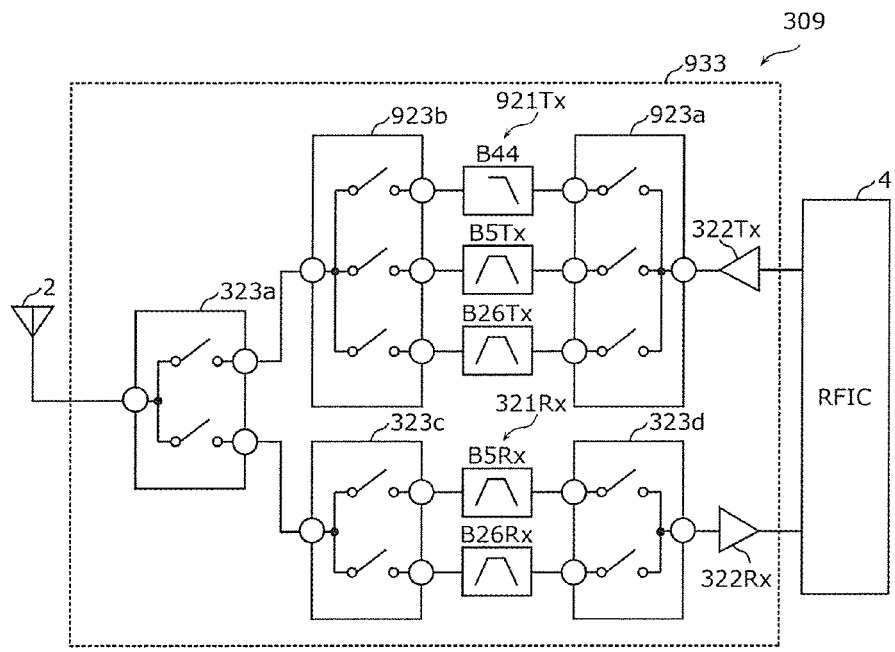
FIG. 46B is a configuration diagram of a radio-frequency front-end circuit according to a comparative example of the radio-frequency front-end circuit.

FIG. 46A is a configuration diagram of a radio-frequency front-end circuit 303 according to this example configuration including the filter 34B. FIG. 46B is a configuration diagram of a radio-frequency front-end circuit 933 according to a comparative example. In these figures, an antenna element 2 and an RFIC 4, which constitute a communication apparatus (in FIG. 46A, a communication apparatus 301, and in FIG. 46B, a communication apparatus 309) are also illustrated together with the radio-frequency front-end circuits.

The radio-frequency front-end circuit 933 illustrated in FIG. 46B includes a transmit filter group 921Tx, which support Band 44, Band 5, and Band 26 and includes a plurality of transmit filters individually supporting the plurality of bands, band-switching switches 923a and 923b disposed before and after the transmit filter group 921Tx, a receive filter group 321Rx, which includes receive filters for the FDD bands, and switches 323a, 323c, and 323d. The switch 323a selectively connects any one of the transmit path and the receive path to the antenna element 2 in accordance with the FDD method or the TDD method. A transmit amplifier circuit 322Tx, a receive amplifier circuit 322Rx, and switches 323c and 323d correspond to the transmit amplifier circuit 122Tx, the receive amplifier circuit 122Rx, and the switches 123c and 123d in FIG. 16A, respectively, and will not be described in detail.

In contrast, the radio-frequency front-end circuit 303 illustrated in FIG. 46A includes a transmit filter 321Tx, which corresponds to the filter 34B, instead of the transmit filter group 921Tx and the switches 923a and 923b, thereby achieving a significant reduction in size.

[3-7-3. Example Configuration 3]

Figure 47A:
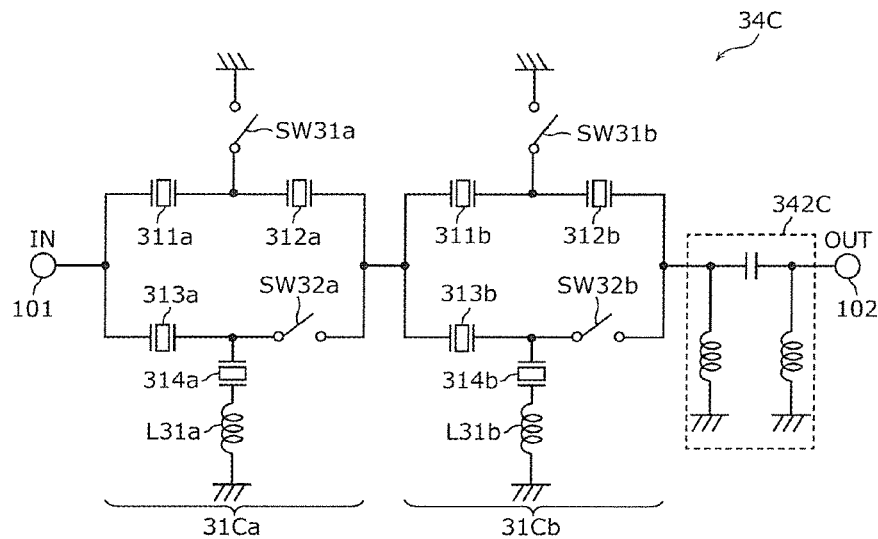
FIG. 47A is a circuit diagram of a filter according to Example Configuration 3 of Modification 3 of Embodiment 3.

FIG. 47A is a circuit diagram of a filter 34C according to Example Configuration 3 of this modification.

The filter 34C illustrated in FIG. 47A includes a filter structure 31Ca in the initial stage including an inductor L31a (additional element), instead of the filter structure 31Aa in the initial stage of the filter 34A, and a filter structure 31Cb in the subsequent stage including an inductor L31b (additional element), instead of the filter structure 34Ab in the subsequent stage of the filter 34A. The filter 34C further includes an HPF-type matching circuit 342C disposed between the filter structure 31Cb in the subsequent stage and the OUT terminal 102.

The filter 34C having the configuration described above can be used as, for example, a tunable filter supporting TDD Band 35 and FDD Band 3.

Figure 47B:
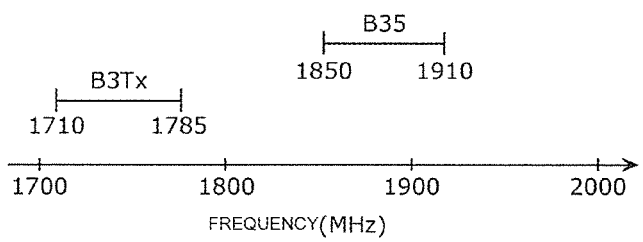
FIG. 47B is a diagram illustrating the frequency ranges assigned to the transmission and reception of Band 35 and the transmission of Band 3.

FIG. 47B is a diagram illustrating the frequency ranges assigned to the transmission and reception of Band 35 and the transmission of Band 3 in Example Configuration 3 of this modification.

Figure 47C:
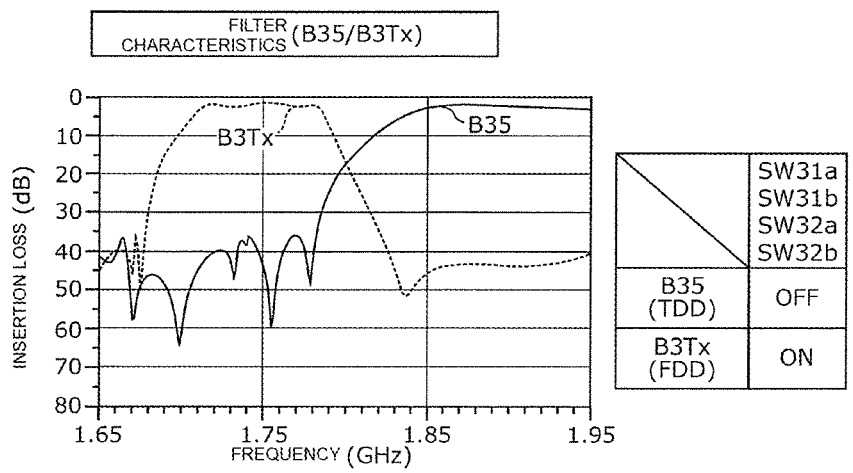
FIG. 47C is a graph illustrating the filter characteristics of the filter.

FIG. 47C is a graph illustrating the filter characteristics of the filter 34C according to Example Configuration 3 of this modification.

As illustrated in FIG. 47C, the filter 34C forms an HPF-type filter characteristic in which the filter 34C allows the Band 35 band to pass therethrough and attenuates the transmission band of Band 3 by turning off the switches SW31a, SW32a, SW31b, and SW32b, and can thus support TDD Band 35. Further, the filter 34C forms a BPF-type filter characteristic in which the filter 34C attenuates the Band 35 band and allows the transmission band of Band 3 to pass therethrough by turning on the switches SW31a, SW32a, SW31b, and SW32b, and can thus support the transmission band of FDD Band 3.

Embodiment 4

Embodiments 1 to 3 and the modifications thereof described above describe a filter including a first resonant circuit and a second resonant circuit, each having an acoustic wave resonator, which can form two filter characteristics in which the pass bands and the attenuation bands are interchanged by interchanging the positions of the series-arm resonant circuit and the parallel-arm resonant circuit. However, a similar technology is also applicable to a case where at least one of the first resonant circuit and the second resonant circuit is an LC resonant circuit including no acoustic wave resonator.

In general, an LC resonant circuit has a lower Q value than a resonant circuit including an acoustic wave resonator. For this reason, at least one of the first resonant circuit and the second resonant circuit is constituted by an LC resonant circuit, thereby widening, for example, the pass band or the attenuation band in at least one of the first state and the second state.

This embodiment describes a filter in which each of the first resonant circuit and the second resonant circuit is constituted by an LC resonant circuit with reference to Example Configurations 1 to 4.

[4-1. Example Configuration 1]

Figure 48A:
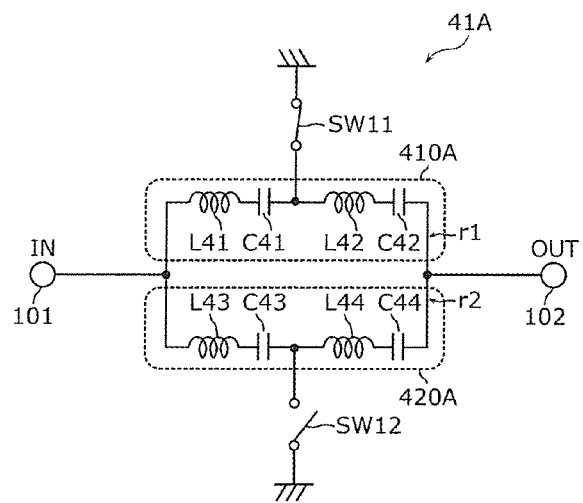
FIG. 48A is a circuit diagram of a filter according to Example Configuration 1 of Embodiment 4.
Figure 48B:
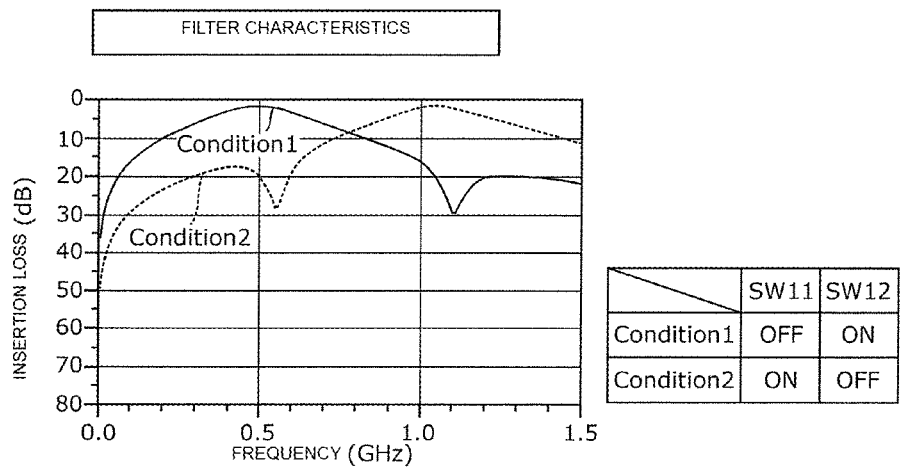
FIG. 48B is a graph illustrating the filter characteristics of the filter.

FIG. 48A is a circuit diagram of a filter 41A according to Example Configuration 1 of this embodiment. FIG. 48B is a graph illustrating the filter characteristics of the filter 41A according to Example Configuration 1 of this embodiment.

As illustrated in FIG. 48A, the filter 41A includes a first resonant circuit 410A and a second resonant circuit 420A, which respectively correspond to the first resonant circuit 110 and the second resonant circuit 120 according to Embodiment 1 described above. The first resonant circuit 410A is an LC resonant circuit including a plurality of first series-arm elements that are inductors or capacitors (an inductor L41, a capacitor C41, an inductor L42, and a capacitor C42). The second resonant circuit 420A is an LC resonant circuit including a plurality of second series-arm elements that are inductors or capacitors (an inductor L43, a capacitor C43, an inductor L44, and a capacitor C44).

Also, in a filter having the configuration described above, in the Condition 1 and the Condition 2 when compared to each other, the series-arm resonant circuit and the parallel-arm resonant circuit are interchanged in position in response to the switching of the switches SW11 and SW12.

Thus, the frequency at which impedance reaches a local minimum and the frequency at which impedance reaches a local maximum, seen from the IN terminal 101, are interchanged. Accordingly, as illustrated in FIG. 48B, two filter characteristics (here, both are BPF-type filter characteristics) can be formed in which the pass bands and the attenuation bands are interchanged.

[4-2. Example Configuration 2]

Figure 49A:
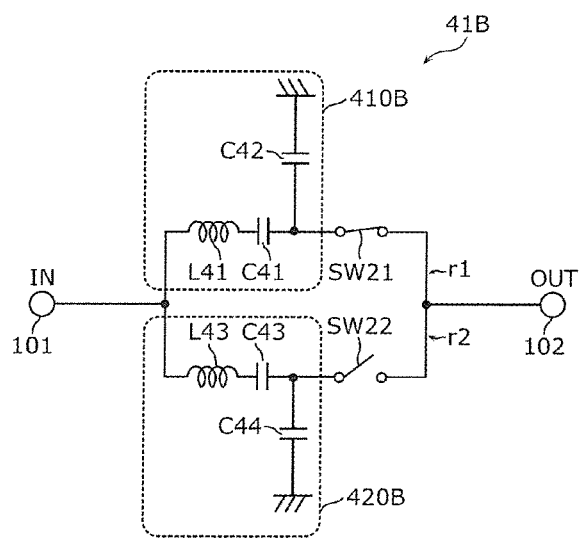
FIG. 49A is a circuit diagram of a filter according to Example Configuration 2 of Embodiment 4.
Figure 49B:
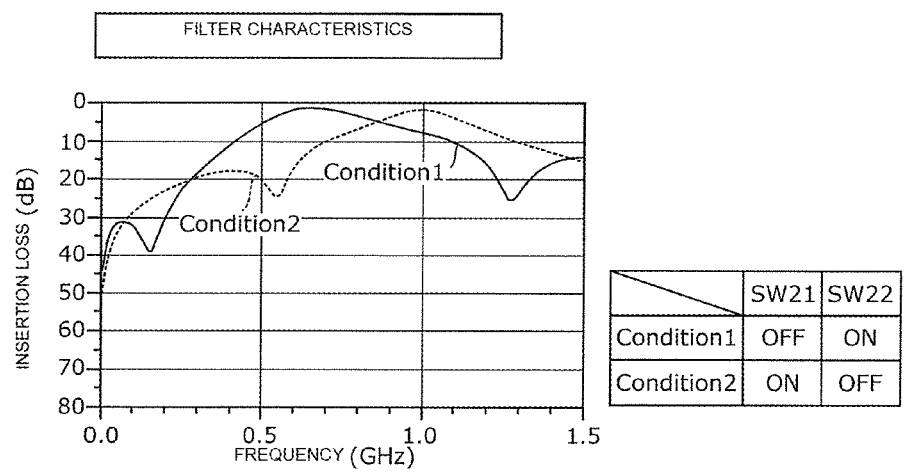
FIG. 49B is a graph illustrating the filter characteristics of the filter.

FIG. 49A is a circuit diagram of a filter 41B according to Example Configuration 2 of this embodiment. FIG. 49B is a graph illustrating the filter characteristics of the filter 41B according to Example Configuration 2 of this embodiment.

As illustrated in FIG. 49A, the filter 41B includes a first resonant circuit 410B and a second resonant circuit 420B, which respectively correspond to the first resonant circuit 210 and the second resonant circuit 220 according to Embodiment 2 described above. The first resonant circuit 410B is an LC resonant circuit including a first series-arm element that is an inductor or a capacitor (an inductor L41 and a capacitor C41) and a first parallel-arm element that is an inductor or a capacitor (a capacitor C42). The second resonant circuit 420B is an LC resonant circuit including a second series-arm element that is an inductor or a capacitor (an inductor L43 and a capacitor C43) and a second parallel-arm element that is an inductor or a capacitor (a capacitor C44).

Also, in a filter having the configuration described above, in the Condition 1 and the Condition 2 when compared to each other, the series-arm resonant circuit and the parallel-arm resonant circuit are interchanged in position in response to the switching of the switches SW21 and SW22.

Thus, the frequency at which impedance reaches a local minimum and the frequency at which impedance reaches a local maximum, seen from the IN terminal 101, are interchanged. Accordingly, as illustrated in FIG. 49B, two filter characteristics (here, both are BPF-type filter characteristics) can be formed in which the pass bands and the attenuation bands are interchanged.

[4-3. Example Configuration 3]

Figure 50A:
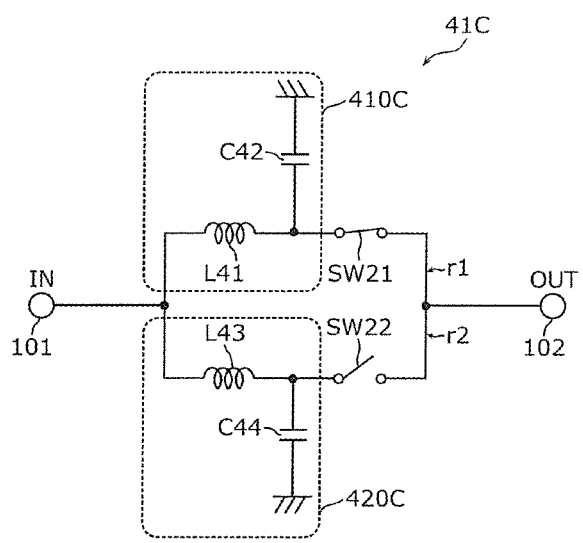
FIG. 50A is a circuit diagram of a filter according to Example Configuration 3 of Embodiment 4.
Figure 50B:
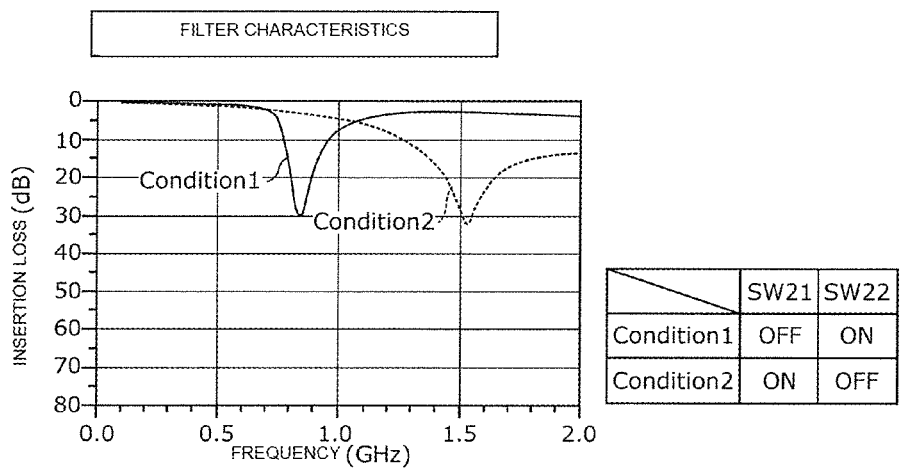
FIG. 50B is a graph illustrating the filter characteristics of the filter.

FIG. 50A is a circuit diagram of a filter 41C according to Example Configuration 3 of this embodiment. FIG. 50B is a graph illustrating the filter characteristics of the filter 41C according to Example Configuration 3 of this embodiment.

As illustrated in FIG. 50A, the filter 41C includes a first resonant circuit 410C and a second resonant circuit 420C, which do not respectively include the capacitors C41 and C43 according to Example Configuration 2 described above.

Also, in a filter having the configuration described above, in the Condition 1 and the Condition 2 when compared to each other, the series-arm resonant circuit and the parallel-arm resonant circuit are interchanged in position in response to the switching of the switches SW21 and SW22.

Thus, the frequency at which impedance reaches a local minimum and the frequency at which impedance reaches a local maximum, seen from the IN terminal 101, are interchanged. Accordingly, as illustrated in FIG. 50B, two filter characteristics (here, a BEF-type filter characteristic and a BEF-type filter characteristic) can be formed in which the pass bands and the attenuation bands are interchanged.

[4-4. Example Configuration 4]

Figure 51A:
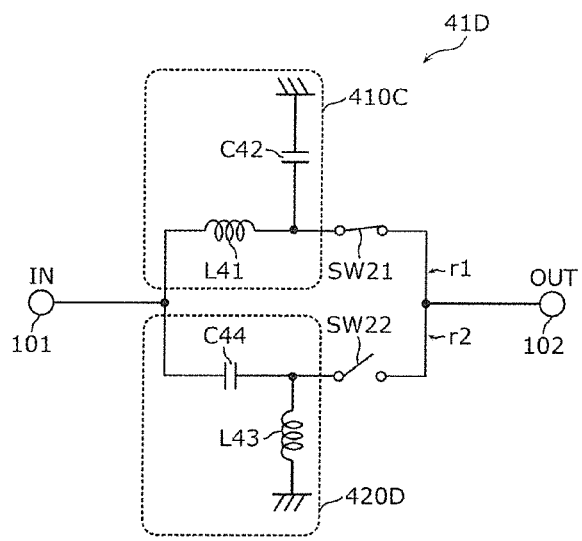
FIG. 51A is a circuit diagram of a filter according to Example Configuration 4 of Embodiment 4.
Figure 51B:
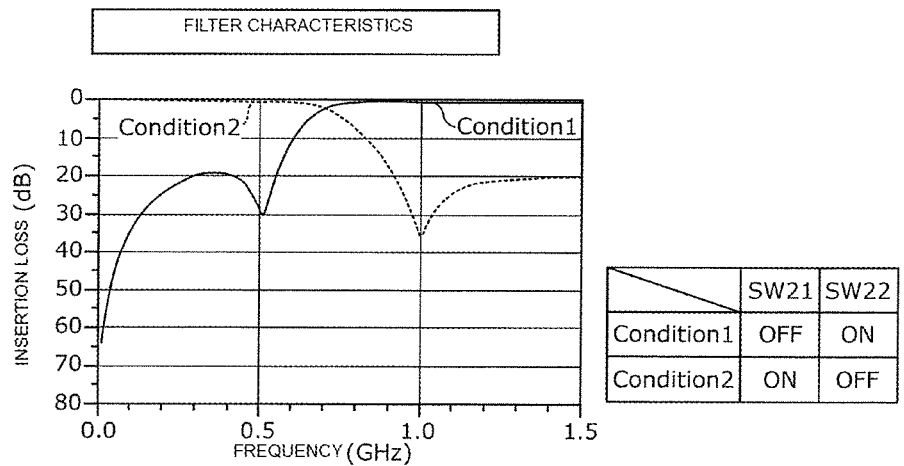
FIG. 51B is a graph illustrating the filter characteristics of the filter.

FIG. 51A is a circuit diagram of a filter 41D according to Example Configuration 4 of this embodiment. FIG. 51B is a graph illustrating the filter characteristics of the filter 41D according to Example Configuration 4 of this embodiment.

As illustrated in FIG. 51A, the filter 41D includes a second resonant circuit 420D in which the inductor L43 and the capacitor C44 in the second resonant circuit 420C according to Example Configuration 3 described above are interchanged in position.

Also, in a filter having the configuration described above, in the Condition 1 and the Condition 2 when compared to each other, the series-arm resonant circuit and the parallel-arm resonant circuit are interchanged in position in response to the switching of the switches SW21 and SW22.

Thus, the frequency at which impedance reaches a local minimum and the frequency at which impedance reaches a local maximum, seen from the IN terminal 101, are interchanged. Accordingly, as illustrated in FIG. 51B, two filter characteristics (here, an HPF-type filter characteristic and an LPF-type filter characteristic) can be formed in which the pass bands and the attenuation bands are interchanged.

Other Embodiments

While a filter device and a radio-frequency front-end circuit according to embodiments of the present disclosure have been described with reference to embodiments and modifications, the present disclosure is not limited to the embodiments described above. Any of the components in the embodiments described above may be combined to implement other embodiments, or various modifications conceived of by a person skilled in the art without departing from the gist of the present disclosure may be made to the embodiments described above. Such embodiments and modifications and various devices containing a filter device according to the present disclosure are also included in the present disclosure.

For example, a communication apparatus including the radio-frequency front-end circuit described above and the RFIC 4 (signal processing circuit) is also included in the present disclosure. The communication apparatus can implement a compact communication apparatus capable of supporting multiple bands.

In addition, each resonator is desirably constituted by one or more acoustic wave resonators, and may be constituted by a plurality of acoustic wave resonators instead of by a single acoustic wave resonator. Accordingly, a single resonator may be constituted by a plurality of sub-resonators into which the single resonator is divided in series or the like.

Furthermore, for example, in a radio-frequency front-end circuit or a communication apparatus, an inductor or a capacitor may be connected between individual components. The inductor may include a wiring inductor implemented using wiring that connects individual components.

The present disclosure provides a compact frequency-variable filter, front-end circuit, and communication apparatus for use in a multi-band system, which can be widely used for communication devices such as mobile phones.

1, 1C, 9, 9C, 301, 309 communication apparatus
antenna element
3, 3C, 202A, 203A to 203C, 303, 903, 903C, 923, 933
  radio-frequency front-end circuit
4 RFIC (RF signal processing circuit)
5 BBIC (baseband signal processing circuit)
11, 11A, 12A to 12E, 13A to 13E, 14A to 14C, 21, 22A to 22E, 23A to 23D, 24, 31, 32A to 32F, 33A to 33D, 34A to 34C, 41A to 41D, 121C, 914A filter
11a, 11b, 11Bb, 11Ca, 11Cb, 21a, 21b, 31Aa, 31Ab, 31Ba, 31Ca, 31Cb, 34Ab filter structure 101 IN terminal (input terminal)
102 OUT terminal (output terminal)
110, 210, 210A, 310, 310E, 410A to 410C first resonant circuit
111, 111a, 111b, 112 to 114, 114a, 114b, 211, 211a, 211b, 212, 212a, 212b, 213, 214, 311, 311a, 311b, 312, 313, 314, 314a, 314b, 911, 912 resonator
120, 220, 220A, 220E, 320, 320A, 320F, 420A to 420D second resonant circuit
121p, 122p, 141pa, 141pb parallel-arm resonator
121Rx receive filter
121s, 122s series-arm resonator
121Tx, 321Tx transmit filter
122Rx, 322Rx receive amplifier circuit
122Tx, 322Tx transmit amplifier circuit
123a to 123d, 223a to 223d, 323a, 323c, 323d, 921, 923a to 923d, 923Ba, 923Bb, SW10, SW11, SW11a, SW11b, SW12, SW12a, SW12b, SW13, SW13a, SW13b, SW20, SW21, SW21a, SW21b, SW22, SW22a, SW22b, SW23, SW31, SW31a, SW31b, SW32, SW32a, SW32b, SW33, SW33a switch 221Rx, 321Rx, 921Rx receive filter group
221Tx, 921 Tx transmit filter group
225 diplexer
341, 342, 342C matching circuit
921C filter group
C1, C1a, C1b, C2, C31, C41 to C44 capacitor
L31a, L31b, L41 to L44 inductor
N11 first node
N12 second node
r1 first path
r2 second path
Z11 to Z15, Z21, Z21a, Z21b, Z22, Z22a, Z22b, Z23 to Z26, Z31 to Z36 impedance element

The invention claimed is:

1. A filter device comprising:
a first resonant circuit disposed in a first path, the first path connecting an input terminal and an output terminal and the first resonant circuit having a first resonant frequency;
a second resonant circuit disposed in a second path, the second path connecting the input terminal and the output terminal and the second resonant circuit having a second resonant frequency different from the first resonant frequency; and
a switch connected to the first resonant circuit and the second resonant circuit, the switch being configured to selectively switch the filter device between a first state and a second state, wherein:
in the first state the switch is configured to allow a radio-frequency signal of the first resonant frequency to flow from the input terminal to the output terminal via the first resonant circuit, and allow a radio-frequency signal of the second resonant frequency to flow from the input terminal to ground via the second resonant circuit, and
in the second state the switch is configured to allow the radio-frequency signal of the first resonant frequency to flow from the input terminal to ground via the first resonant circuit, and allow the radio-frequency signal of the second resonant frequency to flow from the input terminal to the output terminal via the second resonant circuit.

2. The filter device according to claim 1, wherein:
the first resonant circuit comprises a plurality of first series-arm resonant elements connected in series in the first path,
the second resonant circuit comprises a plurality of second series-arm resonant elements connected in series in the second path,
when the filter device is in the first state, the switch is configured to disconnect a first node from ground, and to connect a second node to ground, the first node being located between the plurality of first series-arm resonant elements and the second node being located between the plurality of second-arm resonant elements, and
when the filter device is in the second state, the switch is configured to connect the first node to ground, and to disconnect the second node from ground.

3. The filter device according to claim 2, wherein:
the plurality of first series-arm resonant elements and the plurality of second series-arm resonant elements are each acoustic wave resonators,
the filter device has a first filter characteristic in which, when seen from the input terminal in the first state, a pass band is between frequencies at which impedances of the plurality of first series-arm resonant elements reach a local minimum and frequencies at which impedances of the plurality of second series-arm resonant elements reach a local minimum, and an attenuation band is between frequencies at which impedances of the plurality of first series-arm resonant elements reach a local maximum and frequencies at which impedances of the plurality of second series-arm resonant elements reach a local maximum, and
the filter device has a second filter characteristic in which, when seen from the input terminal in the second state, a pass band is between frequencies at which impedances of the plurality of first series-arm resonant elements reach a local minimum and frequencies at which impedances of the plurality of second series-arm resonant elements reach a local minimum, and an attenuation band is between frequencies at which impedances of the plurality of first series-arm resonant elements reach a local maximum and frequencies at which impedances of the plurality of second series-arm resonant elements reach a local maximum.

4. The filter device according to claim 2, wherein the switch comprises:
a first selection terminal connected to the first resonant circuit,
a second selection terminal connected to the second resonant circuit, and
a common terminal selectively connected to the first selection terminal or the second selection terminal.

5. The filter device according to claim 1, wherein:
the first resonant circuit comprises:
a first series-arm resonant element disposed in series in the first path, and
a first parallel-arm resonant element that connects the first path and ground,
the second resonant circuit comprises:
a second series-arm resonant element disposed in series in the second path, and
a second parallel-arm resonant element that connects the second path and ground,
when the filter device is in the first state, the switch is configured to connect the first resonant circuit to the input terminal or the output terminal, and disconnect the second resonant circuit from the input terminal or the output terminal, and
when the filter device is in the second state, the switch is configured to disconnect the first resonant circuit from the input terminal or the output terminal, and to connect the second resonant circuit to the input terminal or the output terminal.

6. The filter device according to claim 5, wherein:
the first series-arm resonant element and the second series-arm resonant element are each acoustic wave resonators,
the filter device has a first filter characteristic in which, when seen from the input terminal in the first state, a pass band is between a frequency at which an impedance of the first series-arm resonant element reaches a local minimum and a frequency at which an impedance of the second series-arm resonant element reaches a local minimum, and an attenuation band is between a frequency at which an impedance of the first series-arm resonant element reaches a local maximum and a frequency at which an impedance of the second series-arm resonant element reaches a local maximum, and
the filter device has a second filter characteristic in which, when seen from the input terminal in the second state, a pass band is between a frequency at which an impedance of the first series-arm resonant element reaches a local minimum and a frequency at which an impedance of the second series-arm resonant element reaches a local minimum, and an attenuation band is between a frequency at which an impedance of the first series-arm resonant element reaches a local maximum and a frequency at which an impedance of the second series-arm resonant element reaches a local maximum.

7. The filter device according to claim 5, wherein the switch comprises:
a first selection terminal connected to the first resonant circuit,
a second selection terminal connected to the second resonant circuit, and
a common terminal selectively connected to the first selection terminal or the second selection terminal.

8. The filter device according to claim 1, wherein:
the first resonant circuit comprises a plurality of first series-arm resonant elements connected in series in the first path,
the second resonant circuit comprises:
a second series-arm resonant element disposed in series in the second path, and
a second parallel-arm resonant element that connects the second path and ground,
when the filter device is in the first state, the switch is configured to disconnect a node between the plurality of first series-arm resonant elements from ground, and to disconnect the second resonant circuit from the input terminal or the output terminal, and
when the filter device is in the second state, the switch is configured to connect the node to ground, and to connect the second resonant circuit to the input terminal or the output terminal.

9. The filter device according to claim 8, wherein:
the plurality of first series-arm resonant elements and the second series-arm resonant element are each acoustic wave resonators,
the filter device has a first filter characteristic in which, when seen from the input terminal in the first state, a pass band is between frequencies at which impedances of the plurality of first series-arm resonant elements reach a local minimum and a frequency at which an impedance of the second series-arm resonant element reaches a local minimum, and an attenuation band is between frequencies at which impedances of the plurality of first series-arm resonant elements reach a local maximum and a frequency at which an impedance of the second series-arm resonant element reaches a local maximum, and
the filter device has a second filter characteristic in which, when seen from the input terminal in the second state, a pass band is between frequencies at which impedances of the plurality of first series-arm resonant elements reach a local minimum and a frequency at which an impedance of the second series-arm resonant element reaches a local minimum, and an attenuation band is between frequencies at which impedances of the plurality of first series-arm resonant elements reach a local maximum and a frequency at which an impedance of the second series-arm resonant element reaches a local maximum.

10. The filter device according to claim 1, wherein the first resonant circuit or the second resonant circuit is an LC resonant circuit constituted by an inductor and a capacitor.

11. The filter device according to claim 1, further comprising:
a first impedance element connected in series or parallel with at least one impedance element of the first resonant circuit or the second resonant circuit.

12. The filter device according to claim 11, further comprising:
a second switch connected in series or parallel with the first impedance element, wherein
the first impedance element and the second switch are together connected in series or parallel with the at least one impedance element of the first resonant circuit or the second resonant circuit.

13. The filter device according to claim 11, wherein the first impedance element is an acoustic wave resonator.

14. A device comprising a plurality of the filter devices of claim 1, the plurality of filter devices being cascade-connected in a plurality of stages.

15. A radio-frequency front-end circuit comprising:
the filter device according to claim 1; and
an amplifier circuit connected to the filter device.

16. A communication apparatus comprising:
the radio-frequency front-end circuit according to claim 15;
an RF signal processing circuit configured to process a radio-frequency signal output to the radio-frequency front-end circuit or a radio-frequency signal input from the radio-frequency front-end circuit; and
a baseband signal processing circuit configured to process a low-frequency signal output to the RF signal processing circuit or a low-frequency signal input from the RF signal processing circuit.

* * * * *